US012696536B2

(12) United States Patent
Park et al.

(10) Patent No.: US 12,696,536 B2
(45) Date of Patent: Jul. 28, 2026

(54) SEMICONDUCTOR DEVICE, INTEGRATED CIRCUIT, AND MULTI-VALUED LOGIC DEVICE INCLUDING THE SAME

(71) Applicant: SAMSUNG ELECTRONICS CO., LTD., Suwon-si (KR)

(72) Inventors: Sungil Park, Suwon-si (KR); Jaehyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 18/136,464

(22) Filed: Apr. 19, 2023

(65) Prior Publication Data

US 2023/0335557 A1      Oct. 19, 2023

(30) Foreign Application Priority Data

Apr. 19, 2022    (KR) ........................ 10-2022-0047993

(51) Int. Cl.
*H10D 84/85*         (2025.01)
*H10D 30/60*         (2025.01)
*H10D 30/62*         (2025.01)
*H10D 62/13*         (2025.01)
*H10D 62/17*         (2025.01)

(52) U.S. Cl.
CPC ......... *H10D 84/856* (2025.01); *H10D 30/611* (2025.01); *H10D 30/6219* (2025.01); *H10D 62/152* (2025.01); *H10D 62/156* (2025.01); *H10D 62/235* (2025.01)

(58) Field of Classification Search
CPC .. H10D 84/856; H10D 30/611; H10D 62/235; H10D 30/6219; H10D 62/156; H10D 62/152

USPC ........................................................ 257/104
See application file for complete search history.

(56) References Cited

U.S. PATENT DOCUMENTS

| | | | |
|---|---|---|---|
| 8,395,220 B2 | 3/2013 | Chang et al. | |
| 10,418,487 B2 | 9/2019 | Rachmady et al. | |
| 10,930,764 B2 | 2/2021 | Tapily et al. | |
| 11,121,044 B2 | 9/2021 | Cheng et al. | |
| 2011/0012090 A1 | 1/2011 | Singh et al. | |
| 2015/0228648 A1 | 8/2015 | Chi et al. | |
| 2019/0172828 A1 | 6/2019 | Smith et al. | |
| 2022/0216340 A1* | 7/2022 | Lin ...................... H10D 84/013 |
| 2022/0350568 A1* | 11/2022 | Kang ...................... G06F 7/502 |
| 2023/0307285 A1* | 9/2023 | Huang ................. H10D 84/017 |

* cited by examiner

*Primary Examiner* — Norman D Richards
*Assistant Examiner* — Colin Russell Mccutcheon
(74) *Attorney, Agent, or Firm* — Sughrue Mion, PLLC

(57) ABSTRACT

A semiconductor device includes a first common source/drain and a second common source/drain spaced apart from each other in a first direction; a first channel structure between the first common source/drain and the second common source/drain, and a second channel structure between the first common source/drain and the second common source/drain and spaced apart from the first channel structure in a vertical direction; a first gate structure surrounding an upper surface, a lower surface, and side surfaces of the first channel structure; and a second gate structure surrounding an upper surface, a lower surface, and side surfaces of the second channel structure, and spaced apart from the first gate structure, wherein a level of the second channel structure is higher than a level of the first channel structure.

20 Claims, 40 Drawing Sheets

| INPUT | INPUT 1 | INPUT 2 | OUTPUT |
|-------|---------|---------|--------|
| VDDa  | VDDa    | VDDa    | VSSa   |
| VSSa  | VSSa    | VSSa    | VDDa   |
| GND   | VDDa    | VSSa    | GND    |

FIG. 11A

| INPUT   | INPUT 1 | INPUT 2 | OUTPUT  |
|---------|---------|---------|---------|
| VDDa    | VDDa    | VDDa    | VSSa    |
| VSSa    | VSSa    | VSSa    | VDDa    |
| GND     | VDDa    | VSSa    | GND     |
| VDDa/2  | VDDa    | GND     | VSSa/2  |
| VSSa/2  | GND     | VSSa    | VDDa/2  |

FIG. 11B

| INPUT | INPUT 1 | INPUT 2 | OUTPUT |
|-------|---------|---------|--------|
| VDDa | VDDa | VSSa | GND |
| VSSa | VSSa | VSSa | VDDa |
| GND | VDDa | VSSa | GND |

| INPUT | INPUT 1 | INPUT 2 | OUTPUT |
|--------|---------|---------|--------|
| VDDa | VDDa | GND | VSSa/2 |
| VSSa | VSSa | GND | VDDa/2 |
| GND | VDDa | GND | VSSa/2 |
| VDDa/2 | VDDa | GND | VSSa/2 |
| VSSa/2 | GND | GND | GND |

SEMICONDUCTOR DEVICE, INTEGRATED CIRCUIT, AND MULTI-VALUED LOGIC DEVICE INCLUDING THE SAME

CROSS-REFERENCE TO RELATED APPLICATION(S)

This application is based on and claims priority under 35 U.S.C. 119 to Korean Patent Application No. 10-2022-0047993 filed on Apr. 19, 2022 in the Korean Intellectual Property Office, the disclosure of which is incorporated herein by reference in its entirety.

BACKGROUND

1. Field

The disclosure relates to a semiconductor device, an integrated circuit including the same, a multi-value logic device including the same, and a method of fabricating the same.

2. Description of Related Art

A general logic operation is based on a binary system using two-dimensionally arranged transistors. With the increasing degree of integration of a semiconductor device and the decreasing size of a transistor, power consumption and heat generation have become issues.

SUMMARY

Provided is a semiconductor device having an increased degree of integration by including a plurality of transistors sharing sources/drains.

Also provided is an integrated circuit including the semiconductor device.

Also provided is a multi-value logic device including the integrated circuit.

Also provided are methods of fabricating the semiconductor device, the integrated circuit and the multi-value logic device.

Additional aspects will be set forth in part in the description which follows and, in part, will be apparent from the description, or may be learned by practice of the presented embodiments.

In accordance with an aspect of the disclosure, a semiconductor device including a first common source/drain and a second common source/drain spaced apart from each other in a first direction; a first channel structure between the first common source/drain and the second common source/drain, and a second channel structure between the first common source/drain and the second common source/drain and spaced apart from the first channel structure in a vertical direction; a first gate structure surrounding an upper surface, a lower surface, and side surfaces of the first channel structure; and a second gate structure surrounding an upper surface, a lower surface, and side surfaces of the second channel structure, and spaced apart from the first gate structure, wherein a level of the second channel structure is higher than a level of the first channel structure.

In accordance with an aspect of the disclosure, an integrated circuit includes a first circuit configured to split an input signal into a plurality of input signals; and a second circuit configured to receive the plurality of input signals from the first circuit, and convert the plurality of input signals provided from the first circuit into an output signal, wherein at least one of the first circuit and the second circuit includes a first transistor and a second transistor which share sources/drains, wherein the first transistor includes a first channel structure and a first gate structure on a base structure, together with the sources/drains, wherein the second transistor includes a second channel structure and a second gate structure on the base structure, together with the sources/drains, and wherein, when viewed from an upper surface of the base structure, the first channel structure and the second channel structure are on different height levels.

In accordance with an aspect of the disclosure, a multi-value logic device includes a first circuit configured to split an input signal into a plurality of input signals using a plurality of transistors; and a second circuit configured to receive the plurality of input signals from the first circuit, and convert the plurality of input signals received from the first circuit into an output signal, wherein a state of the output signal is one of at least three states, so that an integrated circuit including the first circuit and the second circuit performs a ternary or higher operation, wherein the second circuit includes: a first NMOS transistor; a second NMOS transistor; a first PMOS transistor; and a second PMOS transistor, wherein the first and second NMOS transistors share NMOS sources/drains, and wherein the first and second PMOS transistors share PMOS sources/drains.

In accordance with an aspect of the disclosure, a multi-value logic device includes an input split circuit configured to split an input signal into a plurality of input signals, wherein the input signal has at least three voltage levels; and an output circuit configured to receive the plurality of input signals and generate an output signal, wherein the output signal has the at least three voltage levels, wherein the output circuit includes a first transistor and a second transistor, wherein the first transistor includes a first channel structure, and wherein the second transistor includes a second channel structure which is spaced apart from the first channel structure in a vertical direction.

BRIEF DESCRIPTION OF DRAWINGS

The above and other aspects, features, and advantages of certain embodiments of the present disclosure will be more apparent from the following description, taken in conjunction with the accompanying drawings, in which:

FIG. 11A is a diagram illustrating an example of operating voltages of the circuit diagrams in FIGS. 9 and 10, according to an example embodiment.

FIG. 11B is a diagram illustrating another example of operating voltages of the circuit diagrams in FIGS. 9 and 10, according to an example embodiment.

DETAILED DESCRIPTION

Hereinafter, terms such as "upper," "middle," and "lower" may be replaced with other terms, for example, "first," "second," and "third" to describe elements of the specification. Terms such as "first," "second," and "third" may be used to describe different elements, but the elements are not limited by the terms, and a "first element" may be referred to as a "second element."

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
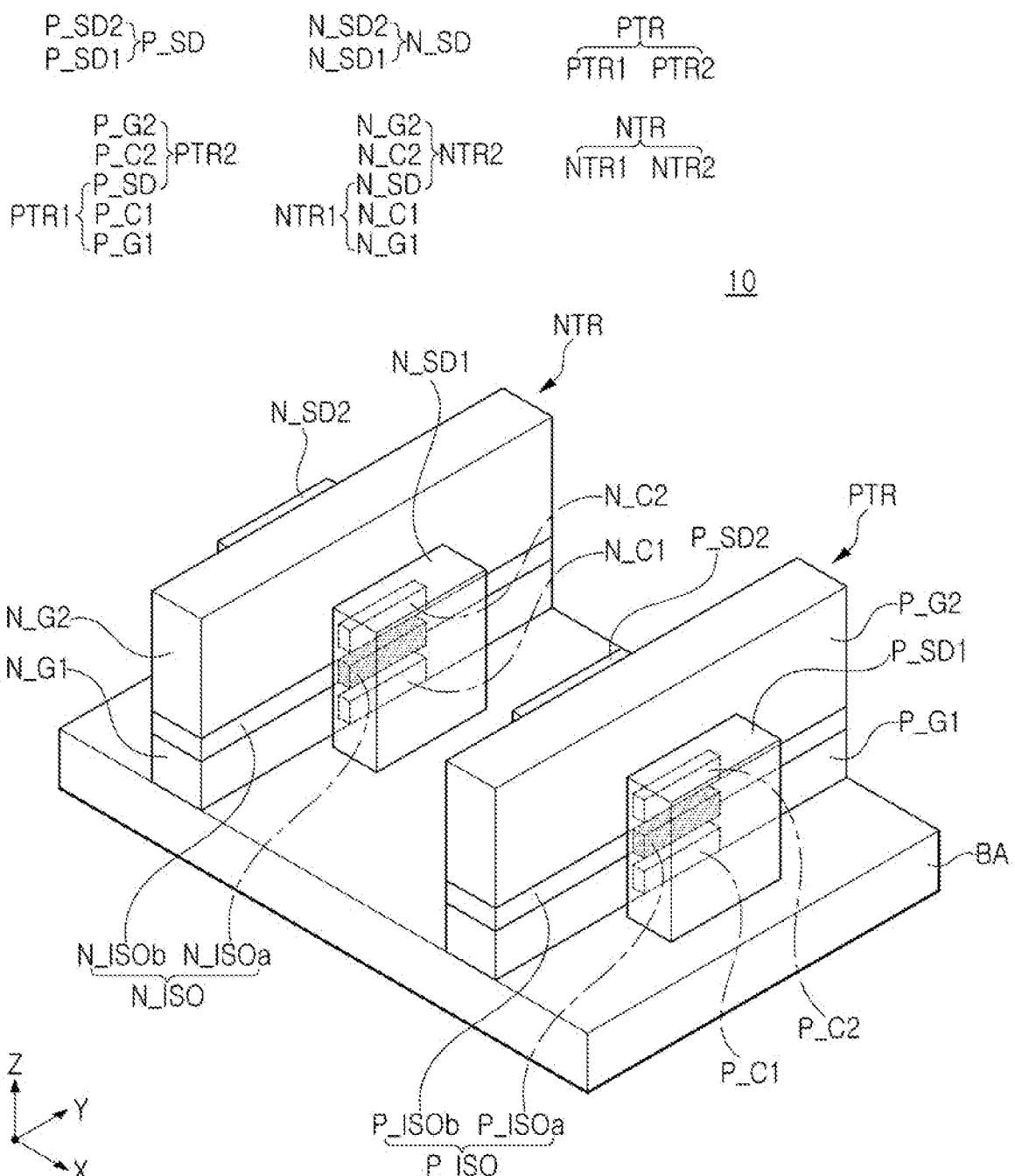
FIGS. 1, 2A, and 2B are schematic perspective views illustrating a semiconductor device according to an example embodiment.

A semiconductor device according to an example embodiment will be described with reference to FIGS. 1, 2A and 2B. FIG. 1 is a schematic perspective view illustrating a semiconductor device according to an example embodiment, and FIGS. 2A and 2B are schematic perspective views illustrating some elements in FIG. 1.

Figure 2A:
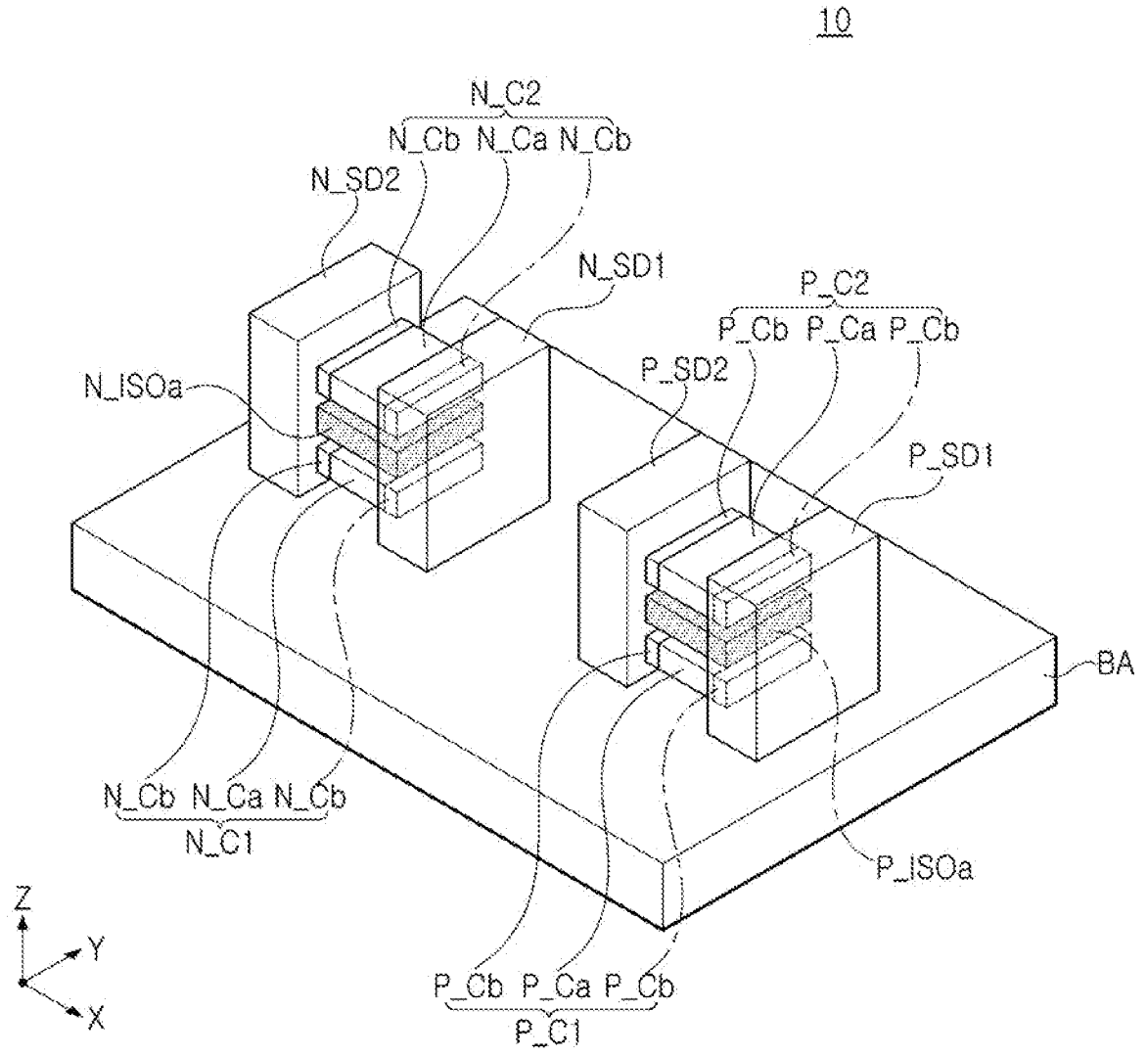
Figure 2B:
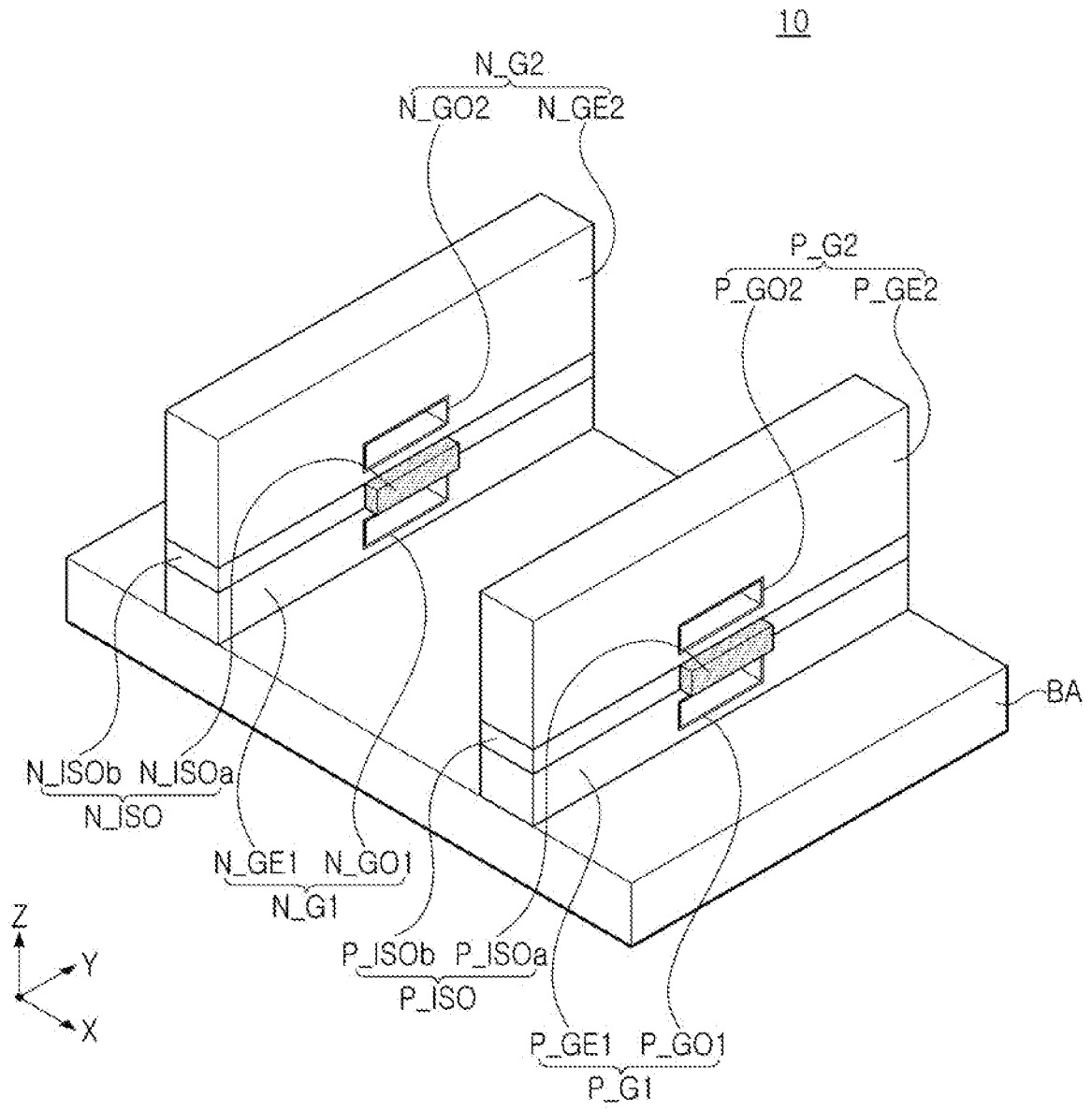

Referring to FIGS. 1, 2A, and 2B, a semiconductor device 10 according to an example embodiment may include NMOS transistors NTR and PMOS transistors PTR disposed on a base structure BA.

In example embodiments, the term "NMOS transistor" may refer to an N-channel transistor or an N-type MOSFET, and the term "PMOS transistor" may refer to a P-channel transistor or a P-type MOSFET.

The NMOS transistors NTR include a first common NMOS source/drain N_SD1 and a second common NMOS source/drain N_SD2 spaced apart from each other in a first horizontal direction X, a first NMOS channel structure N_C1 and a second NMOS channel structure N_C2 disposed between the first common NMOS source/drain N_SD1 and the second common NMOS source/drain N_SD2, and spaced apart from each other in a vertical direction Z, a first NMOS gate structure N_G1 crossing and surrounding the first NMOS channel structure N_C1, and a second NMOS gate structure N_G2 crossing and surrounding the second NMOS channel structure N_C2, and spaced apart from the first NMOS gate structure N_G1. The first and second common NMOS sources/drains N_SD1 and N_SD2 may be a pair of NMOS sources/drains N_SD spaced apart from each other.

The first NMOS gate structure N_G1 may extend in a second horizontal direction Y, and cover an upper surface, a lower surface, and side surfaces of the first NMOS channel structure N_C1. The second NMOS gate structure N_G2 may extend in the second horizontal direction Y, and cover an upper surface, a lower surface, and side surfaces of the second NMOS channel structure N_C2.

The first horizontal direction X and the second horizontal direction Y may be perpendicular to each other, and may be parallel to an upper surface of the base structure BA.

The second NMOS channel structure N_C2 may be disposed on a level higher than that of the first NMOS channel structure N_C1, and the second NMOS gate structure N_G2 may be disposed on a level higher than that of the first NMOS gate structure N_G1.

The first and second NMOS channel structures N_C1 and N_C2 may overlap each other in a vertical direction Z. At least a portion of the second NMOS gate structure N_G2 may overlap at least a portion of the first NMOS gate structure N_G1 in the vertical direction Z.

Each of the first and second NMOS channel structures N_C1 and N_C2 may include edge regions N_Cb connected to the first and second common NMOS sources/drains N_SD1 and N_SD2, and a central region N_Ca between the edge regions N_Cb. In each of the first and second NMOS channel structures N_C1 and N_C2, the central region N_Ca may vertically overlap the first and second NMOS gate structures N_G1 and N_G2, and may be a channel region of an NMOS transistor.

The first NMOS gate structure N_G1 may include a first NMOS gate electrode N_GE1 and a first NMOS gate dielectric layer N_GO1 between the first NMOS gate electrode N_GE1 and the first NMOS channel structure N_C1. The second NMOS gate structure N_G2 may include a second NMOS gate electrode N_GE2, and a second NMOS gate dielectric layer N_GO2 between the second NMOS gate electrode N_GE2, and the second NMOS channel structure N_C2.

The NMOS transistors NTR may include a first NMOS transistor NTR1 including the first NMOS gate electrode N_GE1 and the first NMOS gate dielectric layer N_GO1, and a second NMOS transistor NTR2 including the second NMOS gate electrode N_GE2 and the second NMOS gate dielectric layer N_GO2. The first and second NMOS transistors NTR1 and NTR2 may share the NMOS sources/drains N_SD.

In an example, the first and second NMOS transistors NTR1 and NTR2 may have substantially the same threshold voltage. The first and second NMOS transistors NTR1 and NTR2 having the same threshold voltage may include gate electrodes having the same work function and/or a gate dielectric layer including the same dielectric.

In another example, the first and second NMOS transistors NTR1 and NTR2 may have different threshold voltages. The first and second NMOS transistors NTR1 and NTR2 having different threshold voltages may include gate electrodes having different work functions and/or gate dielectric layers including different dielectrics.

At least one of the first NMOS gate dielectric layer N_GO1 and the second NMOS gate dielectric layer N_GO2 may include silicon oxide and/or a high-k dielectric. The high-k dielectric may include at least one of hafnium oxide (HfO), hafnium-based oxide (Hf-based oxide), aluminum oxide (AlO), aluminum-based oxide (Al-based oxide), lanthanum oxide (LaO), lanthanum-based oxide (La-based oxide), magnesium oxide (MgO), and magnesium-based oxide (Mg-based oxide).

At least one of the first NMOS gate electrode N_GE1 and the second NMOS gate electrode N_GE2 may be formed of doped polysilicon, metal, conductive metal nitride, a metal-semiconductor compound, conductive metal oxide, a graphene, a carbon nanotube, or a combination thereof. For example, at least one of the first NMOS gate electrode N_GE1 and the second NMOS gate electrode N_GE2 may include doped polysilicon, Al, Cu, Ti, Ta, Ru, W, Mo, Pt, Ni, Co, TiN, TaN, WN, NbN, TiAl, TiAlN, TiAlC, TaAlC, TiSi, TiSiN, TaSi, TaSiN, RuTiN, NiSi, CoSi, $IrO_x$, $RuO_x$, a graphene, a carbon nanotube, or a combination thereof, but is not limited thereto. At least one of the first NMOS gate electrode N_GE1 and the second NMOS gate electrode N_GE2 may be formed of a single layer or multiple layers of the above-described materials.

The PMOS transistors PTR may include a first common PMOS source/drain P_SD1 and a second common PMOS source/drain P_SD2 spaced apart from each other in the first horizontal direction X, a first PMOS channel structure P_C1 and a second PMOS channel structure P_C2 disposed between the first common PMOS source/drain P_SD1 and the second common PMOS source/drain P_SD2, and spaced apart from each other in the vertical direction Z, a first PMOS gate structure P_G1 crossing and surrounding the first PMOS channel structure P_C1, and a second PMOS gate structure P_G2 crossing and surrounding the second PMOS channel structure P_C2, and spaced apart from the first PMOS gate structure P_G1. The first and second common PMOS sources/drains P_SD1 and P_SD2 may be a pair of PMOS sources/drains P_SD spaced apart from each other.

The first PMOS gate structure P_G1 may extend in the second horizontal direction Y, and cover an upper surface, a lower surface, and side surfaces of the first PMOS channel structure P_C1. The second PMOS gate structure P_G2 may extend in the second horizontal direction Y, and cover an upper surface, a lower surface, and side surfaces of the second PMOS channel structure P_C2.

The second PMOS channel structure P_C2 may be disposed on a level higher than that of the first PMOS channel structure P_C1, and the second PMOS gate structure P_G2 may be disposed on a level higher than that of the first PMOS gate structure P_G1.

The first and second PMOS channel structures P_C1 and P_C2 may overlap each other vertically. At least a portion of the second PMOS gate structure P_G2 may vertically overlap at least a portion of the first PMOS gate structure P_G1.

Each of the first and second PMOS channel structures P_C1 and P_C2 may include edge regions P_Cb connected to the first and second common PMOS sources/drains P_SD1 and P_SD2, and a central region P_Ca between the edge regions P_Cb. In each of the first and second PMOS channel structures P_C1 and P_C2, the central region P_Ca may vertically overlap the first and second PMOS gate structures P_G1 and P_G2, and may be a channel region of a transistor, for example, a PMOS transistor.

The first PMOS gate structure P_G1 may include a first PMOS gate electrode P_GE1, and a first PMOS gate dielectric layer P_GO1 between the first PMOS gate electrode P_GE1 and the first PMOS channel structure P_C1. The second PMOS gate structure P_G2 may include a second PMOS gate electrode P_GE2, and a second PMOS gate dielectric layer P_GO2 between the second PMOS gate electrode P_GE2 and the second PMOS channel structure P_C2.

The PMOS transistors PTR may include a first PMOS transistor PTR1 including the first PMOS gate electrode P_GE1 and the first PMOS gate dielectric layer P_GO1, and a second PMOS transistor PTR2 including the second PMOS gate electrode P_GE2 and the second PMOS gate dielectric layer P_GO2. The first and second PMOS transistors PTR1 and PTR2 may share the PMOS sources/drains P_SD.

In an example, the first and second PMOS transistors PTR1 and PTR2 may have substantially the same threshold voltage.

In another example, the first and second PMOS transistors may have different threshold voltages. The first and second PMOS transistors PTR1 and PTR2 having different threshold voltages may include gate electrodes having different work functions and/or gate dielectric layers including different dielectrics.

At least one of the first PMOS gate dielectric layer P_GO1 and the second PMOS gate dielectric layer P_GO2 may include silicon oxide and/or a high-k dielectric. The high-k dielectric may include at least one of hafnium oxide (HfO), hafnium-based oxide (Hf-based oxide), aluminum oxide (AlO), aluminum-based oxide (Al-based oxide), lanthanum oxide (LaO), lanthanum-based oxide (La-based oxide), magnesium oxide (MgO), and magnesium-based oxide (Mg-based oxide).

At least one of the first PMOS gate electrode P_GE1 and the second PMOS gate electrode P_GE2 may be formed of doped polysilicon, metal, conductive metal nitride, a metal-semiconductor compound, a conductive metal oxide, a graphene, a carbon nanotube, or a combination thereof. For example, at least one of the first PMOS gate electrode P_GE1 and the second PMOS gate electrode P_GE2 may include doped polysilicon, Al, Cu, Ti, Ta, Ru, W, Mo, Pt, Ni, Co, TiN, TaN, WN, NbN, TiAl, TiAlN, TiAlC, TaAlC, TiSi, TiSiN, TaSi, TaSiN, RuTiN, NiSi, CoSi, $IrO_x$, $RuO_x$, a graphene, a carbon nanotube, or a combination thereof, but is not limited thereto. At least one of the first PMOS gate electrode P_GE1 and the second PMOS gate electrode P_GE2 may be formed of a single layer or multiple layers of the above-described materials.

In example embodiments, terms such as "first," "second," "third," "fourth," and the like may be used to describe different structures, components, or elements, but the structures, components, or elements are not limited to these terms. For example, the first NMOS gate structure N_G1, the second NMOS gate structure N_G2, the first PMOS gate structure P_G1, and the second PMOS gate structure P_G2 may be replaced with terms such as a first gate structure N_G1, a second gate structure N_G2, a third gate structure P_G1, and a fourth gate structure P_G2, respectively. Similarly, the first NMOS channel structure N_C1, the second NMOS channel structure N_C2, the first PMOS channel structure P_C1, and the second PMOS channel structure P_C2 may be replaced with terms such as a first channel structure N_C1, a second channel structure N_C2, a third channel structure P_C1, and a fourth channel structure P_C2, respectively.

The channel structures N_C1, N_C2, P_C1, and P_C2 may include a material usable as a channel of a transistor, for example, a semiconductor material. For example, the channel structures may be formed of a semiconductor material such as silicon or the like. The channel structures may be formed of single crystal silicon. However, the channel structures are not limited to a semiconductor material such as silicon, and may be formed of another semiconductor material usable as a channel region of a transistor. For example, the channel structures may include an oxide semiconductor layer or a two-dimensional (2D) material layer usable as a channel region of a transistor.

The oxide semiconductor layer may be indium gallium zinc oxide (IGZO). However, example embodiments are not limited thereto. For example, the oxide semiconductor layer may include at least one of Indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO)), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO).

The 2D material layer may include at least one of a transition metal dichalcogenide material layer (TMD), a black phosphorous material layer, and a hexagonal boron-nitride material layer (hBN). For example, the 2D material layer may include at least one of BiOSe, Crl, WSe2, MoS2, TaS, WS, SnSe, ReS, β-SnTe, MnO, AsS, P(black), InSe, h-BN, GaSe, GaN, SrTiO, MXene, and Janus 2D materials capable of forming a 2D material.

The semiconductor device 10 may further include a first isolation structure N_ISO having an insulating property, and a second isolation structure P_ISO having an insulating property.

The first isolation structure N_ISO may be disposed between the first NMOS gate structure N_G1 and the second NMOS gate structure N_G2. The first isolation structure N_ISO may include a first portion N_ISOa vertically overlapping the first and second NMOS channel structures N_C1 and N_C2, and a second portion N_ISOb not vertically overlapping the first and second NMOS channel structures N_C1 and N_C2. The second isolation structure P_ISO may be disposed between the first PMOS gate structure P_GT and the second PMOS gate structure P_G2. The second isolation structure P_ISO may include a first portion P_ISOa vertically overlapping the first and second PMOS channel structures P_C1 and P_C2, and a second portion P_ISOb not vertically overlapping the first and second PMOS channel structures P_C1 and P_C2.

The first and second isolation structures N_ISO and P_ISO may be formed of an insulating material, for example, at least one of SiN, SiCN, and SiON, or an insulating material capable of replacing SiN, SiCN, and SiON.

In each of the first and second isolation structures N_ISO and P_ISO, the overlapping portions N_ISOa and P_ISOa may have a first width in the first horizontal direction X, and the non-overlapping portions N_ISOb and P_ISOb may have a second width different from the first width in the first horizontal direction X. In embodiments, the first width may be greater than the second width.

Hereinafter, examples of the semiconductor device 10 including various modifications of the above-described elements will be described. Various modifications of the above-described elements of the semiconductor device 10 to be described below will be mainly described with respect to a deformed element, a replaced element, or an added element. In addition, modifiable, replaceable, or addable elements to be described below are described with reference to each drawing, but the modifiable, replaceable, or addable elements may be combined with each other, or may be combined with the above-described elements to form the semiconductor device 10 according to example embodiments.

Figure 3:
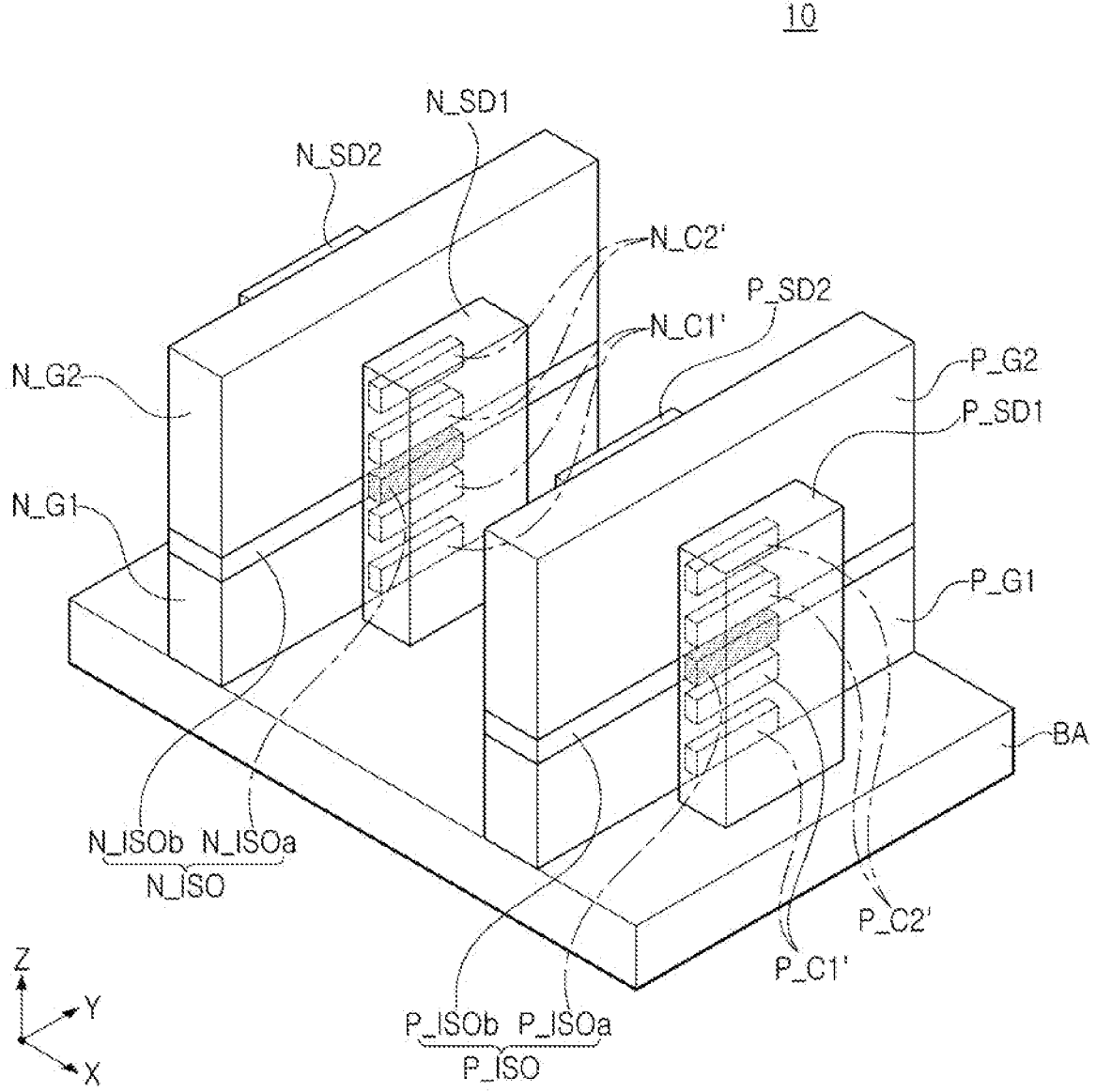
FIGS. 3 and 4 are schematic perspective views illustrating a modification of a semiconductor device according to an example embodiment.
Figure 4:
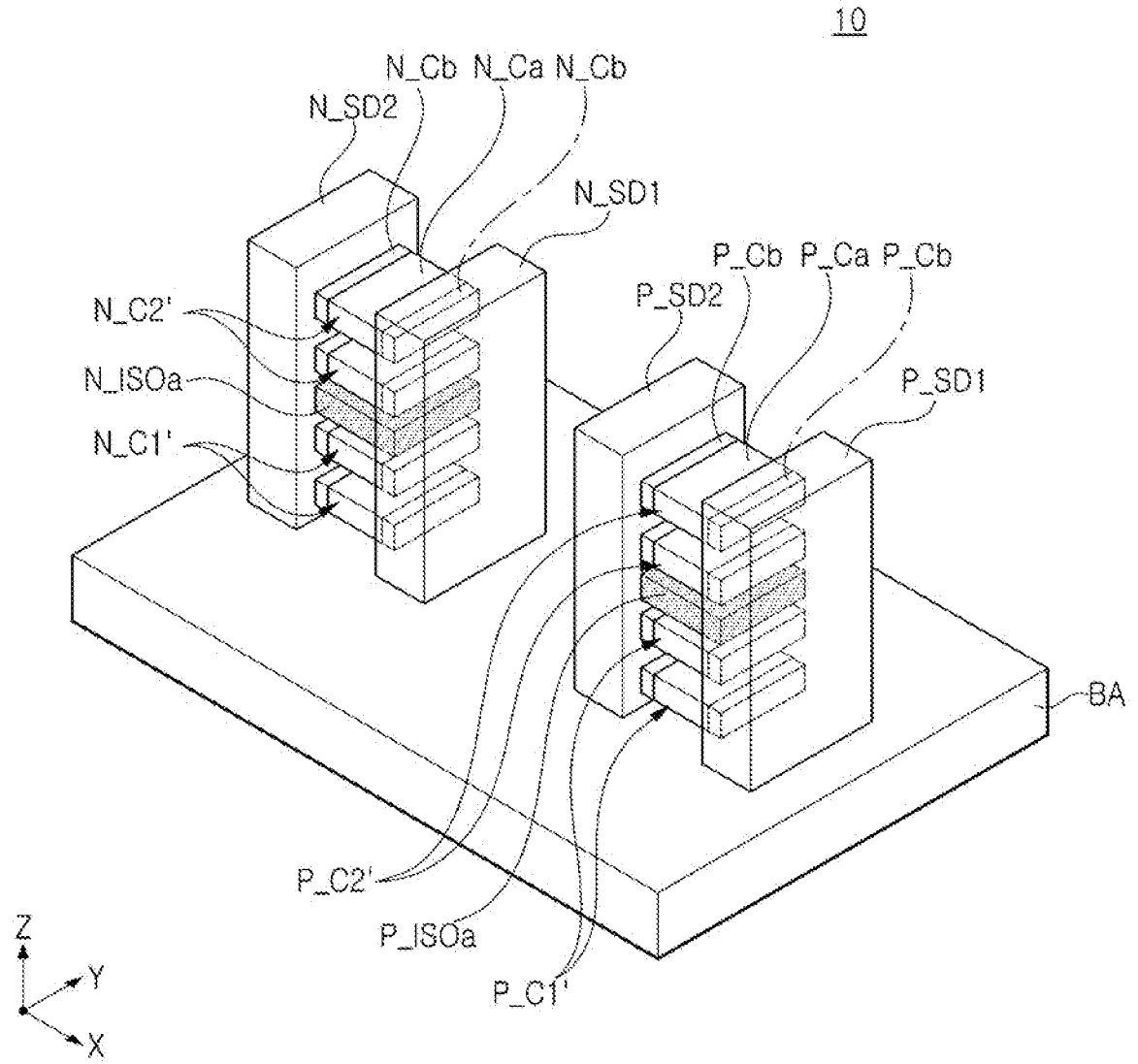

First, modifications of the first and second NMOS channel structures N_C1 and NC_2, and the first and second PMOS channel structures P_C1, and P_C2 of FIGS. 1, 2A, and 2B, will be described with reference to FIGS. 3 and 4. FIGS. 3 and 4 are schematic perspective views illustrating a modification of a semiconductor device according to an example embodiment.

In an embodiment, referring to FIGS. 3 and 4, the above-described first NMOS channel structure N_C1 of FIGS. 1, 2A and 2B may be replaced with a plurality of first NMOS channel structures spaced apart from each other in the vertical direction Z. The first NMOS gate structure N_G1 may surround each of the plurality of first NMOS channel structures N_C1', and extend in the second horizontal direction Y The first NMOS gate structure N_G1 may cover an upper surface, a lower surface, and side surfaces of each of the plurality of first NMOS channel structures N_C1'.

The above-described second NMOS channel structure N_C2 of FIGS. 1, 2A, and 2B may be replaced with a plurality of second NMOS channel structures N_C2' spaced apart from each other in the vertical direction Z. The second NMOS gate structure N_G2 may surround each of the plurality of second NMOS channel structures N_C2', and extend in the second horizontal direction Y. The second NMOS gate structure N_G2 may cover an upper surface, a lower surface, and side surfaces of each of the plurality of second NMOS channel structures N_C2'.

The above-described first PMOS channel structure P_C1 of FIGS. 1, 2A, and 2B may be replaced with a plurality of first PMOS channel structures P_C1' spaced apart from each other in the vertical direction Z. The first PMOS gate structure P_G1 may surround each of the plurality of first PMOS channel structures PC1', and extend in the second horizontal direction Y. The first PMOS gate structure P_G1 may cover an upper surface, a lower surface, and side surfaces of each of the plurality of first PMOS channel structures P_C1'.

The above-described second PMOS channel structure P_C2 of FIGS. 1, 2A, and 2B may be replaced with a plurality of second PMOS channel structures P_C2' spaced apart from each other in the vertical direction Z. The second PMOS gate structure P_G2 may surround each of the plurality of second PMOS channel structures P_C2', and extend in the second horizontal direction Y. The second PMOS gate structure P_G2 may cover an upper surface, a lower surface, and side surfaces of each of the plurality of second PMOS channel structures P_C2'.

Next, modifications of a semiconductor device further including contact plugs and interconnection lines will be described with reference to FIGS. 5A, 5B, 5C, 6, 7, and 8, respectively. The contact plugs and interconnection lines may relate to an electrical connection relationship between the above-described gate structures N_G1, N_G2, P_G1, and P_G2 of FIGS. 1, 2A, and 2B, and the sources/drains N_SD1, N_SD2, P_SD1, and P_SD2 of FIGS. 1, 2A, and 2B. FIGS. 5A, 5B, 5C, 6, 7, and 8 are schematic perspective views illustrating various modifications of a semiconductor device further including contact plugs and interconnection lines.

Figure 5A:
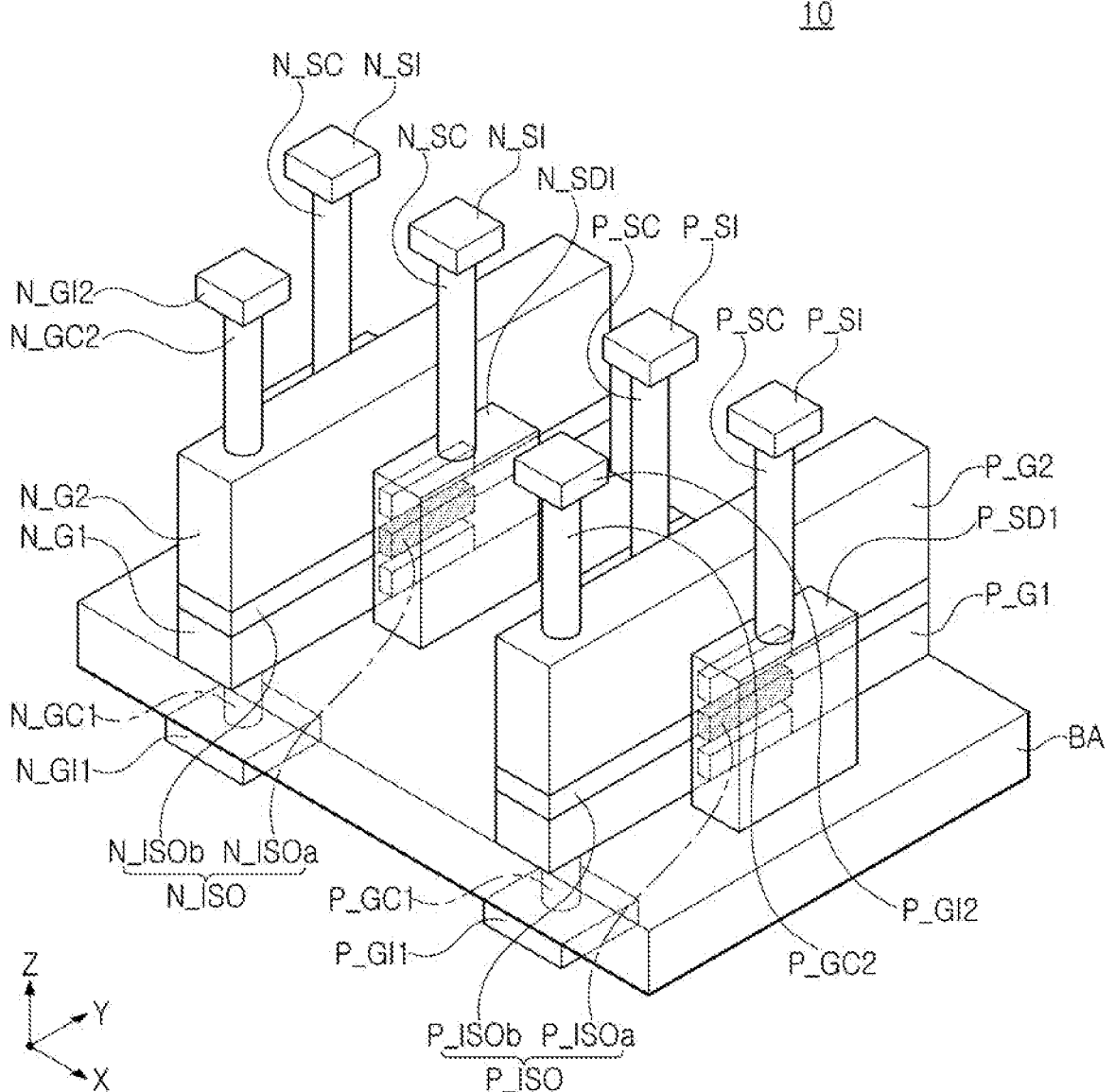
FIG. 5A is a schematic perspective view illustrating an example of a semiconductor device according to an example embodiment.

In an embodiment, referring to FIG. 5A, the semiconductor device 10 may further include a first NMOS gate contact plug N_GC1 electrically connected to the first NMOS gate structure N_G1 below the first NMOS gate structure N_G1, and passing through the base structure BA, a first NMOS gate interconnection line N_GI1 electrically connected to the first NMOS gate contact plug N_GC1 below the first NMOS gate contact plug N_GC1, a second NMOS gate contact plug N_GC2 electrically connected to the second NMOS gate structure N_G2 on the second NMOS gate structure N_G2, and a second NMOS gate interconnection line N_GI2 electrically connected to the second NMOS gate contact plug N_GC2 on the second NMOS gate contact plug N_GC2. The first NMOS gate contact plug N_GC1 may be in contact with the first NMOS gate electrode N_GE1 of FIG. 2B. The second NMOS gate contact plug N_GC2 may be in contact with the second NMOS gate electrode N_GE2 of FIG. 2B.

The semiconductor device 10 may further include a first PMOS gate contact plug P_GC1 electrically connected to the first PMOS gate structure P_G1 below the first PMOS gate structure P_G1, and passing through the base structure BA, a first PMOS gate interconnection line P_GI1 electrically connected to the first PMOS gate contact plug P_GC1 below the first PMOS gate contact plug P_GC1, a second PMOS gate contact plug P_GC2 electrically connected to the second PMOS gate structure P_G2 on the second PMOS gate structure P_G2, and a second PMOS gate interconnection line P_GI2 electrically connected to the second PMOS gate contact plug P_GC2 on the second PMOS gate contact plug P_GC2. The first PMOS gate contact plug P_GC1 may be in contact with the first PMOS gate electrode P_GE1 of FIG. 2B. The second PMOS gate contact plug P_GC2 may be in contact with the second PMOS gate electrode P_GE2 of FIG. 2B.

The semiconductor device 10 may further include NMOS source/drain contact plugs N_SC electrically connected to the first and second common NMOS sources/drains N_SD1 and N_SD2 on the first and second common NMOS sources/drains N_SD1 and N_SD2, respectively, and NMOS source/drain interconnection lines N_SI electrically connected to the NMOS source/drain contact plugs N_SC on the NMOS source/drain contact plugs N_SC, respectively.

The semiconductor device 10 may further include PMOS source/drain contact plugs P_SC electrically connected to the first and second common PMOS sources/drains P_SD1 and P_SD2 on the first and second common PMOS sources/drains P_SD1 and P_SD2, respectively, and PMOS source/drain interconnection lines P_SI electrically connected to the PMOS source/drain contact plugs P_SC on the PMOS source/drain contact plugs P_SC, respectively.

Figure 5B:
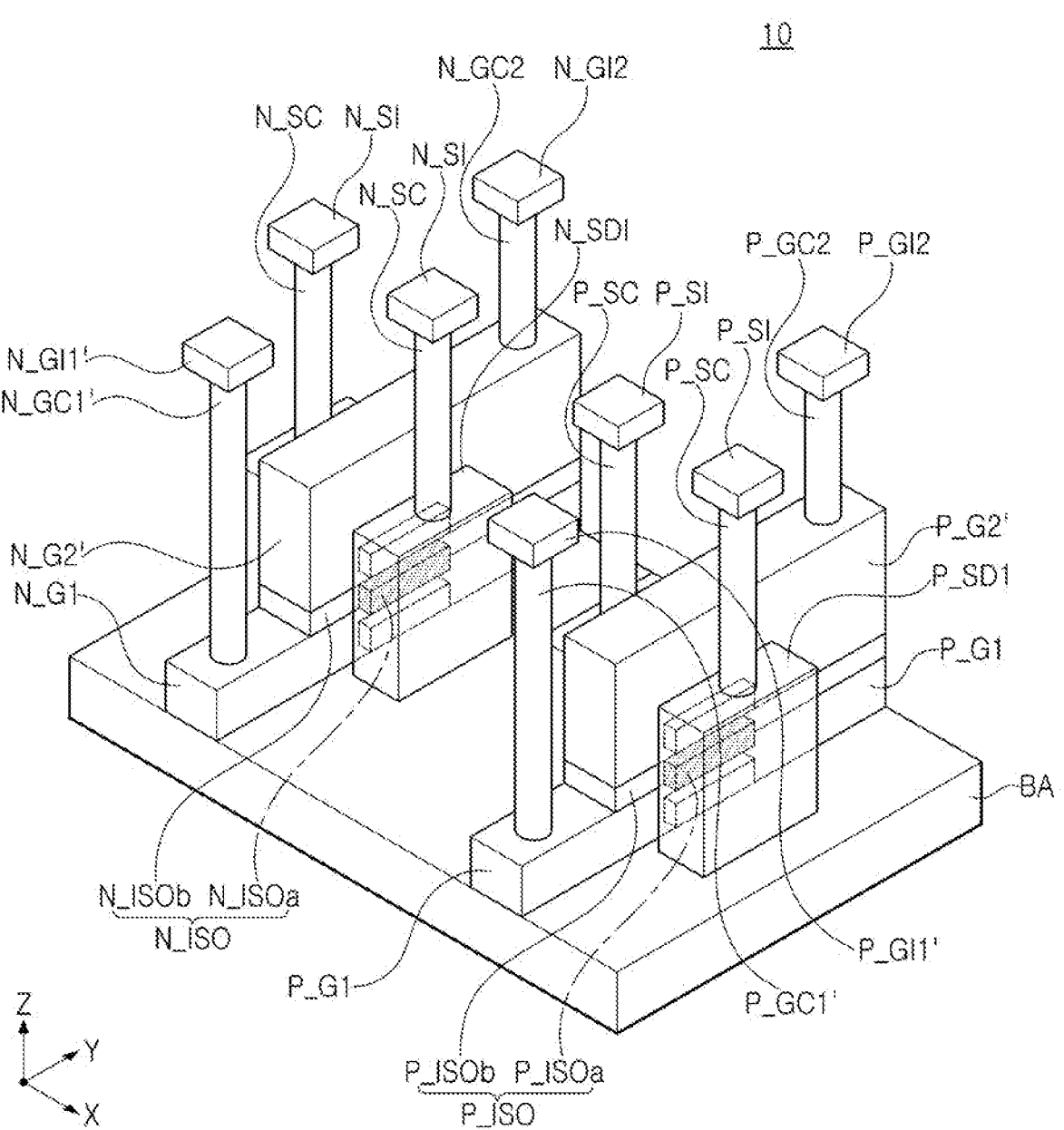
FIG. 5B is a schematic perspective view illustrating another example of a semiconductor device according to an example embodiment.

In an embodiment, referring to FIG. 5B, the second NMOS gate structure N_G2 of FIGS. 1 and 2B described above may be replaced with a second NMOS gate structure N_G2' exposing a portion of the first NMOS gate structure N_G1. Accordingly, the portion of the first NMOS gate structure N_G1 may not vertically overlap the second NMOS gate structure N_G2'. The first NMOS gate contact plug N_GC1 of FIG. 5A described with reference to FIG. 5A may be replaced with a first NMOS gate contact plug N_GC1' disposed on a non-overlapping portion of the first NMOS gate structure N_G1 not vertically overlapping the second NMOS gate structure N_G2', and the first NMOS gate interconnection line N_GI1 of FIG. 5A described with reference to FIG. 5A may be replaced with a first NMOS gate interconnection line N_GI1' electrically connected to the first NMOS gate contact plug N_GC1' on the first NMOS gate contact plug N_GC1'.

The second PMOS gate structure P_G2 of FIGS. 1 and 2B described above may be replaced with a second PMOS gate structure P_G2' exposing a portion of the first PMOS gate structure P_G1. Accordingly, a portion of the first PMOS gate structure P_G1 may not vertically overlap the second PMOS gate structure P_G2'. The first PMOS gate contact plug P_GC1 of FIG. 5A described with reference to FIG. 5A may be replaced with a first PMOS gate contact plug P_GC1' disposed on a non-overlapping portion of the first PMOS gate structure P_G1 not vertically overlapping the second PMOS gate structure P_G2', and the first PMOS gate interconnection line P_GI1 of FIG. 5A described with reference to FIG. 5A may be replaced with a first PMOS gate interconnection line P_GI1' electrically connected to the first PMOS gate contact plug P_GC1' on the first PMOS gate contact plug P_GC1'.

A position in which the second NMOS gate contact plug N_GC2 is disposed on the second NMOS gate structure N_G2 may be modified in various manners. A position in which the second PMOS gate contact plug P_GC2 is disposed on the second PMOS gate structure P_G2 may be modified in various manners.

In an embodiment, referring to FIG. 5C, the first NMOS gate structure N_G1 of FIGS. 1 and 2B described above may be disposed below the second NMOS gate structure N_G2, and may be replaced with the first NMOS gate structure N_G1' that does not overlap a portion of the second NMOS gate structure N_G2. Accordingly, the portion of the second NMOS gate structure N_G2 may not vertically overlap the first NMOS gate structure N_G1'.

The second NMOS gate contact plug N_GC2 of FIG. 5A described with reference to FIG. 5A may be replaced with a second NMOS gate contact plug N_GC2' disposed below a portion of the second NMOS gate structure N_G2 not vertically overlapping the first NMOS gate structure N_G1', and the second NMOS gate interconnection line N_GI2 of FIG. 5A described with reference to FIG. 5A may be replaced with a second NMOS gate interconnection line N_GI2' electrically connected to the second NMOS gate contact plug N_GC2' below the second NMOS gate contact plug N_GC2'. The second NMOS gate contact plug N_GC2' may pass through the base structure BA.

The first PMOS gate structure P_G1 of FIGS. 1 and 2B described above may be disposed below the second PMOS gate structure P_G2, and may be replaced with a first PMOS gate structure P_G1' that does not overlap a portion of the second PMOS gate structure P_G2. Accordingly, a portion of the second PMOS gate structure P_G2 may not vertically overlap the first PMOS gate structure P_G1'.

The second PMOS gate contact plug P_GC2 of FIG. 5A described with reference to FIG. 5A may be replaced with a second PMOS gate contact plug P_GC2' disposed below a portion of the second PMOS gate structure P_G2 not vertically overlapping the first PMOS gate structure P_G1', and the second PMOS gate interconnection line P_GI2 of FIG. 5A described with reference to FIG. 5A may be replaced with a second PMOS gate interconnection line P_GI2' electrically connected to the second PMOS gate contact plug P_GC2' below the second PMOS gate contact plug P_GC2'. The second PMOS gate contact plug P_GC2' may pass through the base structure BA.

As described above with reference to FIG. 5A, the first NMOS and PMOS gate contact plugs N_GC1 and P_GC1 may be disposed below the first NMOS and PMOS gate structures N_G1' and P_G1', and may be electrically connected to the NMOS and PMOS gate structures N_G' and P_G1', respectively. The first NMOS and PMOS gate contact plugs N_GC1 and P_GC1 may pass through the base structure BA. As described with reference to FIG. 5A, the first NMOS and PMOS gate interconnection lines N_GI1 and P_GI1 may be connected to the first NMOS and PMOS gate contact plugs N_GC1 and P_GC1 below the first NMOS and PMOS gate contact plugs N_GC1 and P_GC1, respectively.

As described with reference to FIGS. 5A, 5B, and 5C, the first NMOS gate structures N_G1 and N_G1' may be electrically isolated from the second NMOS gate structures N_G2 and N_G2' while being spaced apart from each other in the vertical direction Z, and the first PMOS gate structures P_G1 and P_G1' may be electrically isolated from the second PMOS gate structures P_G2 and P_G2' while being spaced apart from each other in the vertical direction Z, but example embodiments are not limited thereto. Hereinafter, with reference to FIGS. 6 and 7, respectively, modifications in which the first NMOS gate structures N_G1 and N_G1' are electrically connected to the second NMOS gate structures N_G2 and N_G2' while being spaced apart from each other in the vertical direction Z, and the first PMOS gate structures P_G1 and P_G1' are electrically connected to the second PMOS gate structures P_G2 and P_G2' while being spaced apart from each other in the vertical direction Z will be described.

Figure 6:
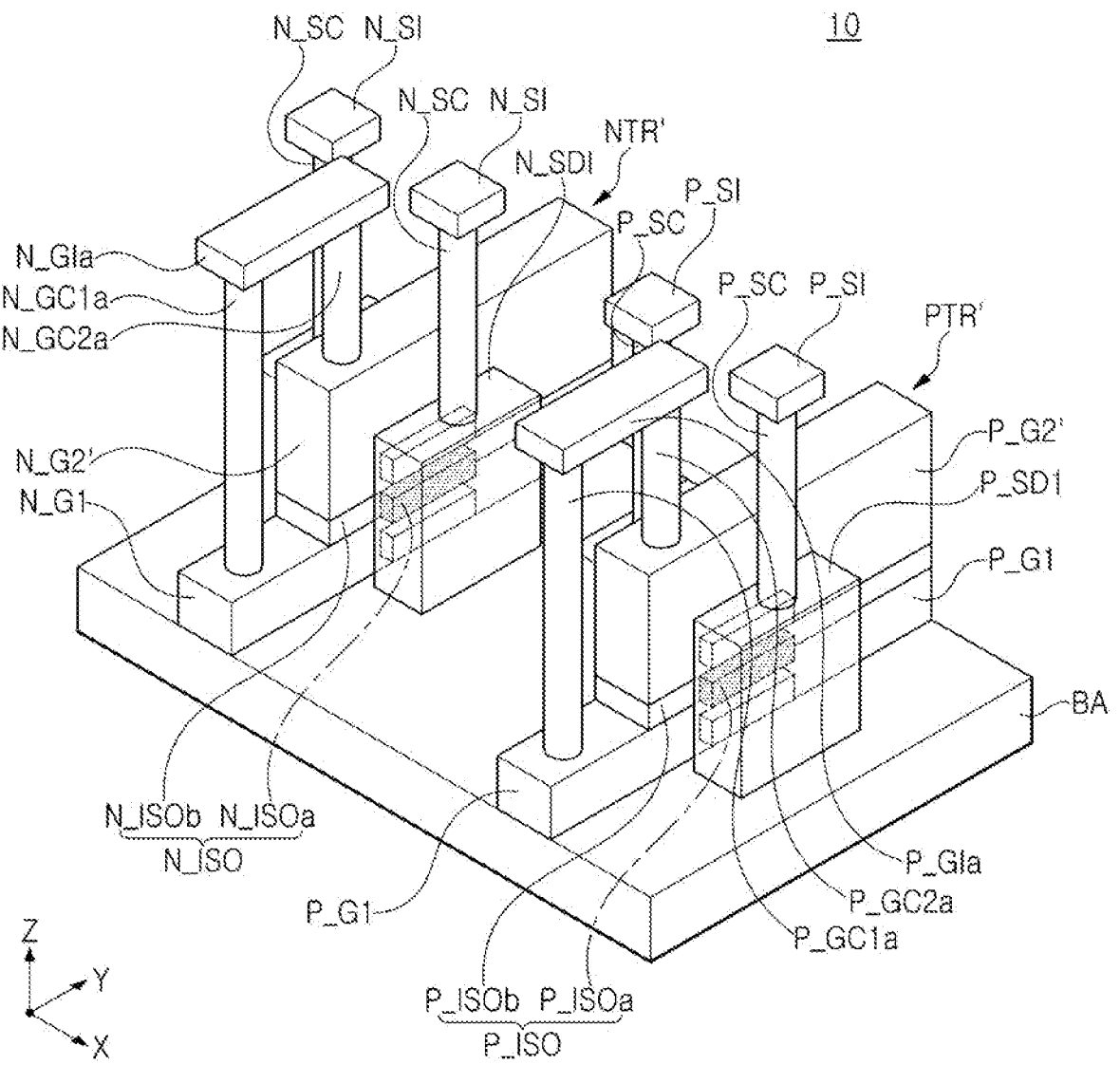
FIG. 6 is a schematic perspective view illustrating another example of a semiconductor device according to an example embodiment.

FIG. 6 illustrates an embodiment including the first and second NMOS gate structures N_G1 and N_G2' and the first and second NMOS gate contact plugs N_GC1' and N_GC2 as illustrated of FIG. 5B. The first and second NMOS gate interconnection lines N_GI1' and N_GI2 of FIG. 5B may be transformed into or replaced with NMOS gate interconnection lines N_GIa that are connected to each other. Accordingly, the first and second NMOS gate structures N_G1 and N_G2' as illustrated in FIG. 5B may be electrically connected to each other through the first and second NMOS gate contact plugs N_GC1a and N_GC2a and the NMOS gate interconnection lines N_GIa. Accordingly, because the first and second NMOS gate structures N_G1 and N_G2' are electrically connected to each other, the first and second NMOS transistors NTR1 and NTR2 of FIG. 1 may operate as one NMOS transistor NTR'.

The embodiment shown in FIG. 6 may further include first and second PMOS gate structures P_G1 and P_G2' and the first and second PMOS gate contact plugs P_GC1' and P_GC2 as illustrated in FIG. 5B. The first and second PMOS gate interconnection lines P_GI1' and P_GI2 of FIG. 5Bmay be transformed into or replaced with PMOS gate interconnection lines P_GIa that are connected to each other. Accordingly, the first and second PMOS gate structures P_G1 and P_G2' as illustrated of FIG. 5B may be electrically connected to each other through the first and second PMOS gate contact plugs P_GC1a and P_GC2a and the PMOS gate interconnection lines P_GIa. Accordingly, because the first and second PMOS gate structures P_G1 and P_G2' are electrically connected to each other, the first and second PMOS transistors PTR1 and PTR2 of FIG. 1 may operate as one PMOS transistor PTR'.

Figure 5C:
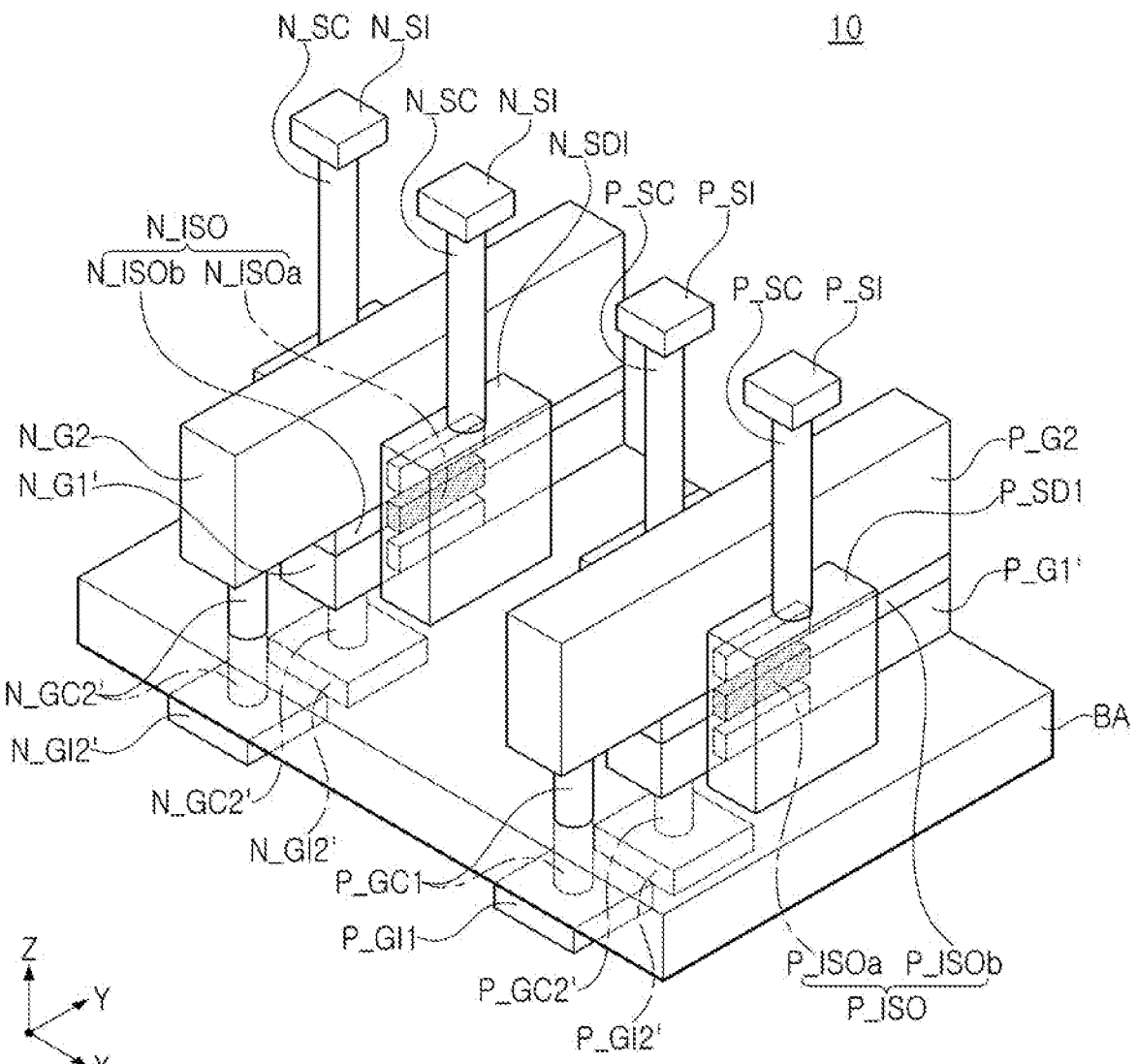
FIG. 5C is a schematic perspective view illustrating another example of a semiconductor device according to an example embodiment.
Figure 7:
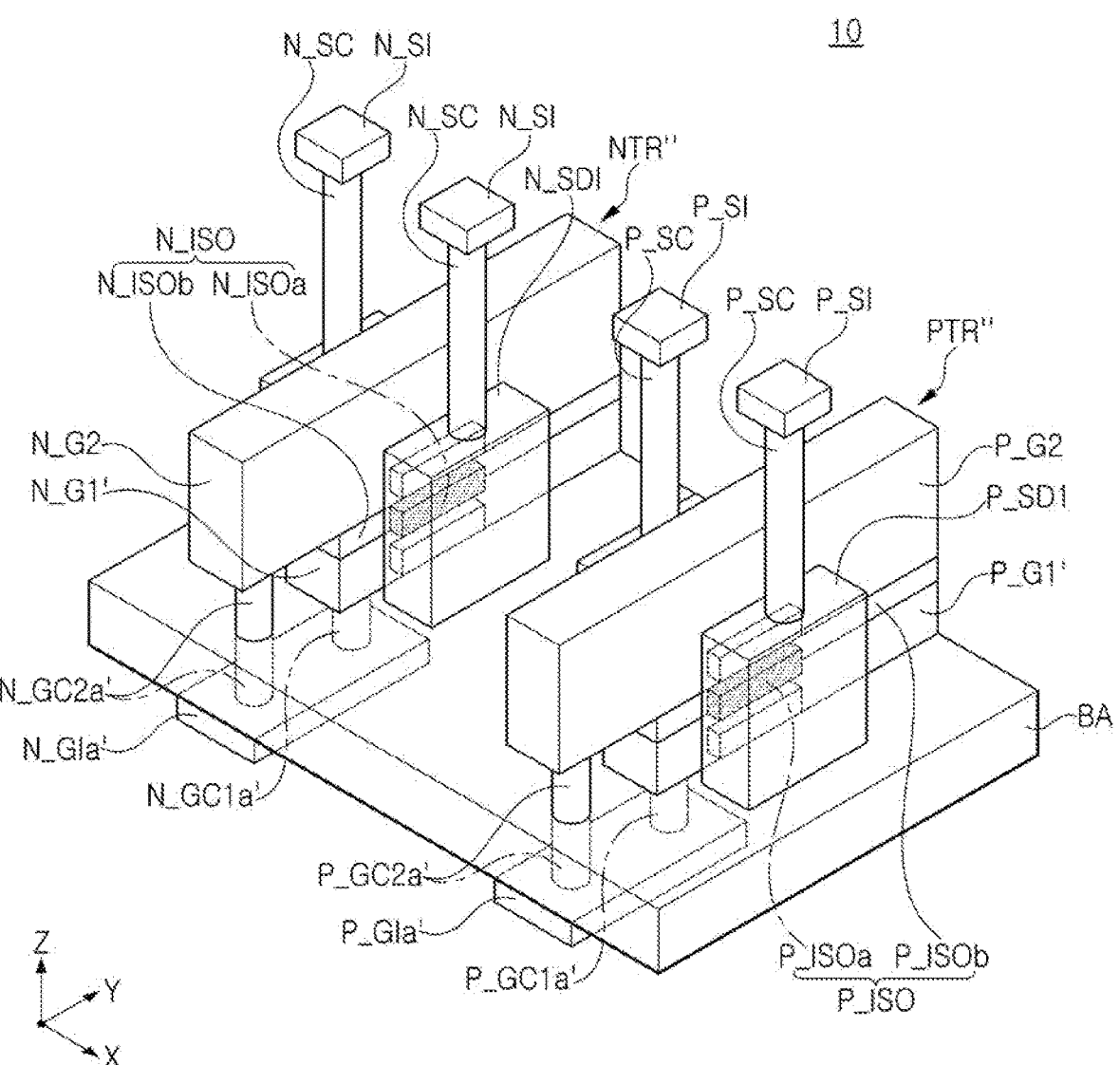
FIG. 7 is a schematic perspective view illustrating another example of a semiconductor device according to an example embodiment.

FIG. 7 illustrates an embodiment including the first and second NMOS gate structures N_G1' and N_G2 and the first and second NMOS gate contact plugs N_GC1 and N_GC2' as illustrated in FIG. 5C. The first and second NMOS gate interconnection lines N_GI1 and N_GI2' FIG. 5C may be transformed into or replaced with gate interconnection lines N_GIa' that are connected to each other. Accordingly, the first and second NMOS gate structures N_G1' and N_G2 as illustrated in FIG. 5C may be electrically connected to each other through the first and second NMOS gate contact plugs N_GC1a' and N_GC2a' and the gate interconnection lines N_GIa'. Accordingly, because the first and second NMOS gate structures N_G1' and N_G2 are electrically connected to each other, the first and second NMOS transistors NTR1 and NTR2 of FIG. 1 may operate as one NMOS transistor NTR".

The embodiment shown in FIG. 7 further includes first and second PMOS gate structures P_G1' and P_G2 and the first and second PMOS gate contact plugs P_GC1 and P_GC2' as illustrated in FIG. 5C. The first and second PMOS gate interconnection lines P_GI1 and P_GI2' of FIG. 5C may be transformed into or replaced with PMOS gate interconnection lines P_GIa' that are connected to each other. Accordingly, the first and second PMOS gate structures P_G1' and P_G2 as illustrated of FIG. 5C may be electrically connected to each other through the first and second PMOS gate contact plugs P_GC1a' and P_GC2a' and the PMOS gate interconnection lines P_GIa'. Therefore, because the first and second PMOS gate structures P_G1' and P_G2 are electrically connected to each other, the first and second PMOS transistors PTR1 and PTR2 of FIG. 1 may operate as one PMOS transistor PTR".

Figure 8:
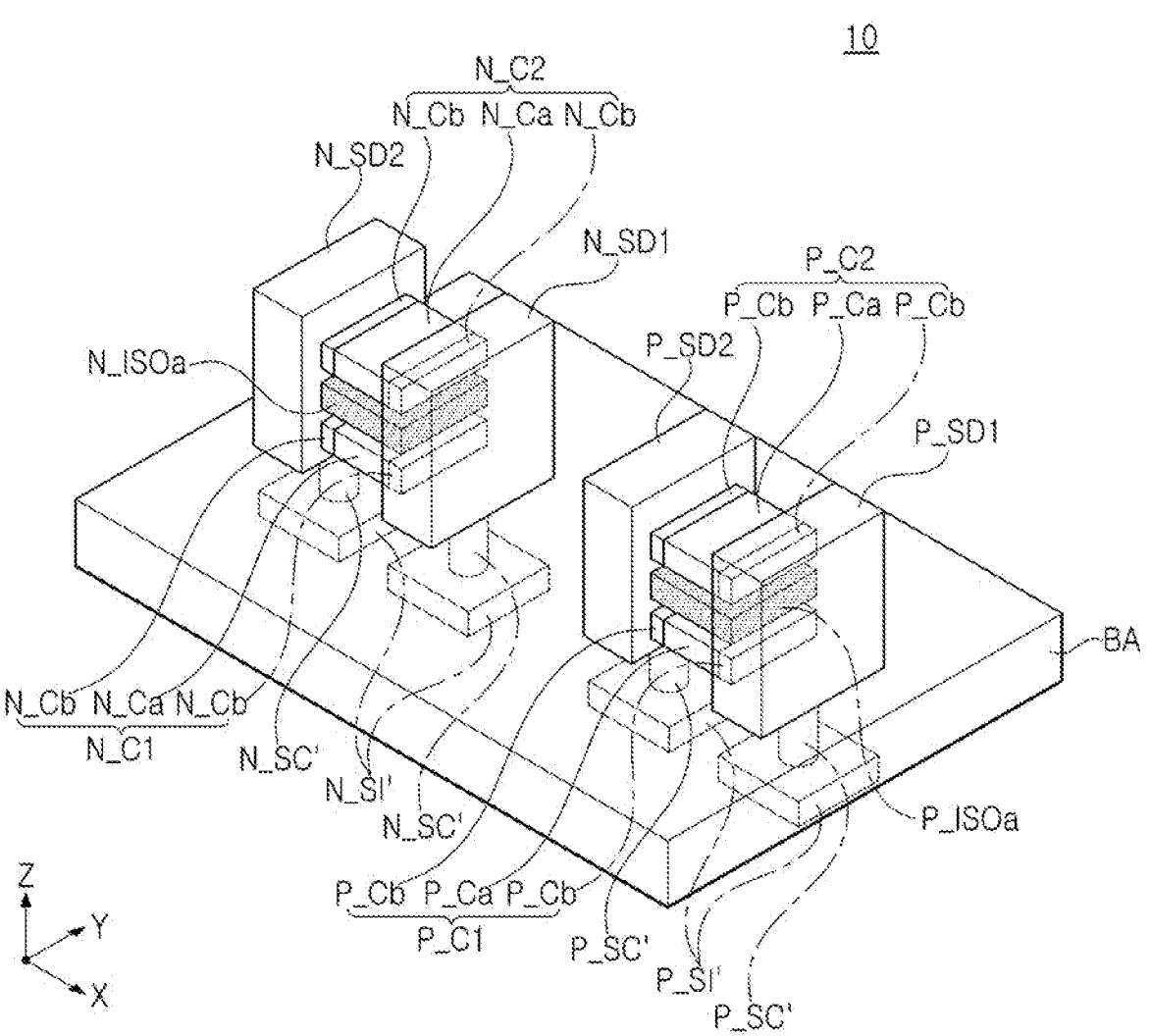
FIG. 8 is a schematic perspective view illustrating another example of a semiconductor device according to an example embodiment.

In an embodiment, referring to FIG. 8, the NMOS source/drain contact plugs N_SC disposed on the first and second common NMOS sources/drains N_SD1 and N_SD2 of FIGS. 5A, 5B, 5C, 6, and 7 may be transformed into or replaced with NMOS source/drain contact plugs N_SC' disposed below the first and second common NMOS sources/drains N_SD1 and N_SD2, and the PMOS source/drain contact plugs P_SC disposed on the first and second common PMOS sources/drains P_SD1 and P_SD2 of FIGS. 5A, 5B, 5C, 6, and 7 may be transformed into or replaced with PMOS source/drain contact plugs P_SC' disposed below the first and second common PMOS sources/drains P_SD1 and P_SD2. The NMOS and PMOS source/drain contact plugs N_SC' and P_SC' may pass through the base structure BA. The NMOS and PMOS source/drain interconnection lines N_SI and P_SI of FIGS. 5A, 5B, 5C, 6, and 7 may be replaced with NMOS and PMOS source/drain interconnection lines N_SI' and P_SI' disposed below the NMOS and PMOS source/drain contact plugs N_SC' and P_SC'.

Figure 9:
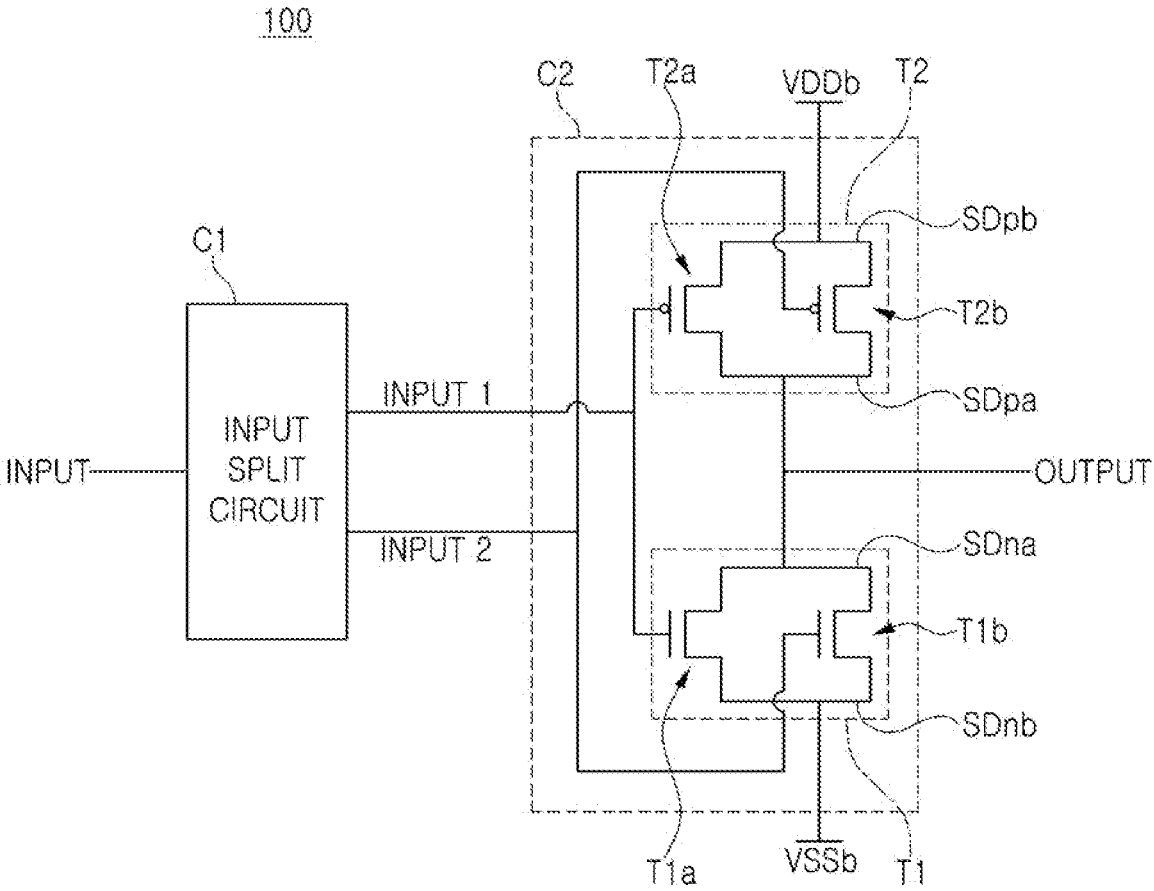
FIG. 9 is a circuit diagram conceptually illustrating an example of a semiconductor device according to an example embodiment.

A semiconductor device including at least one of the first and second transistors NTR and PTR of the semiconductor device 10 according to one of the example embodiments described above with reference to FIGS. 1 to 8 will be described. FIG. 9 is a circuit diagram conceptually illustrating an example of a semiconductor device according to an example embodiment.

Referring to FIG. 9, a semiconductor device 100 according to an example embodiment may include a first circuit C1 and a second circuit C2. Transistors included in at least a portion of at least one of the first circuit C1 and the second circuit C2 may include at least one of the first and second transistors NTR and PTR of the semiconductor device 10 according to one of the example embodiments described above with reference to FIGS. 1 to 8

The first circuit C1 may be an input split circuit splitting an input signal INPUT provided from an input terminal into a plurality of input signals INPUT1 and INPUT2. For example, the first circuit C1 may split the input signal INPUT into a first input signal INPUT1 and a second input signal INPUT2. Accordingly, the first circuit C1 may provide the plurality of input signals INPUT1 and INPUT2 to the second circuit C2. The second circuit C2 may convert the plurality of input signals INPUT1 and INPUT2 provided from the first circuit C1 into an output signal OUTPUT.

The second circuit C2 may include NMOS transistors T1 and PMOS transistors T2.

The NMOS transistors T1 may include a first NMOS transistor T1*a* and a second NMOS transistor T1*b* sharing first and second common NMOS sources/drains SDna and SDnb. The first and second common NMOS sources/drains SDna and SDnb may be the first and second common NMOS sources/drains N_SD1 and N_SD2 of FIGS. 1 and 2A.

The NMOS transistors T1 may be the NMOS transistors NTR of FIG. 1. For example, the first NMOS transistor T1*a* may include the first NMOS channel structures N_C1 and N_C1' and the first NMOS gate structures N_G1 and N_G1' described above, together with the first and second common NMOS sources/drains N_SD1 and N_SD2 described above, and the second NMOS transistor T1*b* may include the second NMOS channel structures N_C2 and N_C2' and the second NMOS gate structures N_G2 and N_G2' described above, together with the first and second common NMOS sources/drains N_SD1 and N_SD2 described above. For example, the first NMOS transistor T1*a* may be the first NMOS transistor NTR1 of FIG. 1, and the second NMOS transistor T1*b* may be the second NMOS transistor NTR2 of FIG. 1. In the first and second NMOS transistors T1*a* and T1*b*, an electrical connection for NMOS gates may be made in an example embodiment of one of FIGS. 5A, 5B and 5C, and an electrical connection for NMOS sources/drains may made in one of the example embodiments illustrated in FIGS. 5A, 5B, 5C, and 8.

The PMOS transistors T2 may include a first PMOS transistor T2*a* and a second PMOS transistor T2*b* sharing the first and second common PMOS sources/drains SDpa and SDpb. The first and second common PMOS sources/drains SDpa and SDpb may be the first and second common PMOS sources/drains P_SD1 and P_SD2 of FIGS. 1 and 2A. The PMOS transistors T2 may be the PMOS transistors PTR of FIG. 1. For example, the first PMOS transistor T2*a* may include the first PMOS channel structures P_C1 and P_C1' and the first PMOS gate structures P_G1 and P_G1' described above, together with the first and second common PMOS sources/drains P_SD1 and P_SD2 described above, and the second PMOS transistor T2*b* may include the second PMOS channel structures P_C2 and P_C2' and the second PMOS gate structures P_G2 and P_G2' described above, together with the first and second common PMOS sources/drains P_SD1 and P_SD2 described above. For example, the first PMOS transistor T2*a* may be the first PMOS transistor PTR1 of FIG. 1, and the second PMOS transistor T2*b* may be the second PMOS transistor PTR2 of FIG. 1. In the first and second PMOS transistors T2*a* and T2*b*, PMOS gates may be electrically connected to each other as in an example embodiment illustrated in FIGS. 5A, 5B, and 5C, and PMOS sources/drains may be electrically connected to each other as in an example embodiment illustrated in FIGS. 5A, 5B, 5C, and 8.

In the second circuit C2, the first common PMOS source/drain SDpa among the first and second common PMOS sources/drains SDpa and SDpb, and the first NMOS source/drain SDpa among the first and second common NMOS sources/drains SDna and SDnb may be electrically connected to an output terminal providing an output signal OUTPUT.

In the second circuit C2, the second common PMOS source/drain SDpb among the first and second common PMOS sources/drains SDpa and SDpb may be electrically connected to a first power supply voltage VDDb, and the second common NMOS source/drain SDnb among the first and second common NMOS sources/drains SDna and SDnb may be electrically connected to a second power supply voltage VSSb.

The first power supply voltage VDDb may be a VDD voltage, and the second power supply voltage VSSb may be a VSS voltage.

The first power supply voltage VDDb will be referred to as a VDDb power supply voltage, and the second power supply voltage VSSb will be referred to as a VSSb power supply voltage.

A gate of the first NMOS transistor T1*a* and a gate of the first PMOS transistor T2*a* may be electrically connected to the first input signal INPUT 1, and a gate of the second NMOS transistor T1*b* and a gate of the second PMOS transistor T2*b* may be electrically connected to the second input signal INPUT 2. Accordingly, example embodiments may provide an integrated circuit including the semiconductor device 100.

Next, various examples of the first circuit C1 of FIG. 9 will be described with reference to FIGS. 10, 12, and 14, respectively, and a multi-value logic device capable of implementing ternary or higher logic using a semiconductor device and an integrated circuit including the same according to example embodiments will be described with reference to FIGS. 11A, 11B, 13, and 15, respectively.

Figure 10:
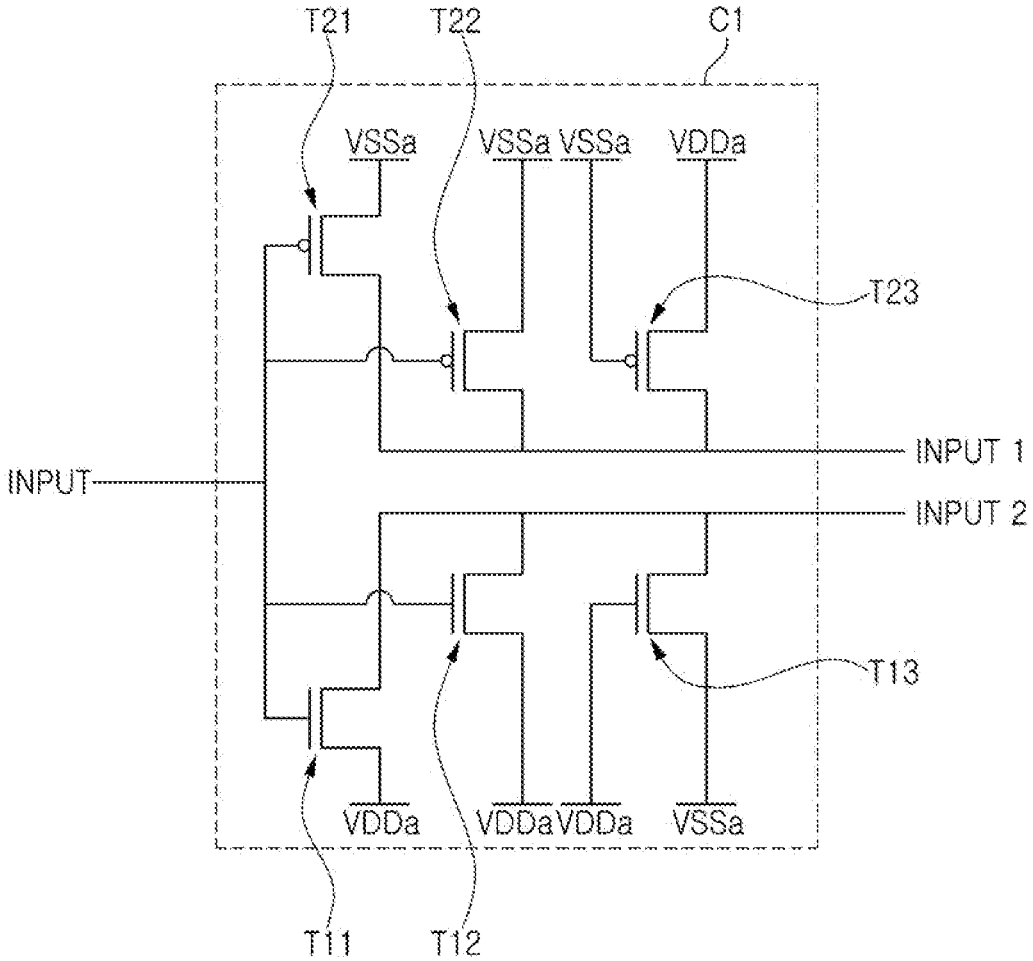
FIG. 10 is an example of a circuit diagram conceptually illustrating a portion of the circuit diagram in FIG. 9, according to an example embodiment.

Referring to FIGS. 9 and 10, the first circuit C1 may include a first NMOS transistor T11, a second NMOS transistor T12, a third NMOS transistor T13, a first PMOS transistor T21, a second PMOS transistor T22, and a third PMOS transistor T23.

A gate of the first NMOS transistor T11, a gate of the second NMOS transistor T12, a gate of the first PMOS transistor T21, and a gate of the second PMOS transistor T22 may be electrically connected to the input signal INPUT.

A first NMOS source/drain of the first NMOS transistor T11, a first NMOS source/drain of the second NMOS transistor T12, a gate of the third NMOS transistor T13, and a first PMOS source/drain of the third PMOS transistor T23 may be electrically connected to a VDDa voltage, and a first NMOS source/drain of the third NMOS transistor T13, a first PMOS source/drain of the first PMOS transistor T21, a first PMOS source/drain of the second PMOS transistor T22, and a gate of the third PMOS transistor T23 may be electrically connected to a VSSa voltage.

A second NMOS source/drain of the first NMOS transistor T11, a second NMOS source/drain of the second NMOS transistor T12, and a second NMOS source/drain of the third NMOS transistor T13 may transmit the second input signal INPUT 2 to the second circuit C2, and a second PMOS source/drain of the first PMOS transistor T21, a second PMOS source/drain of the second PMOS transistor T22, and a second PMOS source/drain of the third PMOS transistor T23 may transmit the first input signal INPUT 1 to the second circuit C2.

Each of the first to third NMOS transistors T11, T12, and T13 may include at least one of the NMOS transistors NTR of FIGS. 1 to 3, the NMOS transistor NTR' 6, and the NMOS transistor NTR" of FIG. 7. The first to third PMOS transistors T21, T21, and T23 may include at least one of the PMOS transistors PTR of FIGS. 1 to 3, or the PMOS transistor PTR' of FIG. 6, and the PMOS transistor PTR" of FIG. 7.

In the integrated circuit including the semiconductor device of FIGS. 9 and 10, an inverter function based on a ternary system will be described with reference to FIG. 11A. FIG. 11A is a table showing voltages of the input signal INPUT, the first input signal INPUT 1, the second input signal INPUT 2, and the output signal OUTPUT so as to describe the inverter function based on the ternary system.

Referring to FIG. 11A together with FIGS. 9 and 10, when the input signal INPUT is a VDDa voltage, the first input signal INPUT 1 may be a VDDa voltage, the second input signal INPUT 2 may be a VDDa voltage, and the output signal OUTPUT may be a VSSa voltage.

When the input signal INPUT is a VSSa voltage, the first input signal INPUT 1 may be a VSSa voltage, the second input signal INPUT 2 may be a VSSa voltage, and the output signal OUTPUT may be a VDDa voltage.

When the input signal INPUT is a GND voltage, the first input signal INPUT 1 may be a VDDa voltage, the second input signal INPUT 2 may be a VSSa voltage, and the output signal OUTPUT may be a GND voltage.

The VDDa voltage may be a VDD power supply voltage, for example, +1 V, the VSSa voltage may be a VSS power supply voltage, for example, −1 V, and the GND voltage may be a ground voltage, for example, 0 V. In another example, the VDDa voltage may be a voltage different from +1 V, and the VSSa voltage may be a voltage different from −1 V, and the GND voltage may be a voltage different from 0 V.

Accordingly, as illustrated in FIG. 11A, the inverter function based on the ternary system may be implemented, and thus example embodiments may provide a multi-value logic device using the semiconductor device and the integrated circuit according to the above-described example embodiments.

In the integrated circuit including the semiconductor device of FIGS. 9 and 10, an inverter function based on a pentagonal system will be described with reference to FIG. 11B. FIG. 11B is a table showing voltages of the input signal INPUT, the first input signal INPUT 1, the second input signal INPUT 2, and the output signal OUTPUT so as to describe the inverter function based on the pentagonal system.

Referring to FIG. 11B together with FIGS. 9 and 10, when the input signal INPUT is a VDDa voltage, the first input signal INPUT 1 may be a VDDa voltage, the second input signal INPUT 2 may be a VDDa voltage, and the output signal OUTPUT may be a VSSa voltage.

When the input signal INPUT is a VSSa voltage, the first input signal INPUT 1 may be a VSSa voltage, the second input signal INPUT 2 may be a VSSa voltage, and the output signal OUTPUT may be a VDDa voltage.

When the input signal INPUT is a GND voltage, the first input signal INPUT 1 may be a VDDa voltage, the second input signal INPUT 2 may be a VSSa voltage, and the output signal OUTPUT may be a GND voltage.

When the input signal INPUT is a VDDa/2 voltage, the first input signal INPUT 1 may be a VDDa voltage, the second input signal INPUT 2 may be a GND voltage, and the output signal OUTPUT may be a VSSa/2 voltage.

When the input signal INPUT is a VSSa/2 voltage, the first input signal INPUT 1 may be a GND voltage, the second input signal INPUT 2 may be a VSSa voltage, and the output signal OUTPUT may be a VDDa/2 voltage.

The VDDa voltage may be a VDD power supply voltage, for example, +1 V, the VSSa voltage may be a VSS power supply voltage, for example, −1 V, the GND voltage may be a ground voltage, for example, 0 V, the VDDa/2 voltage may be a VDD/2 power supply voltage, for example, +0.5 V, and the VSSa/2 voltage may be a VSS/2 power supply voltage, for example, −0.5 V.

Accordingly, as illustrated in FIG. 11B, the inverter function based on the pentagonal system may be implemented, and thus example embodiments may provide a multi-value logic device using the semiconductor device and the integrated circuit according to the above-described example embodiments.

Figures 12, 13:
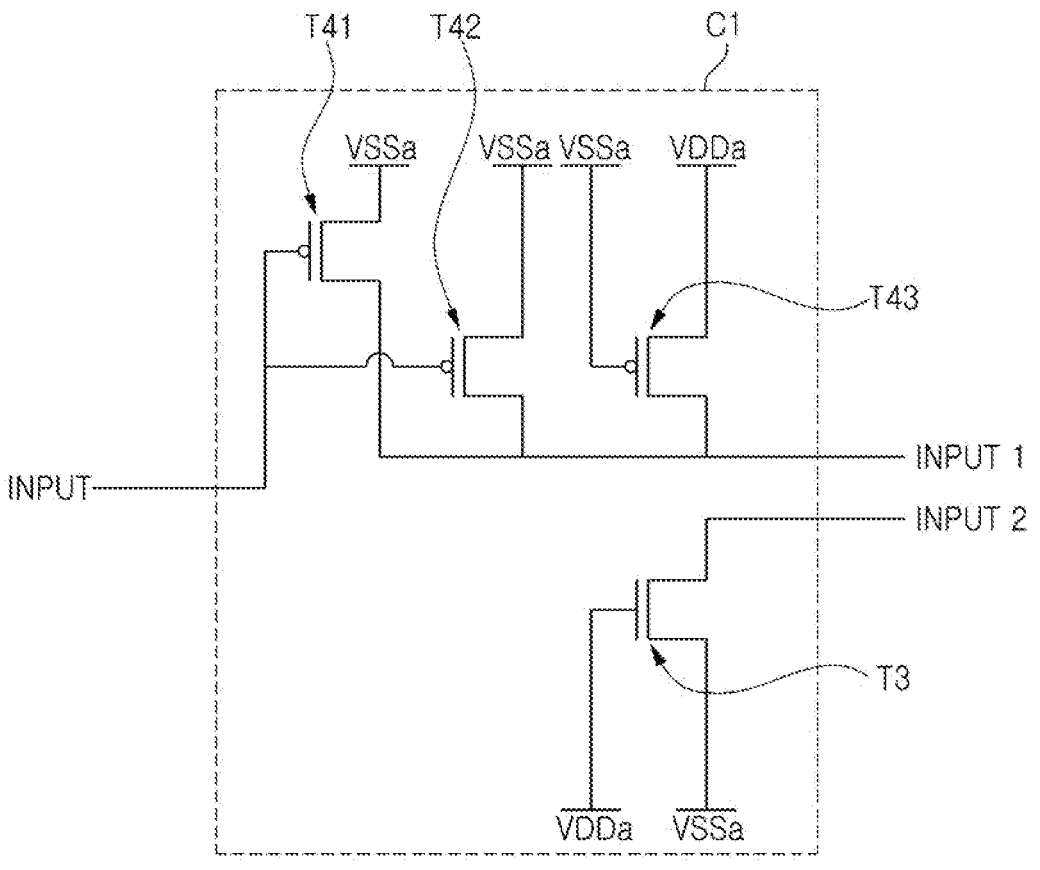
FIG. 12 is another example of a circuit diagram conceptually illustrating a portion of the circuit diagram in FIG. 9, according to an example embodiment.
FIG. 13 is a diagram illustrating an example of operating voltages of the circuit diagrams in FIGS. 9 and 12, according to an example embodiment.

In another example, referring to FIGS. 9 and 12, the first circuit C1 may include an NMOS transistor T3, a first PMOS transistor T41, a second PMOS transistor T42, and a third PMOS transistor T43.

A gate of the first PMOS transistor T41 and a gate of the second PMOS transistor T42 may be electrically connected to the input signal INPUT.

A gate of the NMOS transistor T3 and a first PMOS source/drain of the third PMOS transistor T43 may be electrically connected to a VDDa voltage.

A first NMOS source/drain of the NMOS transistor T3, a first PMOS source/drain of the first PMOS transistor T41, a first PMOS source/drain of the second PMOS transistor T42, and a gate of the third PMOS transistor T43 may be electrically connected to a VSSa voltage.

A second NMOS source/drain of the NMOS transistor T3 may transmit the second input signal INPUT 2 to the second circuit C2.

A second PMOS source/drain of the first PMOS transistor T41, a second PMOS source/drain of the second PMOS transistor T42, and a second PMOS source/drain of the third PMOS transistor T43 may transmit the first input signal INPUT 1 to the second circuit C2.

In the integrated circuit including the semiconductor device of FIGS. 9 and 12, an inverter function based on a ternary system will be described with reference to FIG. 13. FIG. 13 is a table showing voltages of the input signal INPUT, the first input signal INPUT 1, the second input signal INPUT 2, and the output signal OUTPUT so as to describe the inverter function based on the ternary system.

Referring to FIG. 13 together with FIGS. 9 and 12, when the input signal INPUT is a VDDa voltage, the first input signal INPUT 1 may be a VDDa voltage, the second input signal INPUT 2 may be a VSSa voltage, and the output signal OUTPUT may be a GND voltage.

When the input signal INPUT is a VSSa voltage, the first input signal INPUT 1 may be a VSSa voltage, the second input signal INPUT 2 may be a VSSa voltage, and the output signal OUTPUT may be a VDDa voltage.

When the input signal INPUT is a GND voltage, the first input signal INPUT 1 may be a VDDa voltage, the second input signal INPUT 2 may be a VSSa voltage, and the output signal OUTPUT may be a GND voltage.

The VDDa voltage may be a VDD power supply voltage, for example, +1 V, the VSSa voltage may be a VSS power supply voltage, for example, −1 V, the GND voltage may be a ground voltage, for example, 0 V. In another example, the VDDa voltage may be a voltage different than +1 V, the VSSa voltage may be a voltage different from −1 V, and the GND voltage may be a voltage different from 0 V.

Accordingly, as illustrated in FIG. 13, the inverter function based on the ternary system may be implemented, and thus example embodiments may provide a multi-value logic device using the semiconductor device and the integrated circuit according to the above-described example embodiments.

Figures 14, 15:
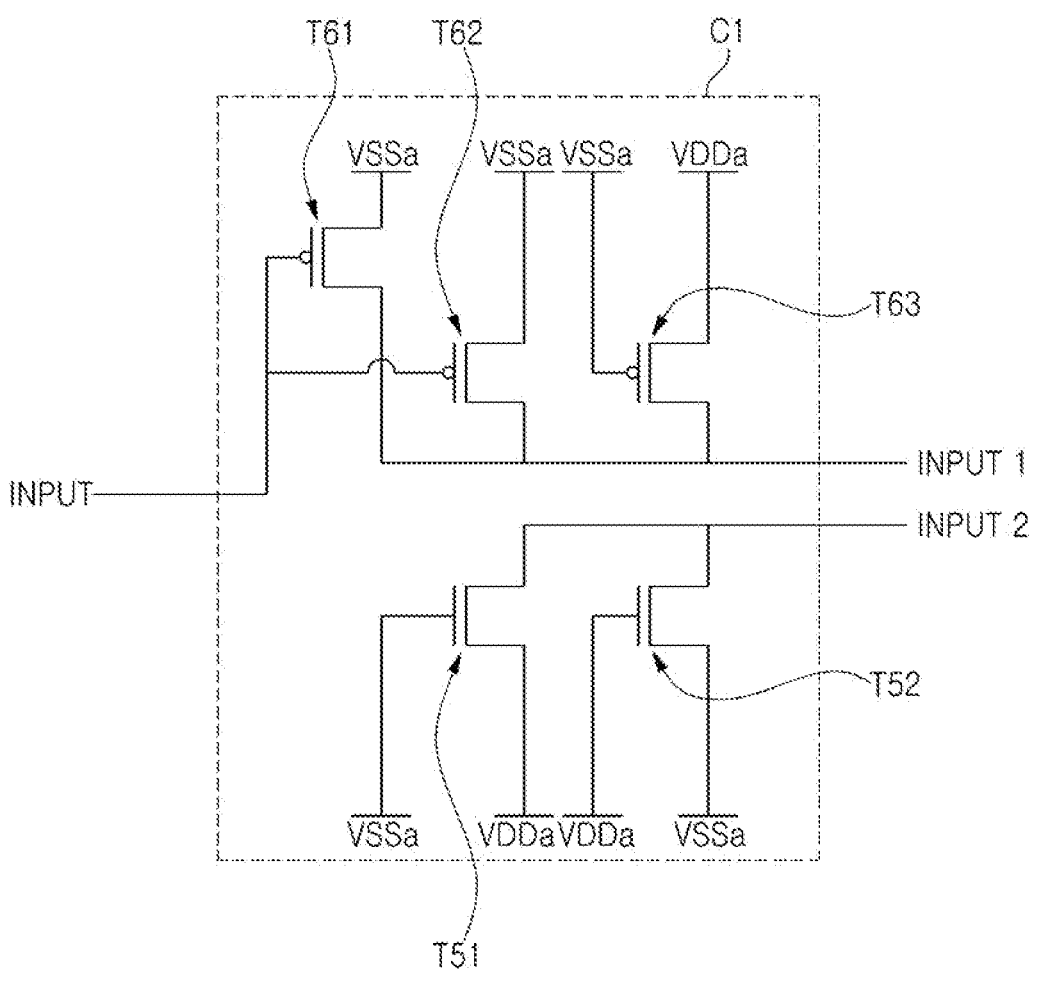
FIG. 14 is another example of a circuit diagram conceptually illustrating a portion of the circuit diagram in FIG. 9, according to an example embodiment.
FIG. 15 is a diagram illustrating an example of operating voltages of the circuit diagrams in FIGS. 9 and 14, according to an example embodiment.

Referring to FIGS. 9 and 14, the first circuit C1 may include a first NMOS transistor T51, a second NMOS transistor T52, a first PMOS transistor T61, a second PMOS transistor T62, and a third PMOS transistor T63.

A gate of the first PMOS transistor T61 and a gate of the second PMOS transistor T62 may be electrically connected to the input signal INPUT.

A gate of the first NMOS transistor T51, a first NMOS source/drain of the second NMOS transistor T52, a first PMOS source/drain of the first PMOS transistor T61, a first PMOS source/drain of the second PMOS transistor T62, and a gate of the third PMOS transistor T63 may be electrically connected to a VSSa voltage. A first NMOS source/drain of the first NMOS transistor T51, a gate of the second NMOS transistor T52, and a first PMOS source/drain of the third PMOS transistor T63 may be electrically connected to a VDDa voltage.

A second NMOS source/drain of the first NMOS transistor T51 and a second NMOS source/drain of the second NMOS transistor T52 may transmit the second input signal INPUT 2 to the second circuit C2. A second PMOS source/drain of the first PMOS transistor T61, a second PMOS source/drain of the second PMOS transistor T62, and a second PMOS source/drain of the third PMOS transistor T63 may transmit the first input signal INPUT 1 to the second circuit C2.

In the integrated circuit including the semiconductor device of FIGS. 9 and 14, an inverter function based on a pentagonal system will be described with reference to FIG. 15. FIG. 15 is a table showing voltages of the input signal INPUT, the first input signal INPUT 1, the second input signal INPUT 2, and the output signal OUTPUT so as to describe the inverter function based on the pentagonal system.

Referring to FIG. 15 together with FIGS. 9 and 14, when the input signal INPUT is a VDDa voltage, the first input signal INPUT 1 may be a VDDa voltage, the second input signal INPUT 2 may be a GND voltage, and the output signal OUTPUT may be a VSSa/2 voltage.

When the input signal INPUT is a VSSa voltage, the first input signal INPUT 1 may be a VSSa voltage, the second input signal INPUT 2 may be a GND voltage, and the output signal OUTPUT may be a VDDa/2 voltage.

When the input signal INPUT is a GND voltage, the first input signal INPUT 1 may be a VDDa voltage, the second input signal INPUT 2 may be a GND voltage, and the output signal OUTPUT may be a VSSa/2 voltage.

When the input signal INPUT is a VDDa/2 voltage, the first input signal INPUT 1 may be a VDDa voltage, the second input signal INPUT 2 may be a GND voltage, and the output signal OUTPUT may be a VSSa/2 voltage.

When the input signal INPUT is a VSSa/2 voltage, the first input signal INPUT 1 may be a GND voltage, the second input signal INPUT 2 may be a GND voltage, and the output signal OUTPUT may be a GND voltage.

The VDDa voltage may be a VDD power supply voltage, for example, +1 V, the VSSa voltage may be a VSS power supply voltage, for example, −1 V, the GND voltage may be a ground voltage, for example, 0 V, the VDDa/2 voltage may be a VDD/2 power supply voltage, for example, +0.5 V, and the VSSa/2 voltage may be a VSS/2 power supply voltage, for example, −0.5 V.

Accordingly, as illustrated in FIG. 15, the inverter function based on the pentagonal system may be implemented, and thus example embodiments may provide a multi-value logic device using the semiconductor device and the integrated circuit according to the above-described example embodiments.

Figure 16:
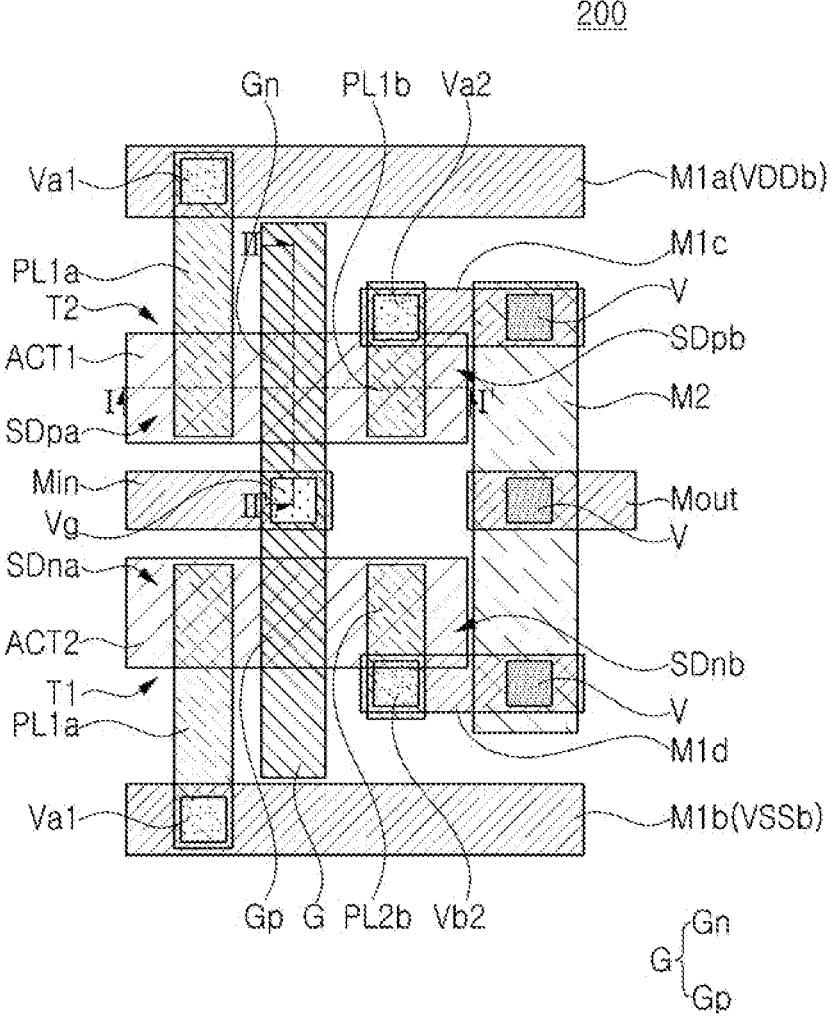
FIGS. 16, 17A, and 17B are diagrams conceptually illustrating a modification of a semiconductor device according to an example embodiment.

An example of a semiconductor device according to an example embodiment will be described with reference to FIGS. 16, 17A and 17B. FIG. 16 is a layout illustrating an example of the second circuit C2 of FIG. 9, FIG. 17A is a cross-sectional view conceptually illustrating an region taken along line II' of FIG. 16, and FIG. 17B is a cross-sectional view conceptually illustrating an region taken along line II-II' of FIG. 16.

Figure 17A:
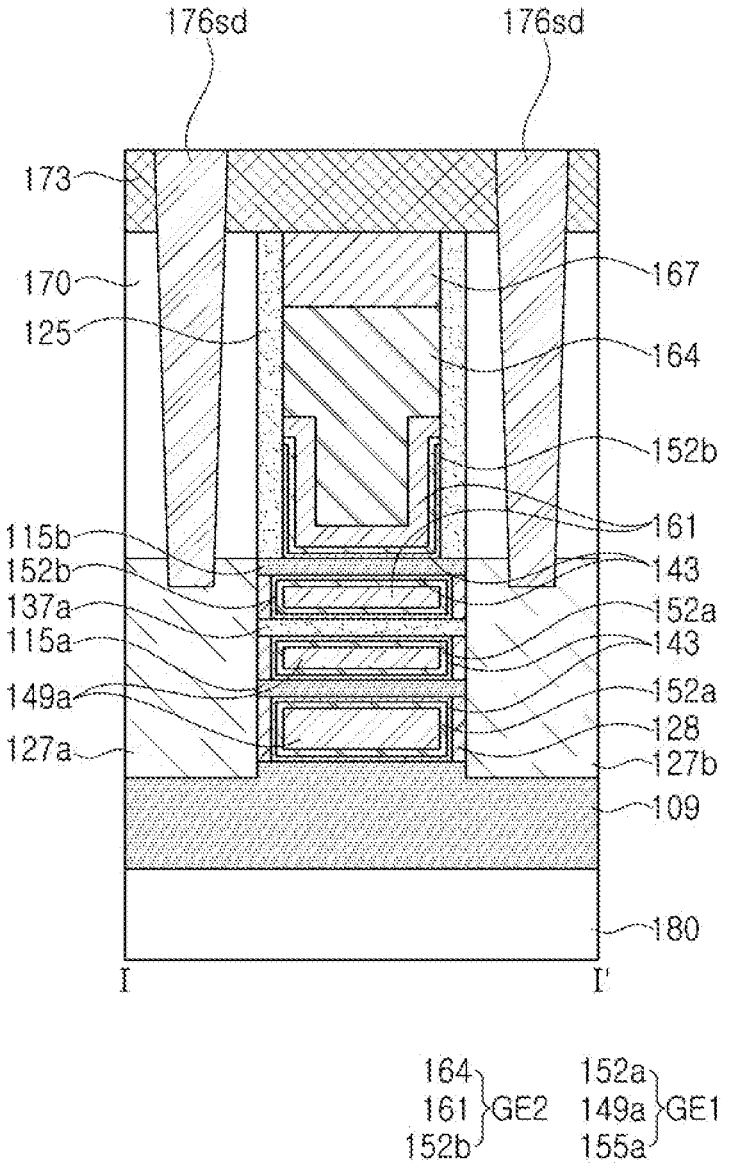
Figure 17B:
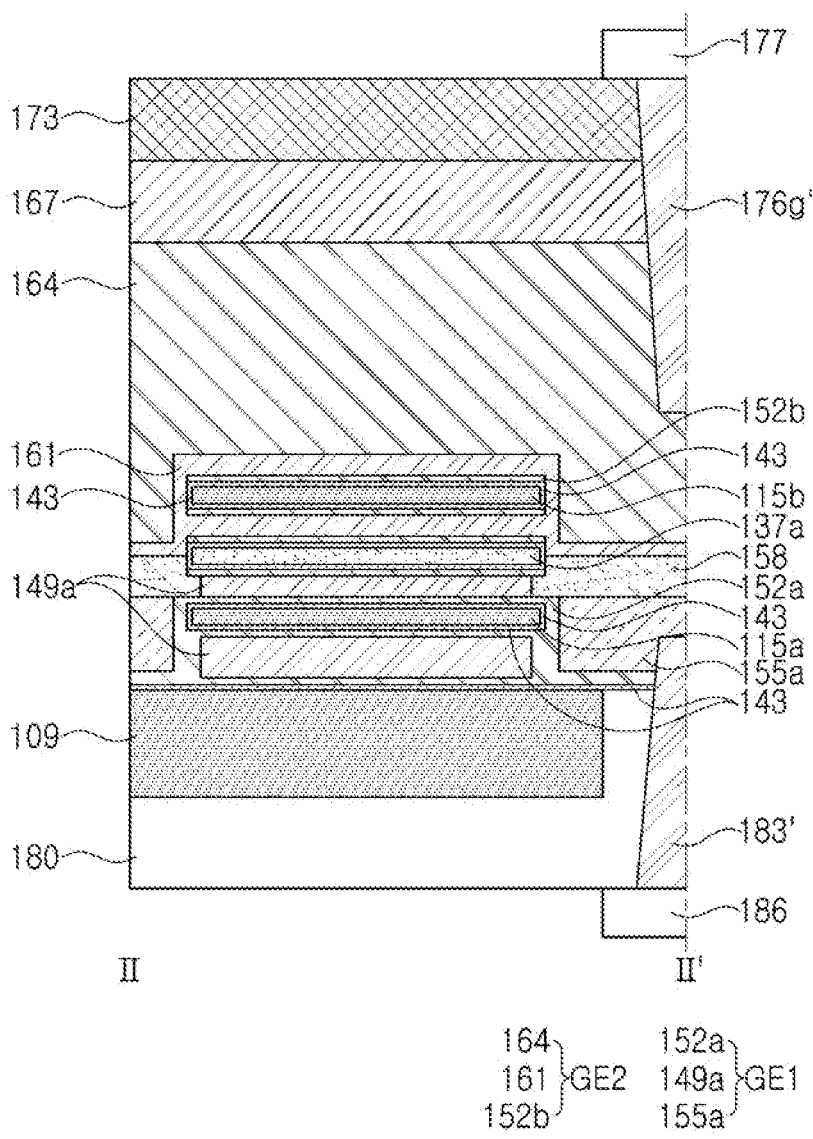

FIGS. 16, 17A, and 17B, illustrate embodiments including a VDDb voltage line M1*a* and a VSSb voltage line M1*b*. A first active region ACT1 and a second active region ACT2 may be disposed between the VDDb voltage line M1*a* and the VSSb voltage line M1*b*. A gate G may be disposed to cross the first and second active regions ACT1 and ACT2 at the same time. The first active region ACT1 may be a PMOS active region including the PMOS sources/drains SDpa and SDpb, and the second active region ACT2 may include NMOS sources/drains SDna and SDnb. The PMOS sources/drains SDpa and SDpb may be denoted by reference numerals 127*a* and 127*b* in FIG. 17A.

The first active region ACT1 may include a first channel structure 115*a* and a second channel structure 115*b* disposed between the PMOS sources/drains SDpa and SDpb. The second active region ACT2 may have substantially the same structure or shape as that of the first active region ACT1. The first channel structure 115*a* and the second channel structure 115*b* may be vertically spaced apart from each other.

The gate G may include an NMOS gate Gn crossing the first active region ACT1 and a PMOS gate Gp crossing the second active region ACT2. The gate G may include a lower gate electrode GE1 and an upper gate electrode GE2. The gate G may further include the gate dielectric layers 143.

The lower and upper gate electrodes GE1 and GE2 and the gate dielectric layers 143 may be included in the gate structures N_G1, N_G2, P_G1, and P_G2 described above with reference to FIGS. 1 to 5C. Accordingly, the gate G may include the gate structures N_G1, N_G2, P_G1, and P_G2 described above with reference to FIGS. 1 to 5C.

The embodiments illustrated in FIGS. 16, 17A, and 17B may further include an input signal wiring line Min transmitting a plurality of input signals INPUT 1 and INPUT 2 of FIG. 9. The input signal wiring line Min may be electrically connected to the gate G through a via Vg.

In example embodiments, terms such as "wiring line" may be referred to as "interconnection line", "conductive line" or "metal line". For example, the input signal wiring line Min may be referred to as "input signal interconnection line".

The input signal wiring line Min may include a first input signal wiring line 186 electrically connected to the lower gate electrode GE1 through a contact plug 183', and a second input signal wiring line 177 electrically connected to the upper gate electrode GE2 through a contact plug 176g'.

A first PMOS source/drain SDpa among the PMOS sources/drains SDpa and SDpb may be electrically connected to the VDDb voltage line M1a through a contact plug PL1a and a via Va1. A first NMOS source/drain SDna among the NMOS sources/drains SDna and SDnb may be electrically connected to the VSSb voltage line M1b through a contact plug PL1a and a via Va1.

A second PMOS source/drain SDpb among the PMOS sources/drains SDpa and SDpb and a second NMOS source/drain SDna among the NMOS sources/drains SDna and SDnb may be electrically connected to an output signal wiring line Mout transmitting the output signal OUTPUT of FIG. 9 through contact plugs PL1a and PL2b, vias Va2, Vb2, and V, and wiring lines M2.

Referring to FIGS. 17A and 17B, the lower and upper gate electrodes GE1 and GE2 and the sources/drains 127a and 127b may be disposed on base structures. The base structures may include a semiconductor layer 109 and an insulating layer 180 disposed below the semiconductor layer 109 and passing through the semiconductor layer 109. The lower gate electrode GE1 may cross a first channel structure 115a, and cover an upper surface, a lower surface, and side surfaces of the first channel structure 115a. The upper gate electrode GE2 may cross a second channel structure 115b, and cover an upper surface, a lower surface, and side surfaces of the second channel structure 115b. The second channel structure 115b may be disposed on a level higher than that of the first channel structure 115a. The first and second channel structures 115a and 115b may be formed to have the same structure or may be formed of the same material as those of the channel structures N_C1, N_C2, P_C1, and P_C2 described with reference to FIG. 1. Insulating inner spacers 128 may be disposed between the lower and upper gate electrodes GE1 and GE2 and the sources/drains 127a and 127b, but the insulating inner spacers 128 may be omitted.

An insulating gate capping layer 167 may be disposed on the upper gate electrode GE2. An insulating gate spacer 125 may be disposed on side surfaces of the upper gate electrode GE2 and the insulating gate capping layer 167 on a level higher than that of the second channel structure 115b. An interlayer insulating layer 170 may be disposed on the sources/drains 127a. An interlayer insulating layer 173 may be disposed on the interlayer insulating layer 170, and may cover the insulating gate capping layer 167. Source/drain contact plugs 176sd pass through the interlayer insulating layers 170 and 173 and are electrically connected to the sources/drains 127a and 127b.

The contact plug 183' may be electrically connected to the first gate electrode GE1 while passing through the base structures, for example semiconductor layer 109 and insulating layer 180, and the contact plug 183' may be electrically connected to the second gate electrode GE2 while passing through the insulating layer 180 of the base structures.

The first and second gate electrodes GE1 and GE2 may have different thicknesses. The first gate electrode GE1 may include a plurality of conductive layers 149a, 152a, and 155a, and the second gate electrode GE2 may include a plurality of conductive layers 152b, 161, and 164. Some conductive layers, for example second conductive layer 149a and third conductive layer 152a of the plurality of conductive layers 149a, 152a, and 155a of the first gate electrode GE1, may be disposed adjacent to the first channel structure 115a or work function adjusting metal layers (for example, TiN, TiAlC, and the like) surrounding the first channel structure 115a. The other conductive layer of the plurality of conductive layers 149a, 152a, and 155a of the first gate electrode GE1, which may be for example conductive pattern 155a, may be a metal layer (for example, W, Ru, or the like) having a lower resistivity than those of the work function adjusting metal layers. At least one of the first and second gate electrodes GE1 and GE2 may be formed of a plurality of layers including doped polysilicon, metal, conductive metal nitride, a metal-semiconductor compound, conductive metal oxide, a graphene, a carbon nanotube, or a combination thereof. For example, at least one of the first and second gate electrodes GE1 and GE2 may include doped polysilicon, Al, Cu, Ti, Ta, Ru, W, Mo, Pt, Ni, Co, TiN, TaN, WN, NbN, TiAl, TiAlN, TiAlC, TaAlC, TiSi, TiSiN, TaSi, TaSiN, RuTiN, NiSi, CoSi, $IrO_x$, $RuO_x$, a graphene, a carbon nanotube, or a combination thereof, but example embodiments are not limited thereto.

Insulating isolation structures 137a and 158 may be disposed between the first gate electrode GE1 and the second gate electrode GE2.

The insulating isolation structures 137a and 158 may include a first insulating pattern 137a and a second insulating pattern 158. The first insulating pattern 137a may vertically overlap the first and second channel structures 115a and 115b, and the second insulating pattern 158 may not vertically overlap the first and second channel structures 115a and 115b.

The insulating isolation structures 137a and 158 may serve substantially the same role as those of the insulating isolation structures N_ISO and P_ISO of FIG. 1. Accordingly, the first insulating pattern 137a may be the first isolation portions N_ISOa and P_ISOa of FIG. 1, and the second insulating pattern 158 may be the second isolation portions N_ISOb and P_ISOb of FIG. 1.

Figure 18:
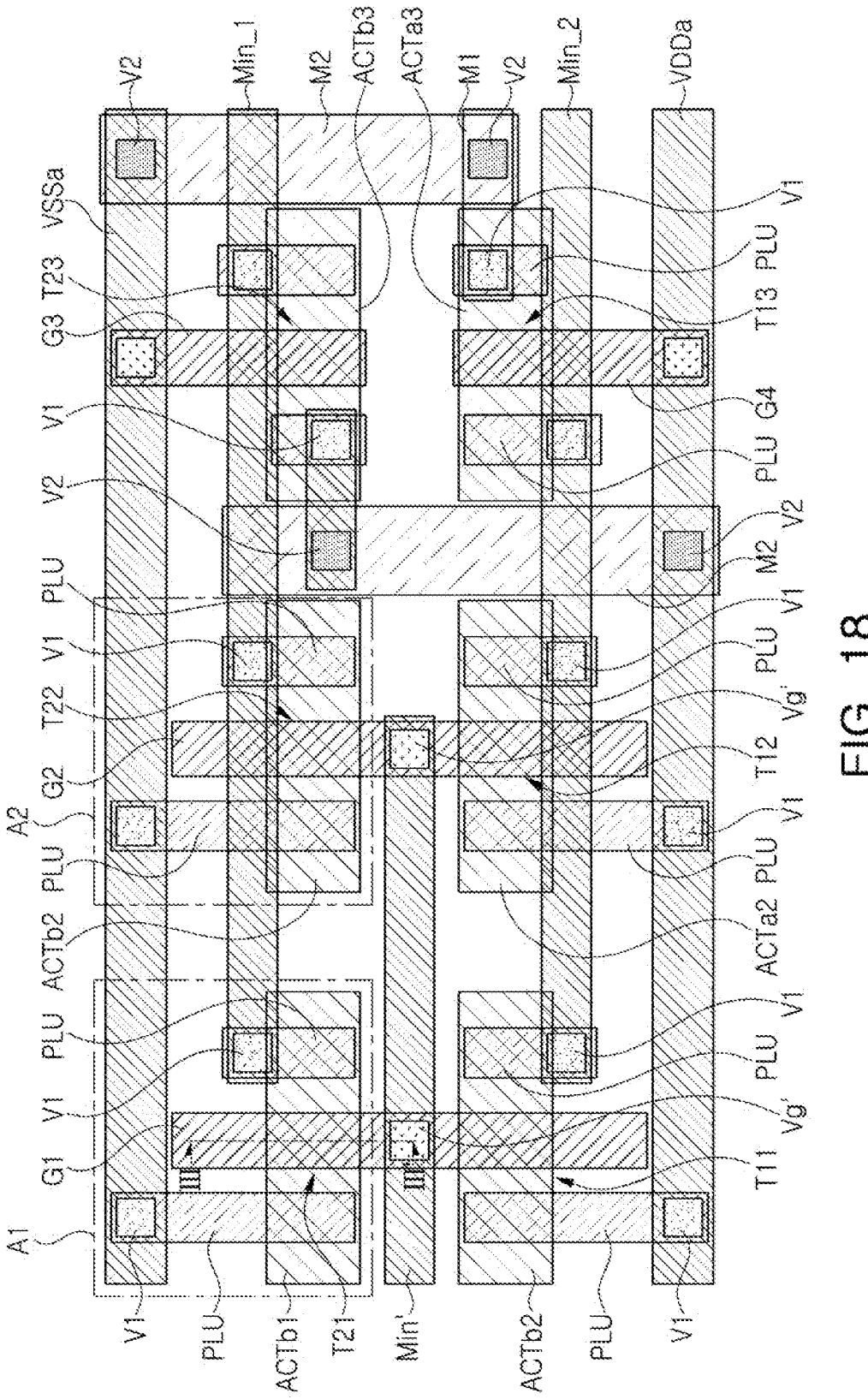
FIGS. 18 and 19 are diagrams conceptually illustrating a modification of a semiconductor device according to an example embodiment.

An example of a semiconductor device according to an example embodiment will be described with reference to FIGS. 18 and 19. FIG. 18 is a layout illustrating an example of the first circuit C1 of FIG. 10, and FIG. 19 is a cross-sectional view conceptually illustrating an region taken along line III-III' of FIG. 18.

Figure 19:
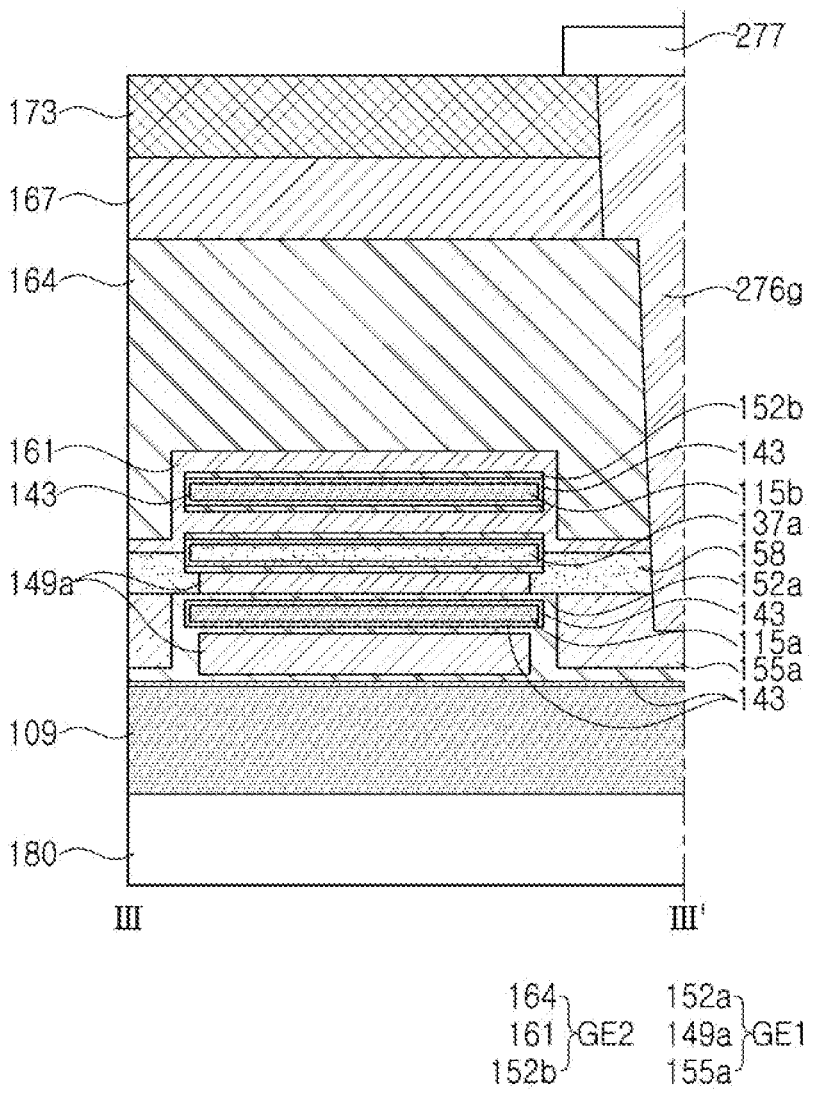

FIGS. 18 and 19 illustrate embodiments including a VDDa voltage line VDDa and a VSSa voltage line VSSa. Between the VDDa voltage line VDDa and the VSSa voltage line VSSa, the first NMOS transistor T11, the second NMOS transistor T12, the third NMOS transistor T13, the first PMOS transistor T21, the second PMOS transistor T22, and the third PMOS transistor T23 described above may be included.

A gate G1 of the first NMOS transistor T11, a gate G2 of the second NMOS transistor T12, a gate G1 of the first PMOS transistor T21, and a gate G2 of the second PMOS transistor T22 may be electrically connected to an input signal wiring line Min' transmitting the input signal INPUT through a contact plug Vg'.

A first NMOS source/drain of the first NMOS transistor T11, a first NMOS source/drain of the second NMOS transistor T12, a gate of the third NMOS transistor T13, and a first PMOS source/drain of the third PMOS transistor T23 may be electrically connected to the VDDa voltage line VDDa through contact plugs PLU, vias V1 and V2, and wiring lines M2. A first NMOS source/drain of the third NMOS transistor T13, a first PMOS source/drain of the first PMOS transistor T21, a first PMOS source/drain of the second PMOS transistor T22, and a gate of the third PMOS transistor T23 may be electrically connected to the VSSa voltage line VSSa through the contact plugs PLU, the vias V1 and V2, and the wiring lines M2.

A second NMOS source/drain of the first NMOS transistor T11, a second NMOS source/drain of the second NMOS transistor T12, and a second NMOS source/drain of the third NMOS transistor T13 may be electrically connected to a second input signal wiring line Min_2 transmitting the second input signal INPUT 2 of FIG. 10 through the contact plugs PLU and the vias V1. A second PMOS source/drain of the first PMOS transistor T21, a second PMOS source/drain of the second PMOS transistor T22, and a second PMOS source/drain of the third PMOS transistor T23 may be electrically connected to a first input signal wiring line Min_1 transmitting the first input signal INPUT 1 of FIG. 10 through the contact plugs PLU and the vias V1.

Between the VDDa voltage line VDDa and the VSSa voltage line VSSa, NMOS active regions ACTa1, ACTa2, and ACTa3 adjacent to the VDDa voltage line VDDa and sequentially arranged while being spaced apart from each other in a first horizontal direction may be disposed, and PMOS active regions ACTb1, ACTb2, and ACTb3 adjacent to the VSSa voltage line VSSa and sequentially arranged while being spaced apart from each other in the first horizontal direction may be disposed.

Each of the NMOS active regions ACTa1, ACTa2, and ACTa3 may include NMOS sources/drains and NMOS channel structures, and each of the PMOS active regions ACTb1, ACTb2, and ACTb3 may include PMOS sources/drains and PMOS channel structures.

Each of the PMOS active regions ACTb1, ACTb2, and ACTb3 may include a first channel structure 115a and a second channel structure 115b as illustrated in FIG. 19. The first channel structure 115a and the second channel structure 115b may be vertically spaced apart from each other.

The NMOS active regions ACTa1, ACTa2, and ACTa3 may include a first NMOS active region ACTa1 in which the first NMOS transistor T11 is disposed, a second NMOS active region ACTa2 in which the second NMOS transistor T12 is disposed, and a third NMOS active region ACTa3 in which the third NMOS transistor T13 is disposed. The PMOS active regions ACTb1, ACTb2, and ACTb3 may include a first PMOS active region ACTb1 in which the first PMOS transistor T21 is disposed, a second PMOS active region ACTb2 in which the second PMOS transistor T22 is disposed, and a third PMOS active region ACTb3 in which the third PMOS transistor T23 is disposed.

The gates G1, G2, G3, and G4 may include a lower gate electrode GE1 and an upper gate electrode GE2. The gates G1, G2, G3, and G4 may further include the gate dielectric layers 143. The lower and upper gate electrodes GE1 and GE2 and the gate dielectric layers 143 may be included in the gate structures N_G1, N_G2, P_G1 and P_G2 described above with reference to FIGS. 1 to 4, 6 and 7. Accordingly, the gates G1, G2, G3, and G4 may include the gate structures N_G1, N_G2, P_G1, and P_G2 described above with reference to FIGS. 1 to 4, 6, and 7.

Referring to FIG. 19, an insulating gate capping layer 167 may be disposed on the gates G1, G2, G3, and G4. One of the gates G1, G2, G3, and G4, for example, the lower and upper gate electrodes GE1 and GE2 of the gate G1 of the first NMOS transistor T11 may be electrically connected to each other through a contact plug 276g passing through the insulating gate capping layer 167, the upper gate electrode GE, and the second insulating pattern 158. The input signal wiring line Min' may be a wiring line 277 on the contact plug 276g.

The gates G1, G2, G3, and G4 may be disposed on the base structures including a semiconductor layer 109 and an insulating layer 180 disposed below the semiconductor layer 109.

Insulating isolation structures 137a and 158 may be disposed between the first gate electrode GE1 and the second gate electrode GE2. The insulating isolation structures 137a and 158 may include a first insulating pattern 137a and a second insulating pattern 158. The first insulating pattern 137a may vertically overlap the first and second channel structures 115a and 115b of the active regions ACTa and ACTb, and the second insulating pattern 158 may not vertically overlap the first and second channel structures 115a and 115b. The insulating isolation structures 137a and 158 may serve substantially the same role as those of the insulating isolation structures N_ISO and P_ISO of FIG. 1. Accordingly, the first insulating pattern 137a may be the first isolation portions N_ISOa and P_ISOa of FIG. 1, and the second insulating pattern 158 may be the second isolation portions N_ISOb and P_ISOb of FIG. 1.

Figure 20:
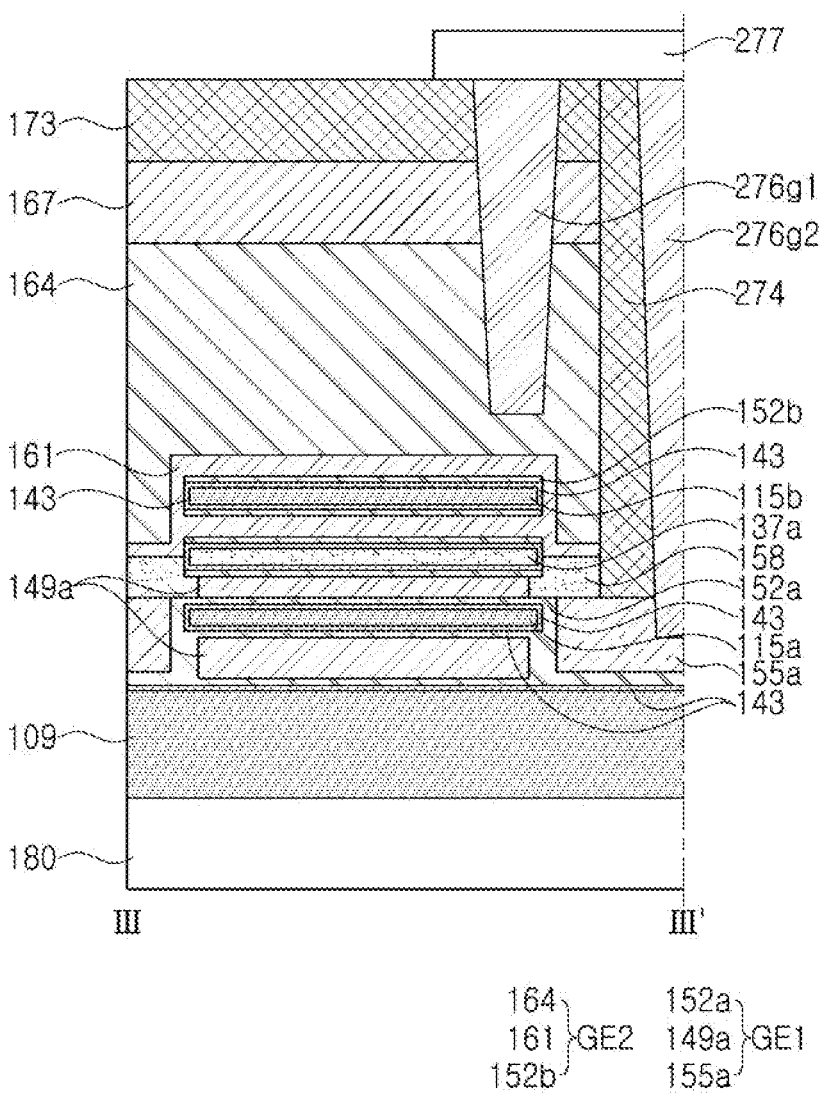
FIG. 20 is a cross-sectional view conceptually illustrating a modification of a semiconductor device according to an example embodiment.

The lower and upper gate electrodes GE1 and GE2 may be electrically connected to each other through the one contact plug 276g, but example embodiments are not limited thereto, and the lower and upper gate electrodes GE1 and GE2 may be electrically connected to each other through two contact plugs 276g1 and 276g2, as illustrated for example in FIG. 20. FIG. 20 is a cross-sectional view illustrating the contact plugs 276g1 and 276g2 capable of replacing the contact plug 276g of FIG. 19.

Referring to FIG. 20, a first contact plug 276g1 is electrically connected to the upper gate electrode GE2 while passing through the insulating gate capping layer 167, and an insulating pattern 274 passes through the insulating gate capping layer 167, the upper gate electrode GE2, and the second insulating pattern 158, and a second contact plug 276g2 passes through the insulating pattern 274. The wiring line 277, which may be the input signal wiring line Min', may be electrically connected to the first and second contact plugs 276g1 and 276g2 and on the first and second contact plugs 276g1 and 276g2.

Figure 21:
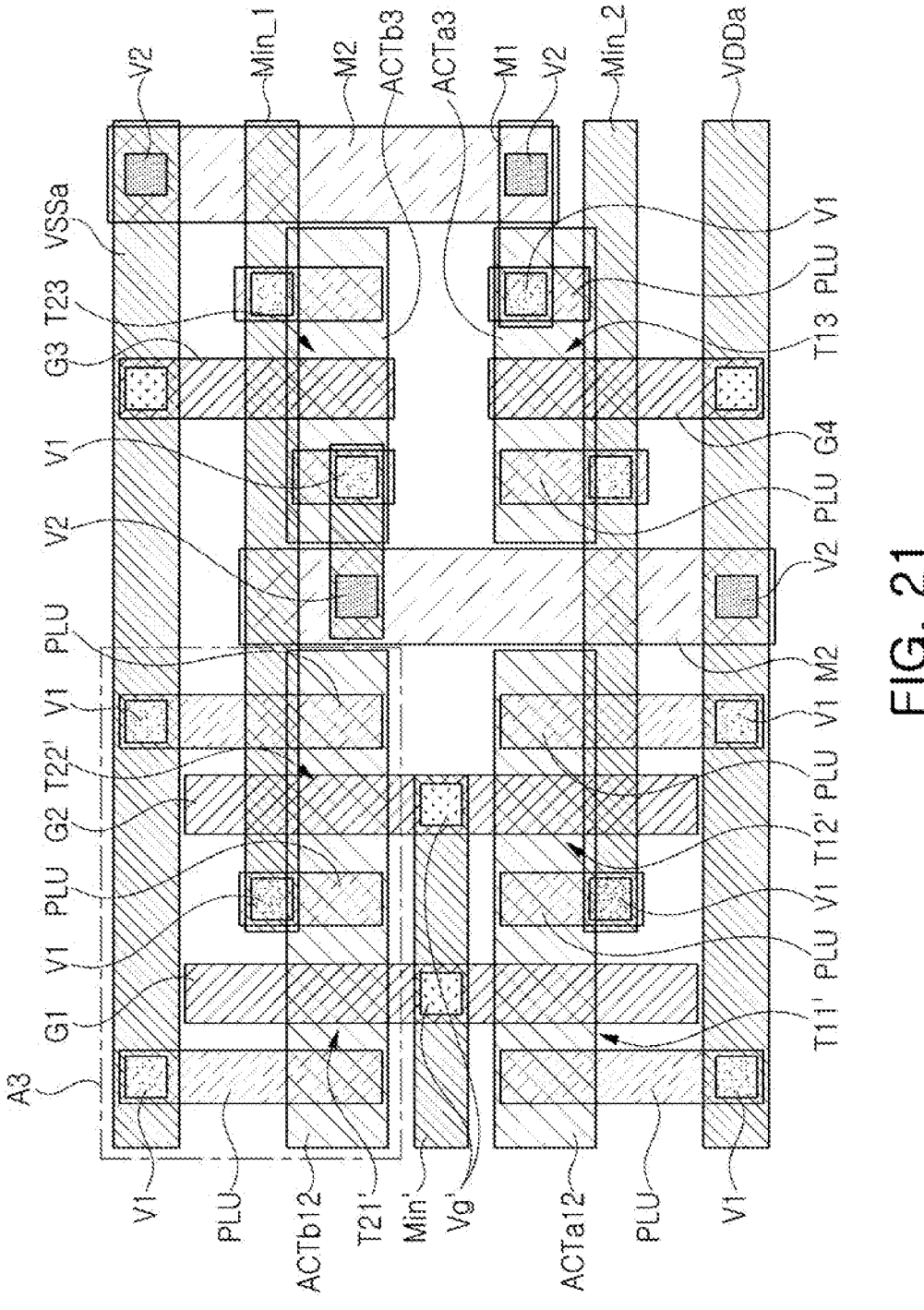
FIG. 21 is a top view conceptually illustrating a modification of a semiconductor device according to an example embodiment.

In FIG. 18, an region indicated by A1 may be an region in which the first PMOS transistor T21 is disposed, and an region indicated by A2 may be an region in which the second PMOS transistor T22 is disposed. The region indicated by A1 and the region indicated by A2 in FIG. 18 may be combined into one region indicated by A3 in FIG. 21. Here, FIG. 21 illustrates a modification of the layout in FIG. 18. For example, the first PMOS active region ACTb1 in which the first PMOS transistor T21 is disposed and the second PMOS active region ACTb2 in which the second PMOS transistor T22 is disposed in FIG. 18 may include one PMOS active region ACTb12, as illustrated in FIG. 21. Similarly, the first NMOS active region ACTa1 in which the first NMOS transistor T11 is disposed and the second NMOS active region ACTa2 in which the second NMOS transistor T12 is disposed in FIG. 18 may include one NMOS active region ACTa12, as illustrated in FIG. 21.

Next, an example of a method of forming a semiconductor device according to an example embodiment will be described with reference to FIGS. 22 to 40. FIGS. 22 to 40 are cross-sectional views conceptually illustrating an example of a method of forming a semiconductor device according to an example embodiment, an region indicated by X-X' may represent a cross-sectional region cut along a first horizontal direction, and an region indicated by Y-Y' may represent a cross-sectional region cut along a second horizontal direction perpendicular to the first horizontal direction.

Figure 22:
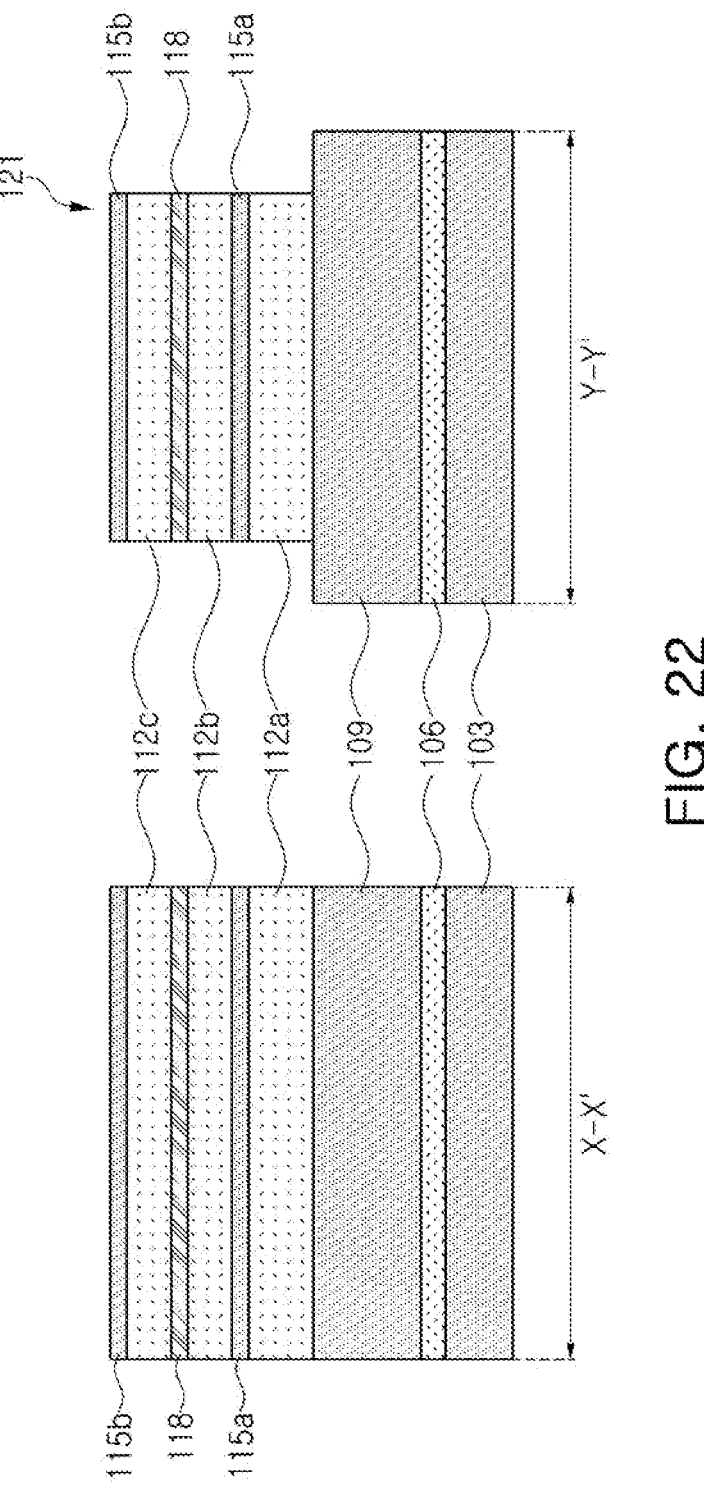
FIGS. 22 to 40 are cross-sectional views illustrating an example of a method of forming a semiconductor device according to an example embodiment.

Referring to FIG. 22, lower structures including a first layer 103, a second layer 106, and a semiconductor layer 109 that are sequentially stacked may be included. The second layer 106 may be an etch stop layer or a planarization stop layer. The semiconductor layer 109 may be referred to as a third layer. The second layer 106 may be formed of a material different from those of the first layer 103 and the semiconductor layer 109. The first layer 103 and the second layer 106, sacrificial layers that may be removed in a subsequent process, may be formed of various materials without being limited to a material type.

A preliminary stack structure 121 may be formed on the lower structures discussed above. The forming of the preliminary stack structure 121 may include forming a plurality of epitaxial layers using an epitaxial process and patterning the plurality of epitaxial layers.

The plurality of epitaxial layers of the preliminary stack structure 121 may include a first sacrificial semiconductor layer 112a, a first channel semiconductor layer 115a, a second sacrificial semiconductor layer 112b, a third sacrificial semiconductor layer 118, a fourth sacrificial semiconductor layer 112c, and a second channel semiconductor layer 115b that are sequentially stacked.

The first, second, and fourth sacrificial semiconductor layers 112a, 112b, and 112c may be formed of a first silicon germanium layer, and the third sacrificial semiconductor layer 118 may be formed of a second silicon germanium layer, and the first and second channel semiconductor layers 115a and 115b may be formed of a silicon layer, but embodiments are not limited thereto, and the first and second channel semiconductor layers 115a and 115b may be formed of other semiconductor materials. The first and second channel semiconductor layers 115a and 115b may be referred to as first and second channel structures.

A concentration of Ge in the first silicon germanium layer may be different from a concentration of Ge in the second silicon germanium layer. For example, the first silicon germanium layer may be a silicon germanium layer having a lower Ge concentration than that of the second silicon germanium layer. In another example, the first silicon germanium layer may be a silicon germanium layer having a lower Ge concentration than that of the second silicon germanium layer. Accordingly, the first silicon germanium layer of the first, second, and fourth sacrificial semiconductor layers 112a, 112b, and 112c, and the second silicon germanium layer of the third sacrificial semiconductor layer 118 may have etch selectivity.

Figure 23:
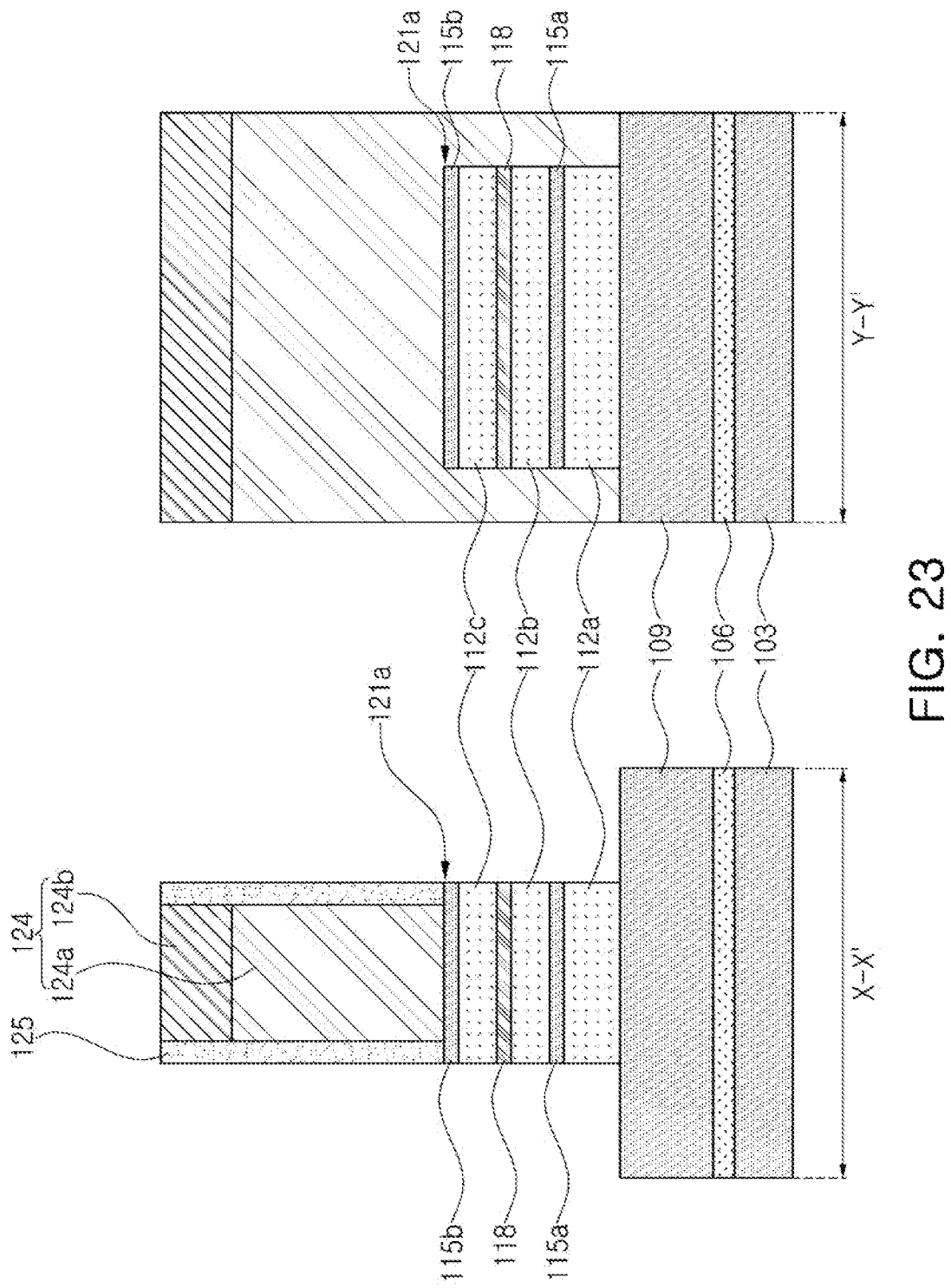

Referring to FIG. 23, a sacrificial gate pattern 124 crossing the preliminary stack structure 121 and covering side surfaces and an upper surface of the preliminary stack structure 121 may be formed. The sacrificial gate pattern 124 may include a first pattern 124a and a second pattern 124b on the first pattern 124a. The first pattern 124a may include polysilicon, and the second pattern 124b may include silicon nitride or a silicon nitride-based material.

Insulating gate spacers 125 may be formed on side surfaces of the sacrificial gate pattern 124, and the preliminary stack structure 121 may be etched to form a stack structure 121a through an etching process using the sacrificial gate pattern 124 and the insulating gate spacers 125 as an etch mask.

Figure 24:
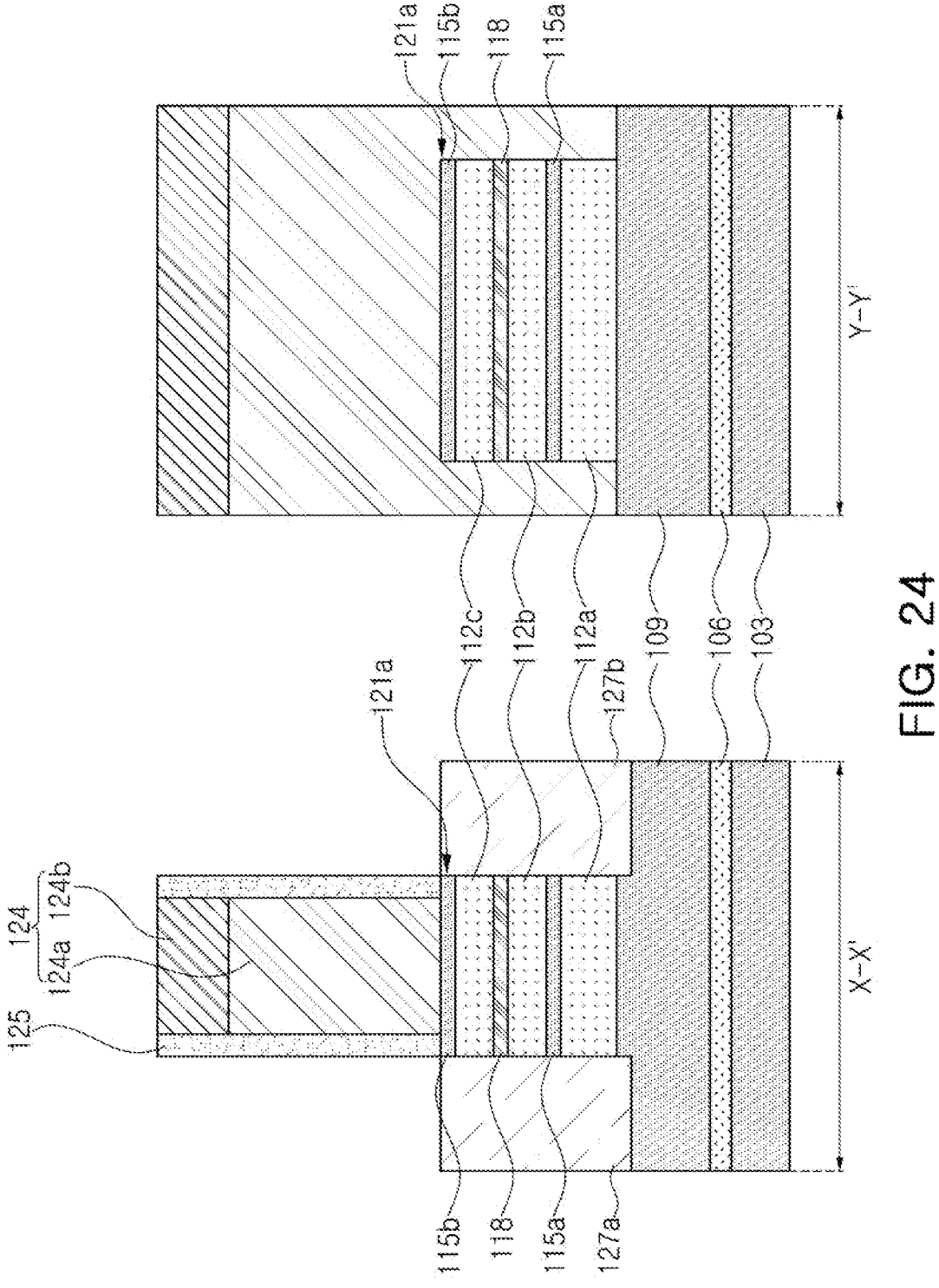

Referring to FIG. 24, source/drains 127a and 127b in contact with at least side surfaces of the stack structure 121a may be formed on the semiconductor layer 109, which may be a third layer. The sources/drains 127a and 127b may be formed through an epitaxial process. The sources/drains 127a and 127b may be formed to have N-type conductivity in an NMOS transistor, and may be formed to have P-type conductivity in a PMOS transistor.

Figure 25:
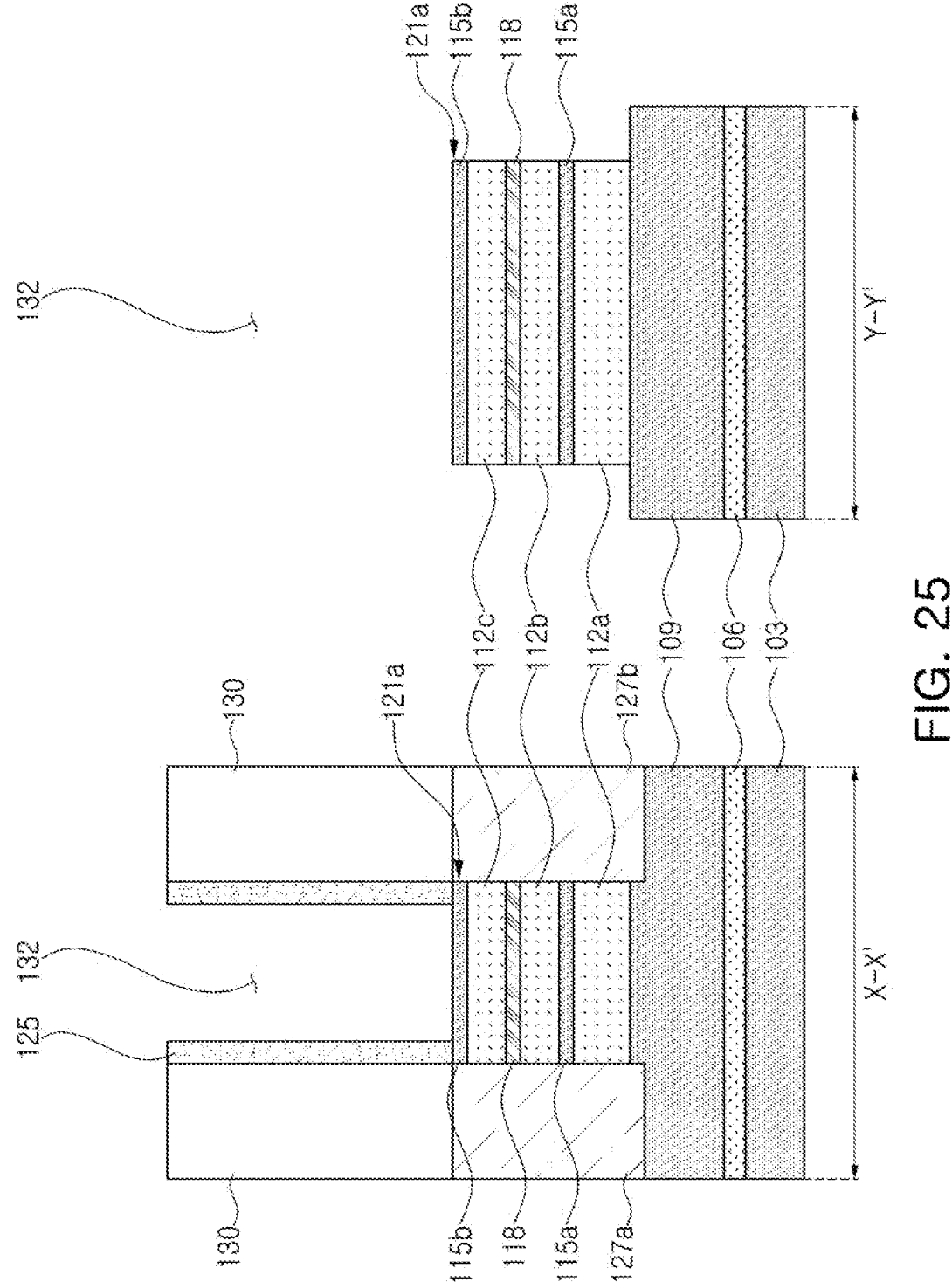

Referring to FIG. 25, an interlayer insulating layer 130 covering at least the sources/drains 127a and 127b may be formed. The sacrificial gate pattern 124 may be selectively removed to form a gate trench 132. The gate trench 132 may expose an upper surface and side surfaces of the stack structure 121a.

Figure 26:
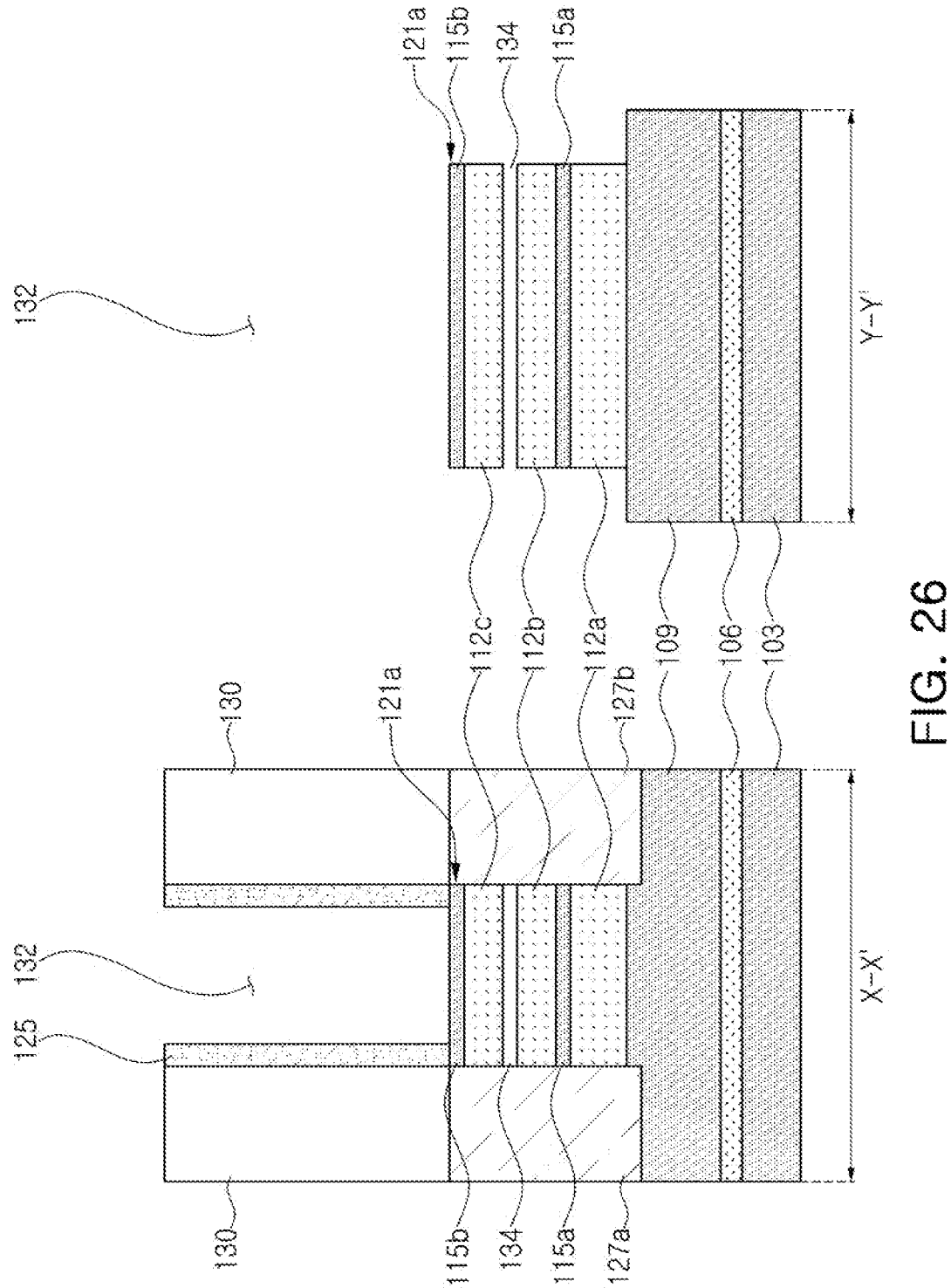

Referring to FIG. 26, the third sacrificial semiconductor layer 118 may be selectively removed to form an opening 134. The opening 134 may be formed between the second sacrificial semiconductor layer 112b and the fourth sacrificial semiconductor layer 112c.

Figure 27:
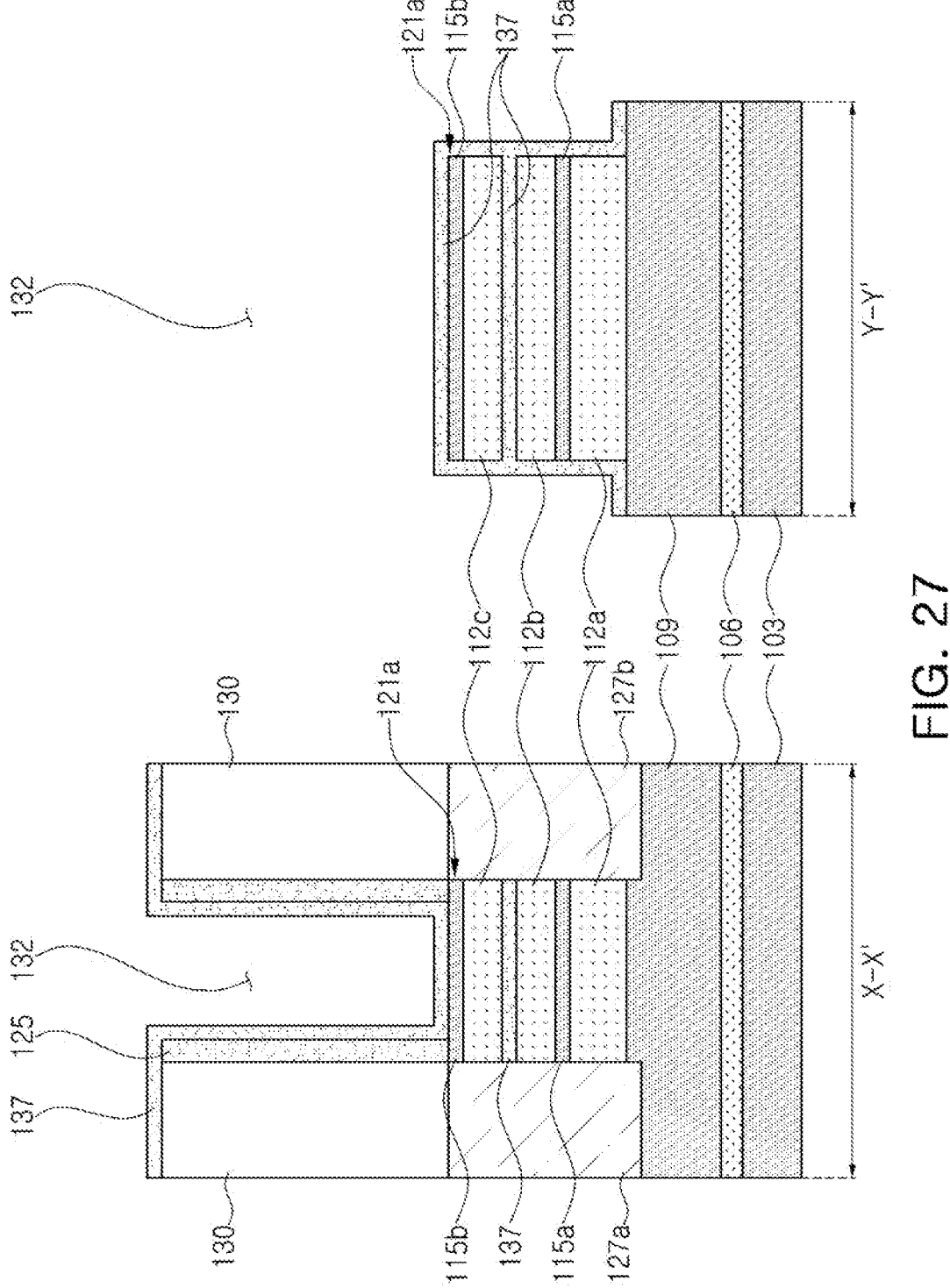

Referring to FIG. 27, an insulating layer 137 filling the opening 134 and covering an inner wall of the gate trench 132 may be formed.

Figure 28:
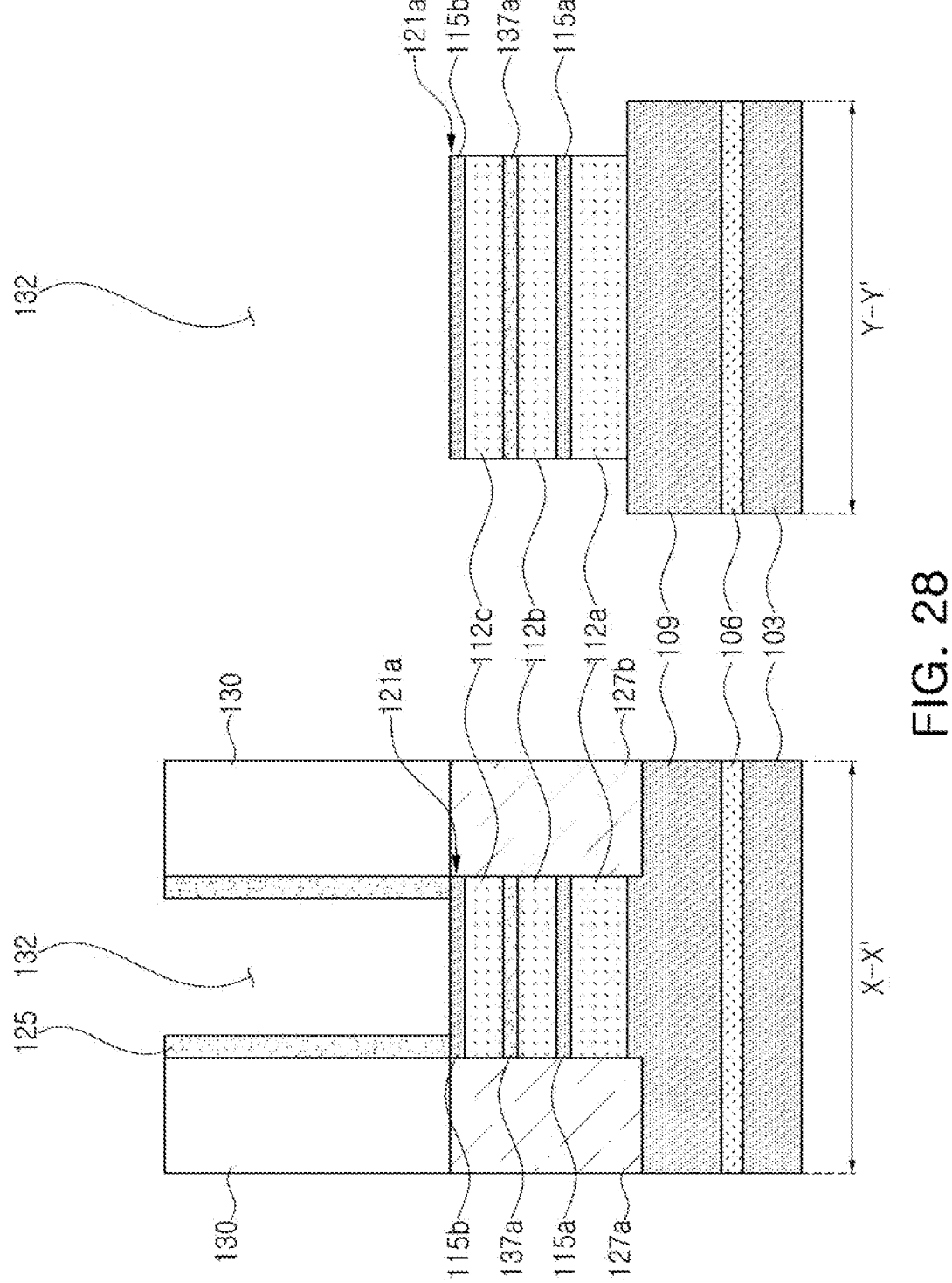

Referring to FIG. 28, the insulating layer 137 may be partially etched to form a first insulating pattern 137a remaining between the second sacrificial semiconductor layer 112b and the fourth sacrificial semiconductor layer 112c.

Figure 29:
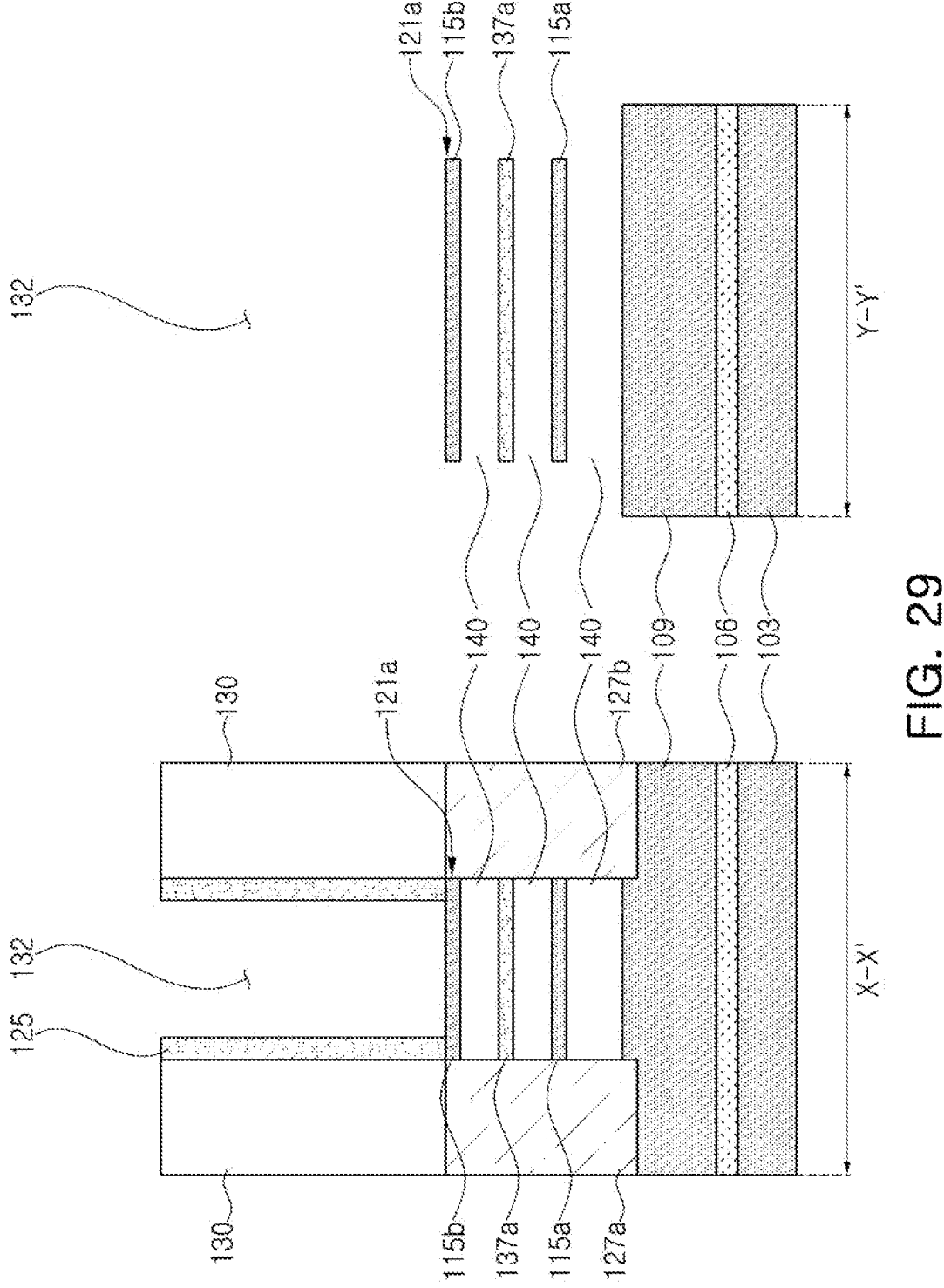

Referring to FIG. 29, openings 140 may be formed by selectively removing the first, second, and fourth sacrificial semiconductor layers 112a, 112b, and 112c. Accordingly, the first channel semiconductor layer 115a, the first insulating pattern 137a, and the second channel semiconductor layer 115b may be in contact with the source/drains 127a and 127b between the source/drains 127a and 127b, and may be spaced apart from each other in a vertical direction.

Next, an example of forming a gate will be described with reference to FIGS. 30 through 35. The gate described herein may be one of an NMOS gate and a PMOS gate.

Figure 30:
Figure 30:
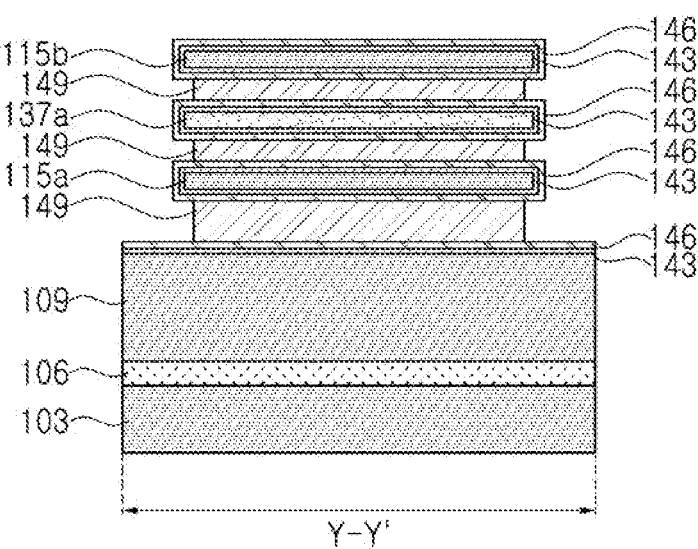

Referring to FIG. 30, a gate dielectric layer 143 may be conformally formed. A first conductive layer 146 may be conformally formed on the gate dielectric layer 143, and a second conductive layer 149 partially filling the openings 140 of FIG. 29 may be formed.

Figure 31:
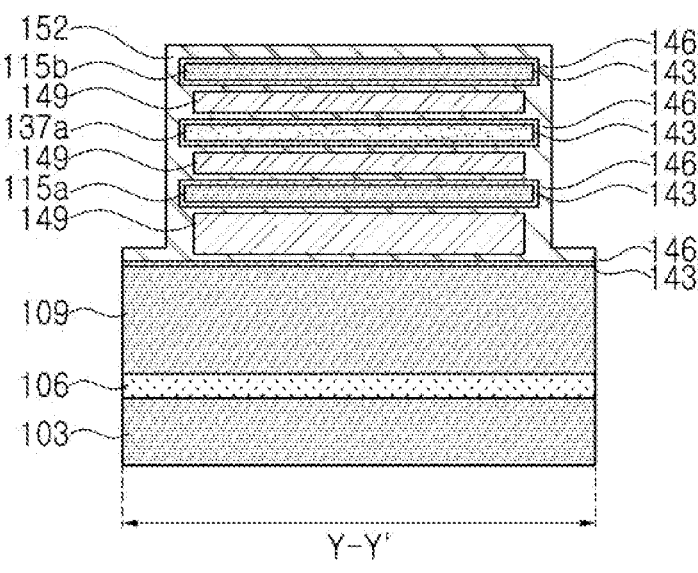

Referring to FIG. 31, a third conductive layer 152 covering a structure formed up to the second conductive layer 149 may be formed. The third conductive layer 152 and the first conductive layer 146 may be formed of the same material. Accordingly, the third conductive layer 152 and the first conductive layer 146 are illustrated without being distinguished from each other, but may be distinguished from each other.

Figure 32:
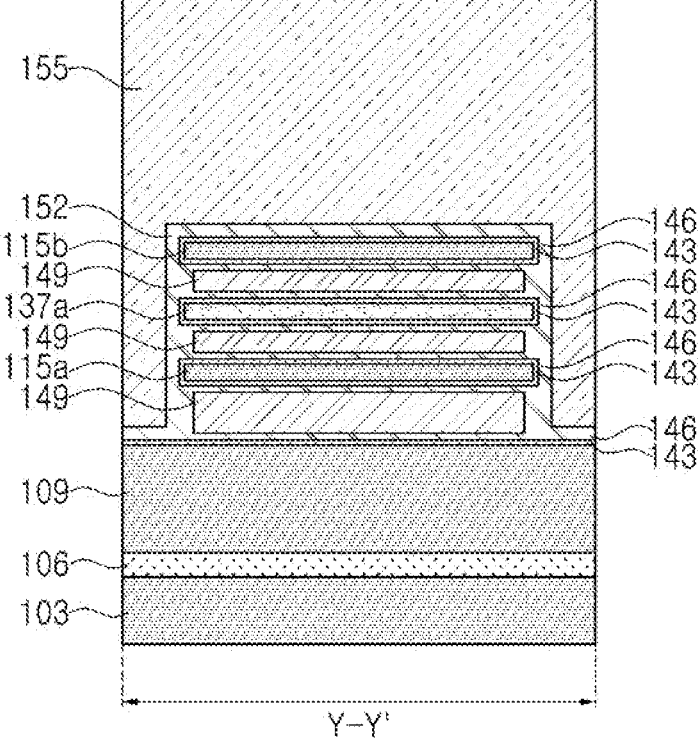

Referring to FIG. 32, a fourth conductive layer 155 may be formed on the third conductive layer 152.

Figure 33:
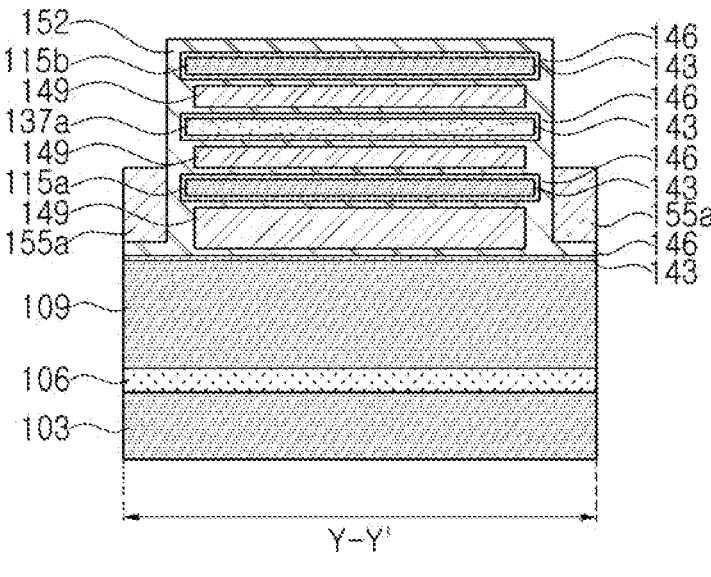

Referring to FIG. 33, the fourth conductive layer 155 may be partially etched to form the conductive patterns 155a positioned at least on a level lower than that of the first insulating pattern 137a.

Figure 34:
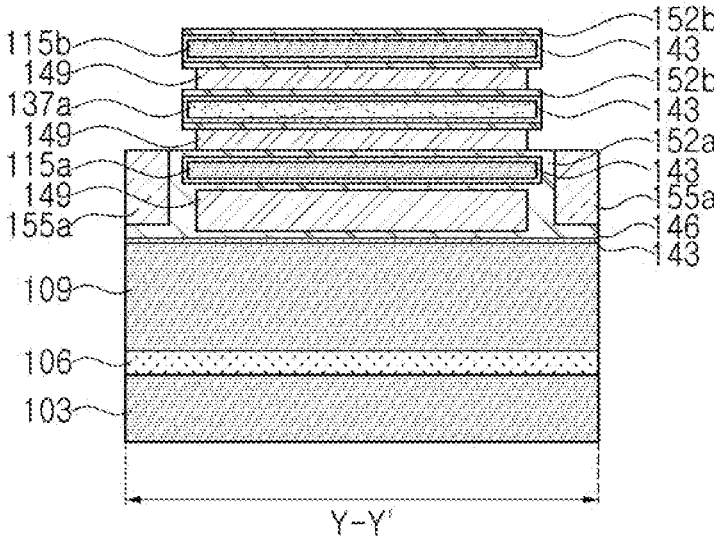

Referring to FIG. 34, the third conductive layer 152 may be partially etched so that at least the portion of the third conductive layer 152 on a side surface of the first insulating pattern 137a is removed, thereby forming third conductive layers 152a and 152b. The third conductive layers 152a and 152b may be formed of a third conductive layer 152a in contact with the conductive patterns 155a and a third conductive layer 152b on a level higher than those of the conductive patterns 155a.

Figure 35:
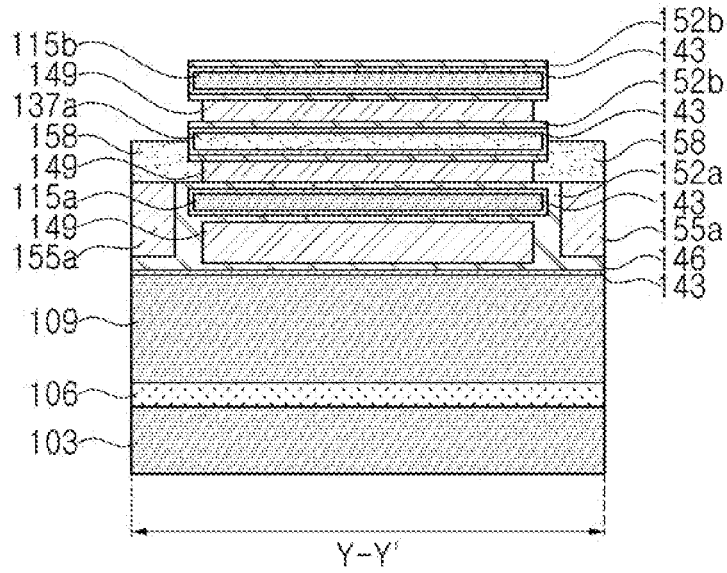

Referring to FIG. 35, second insulating patterns 158 may be formed on the conductive patterns 155a. At least a portion of each of the second insulating patterns 158 may be formed on the same level as at least a portion of the first insulating pattern 137a.

Figure 36:
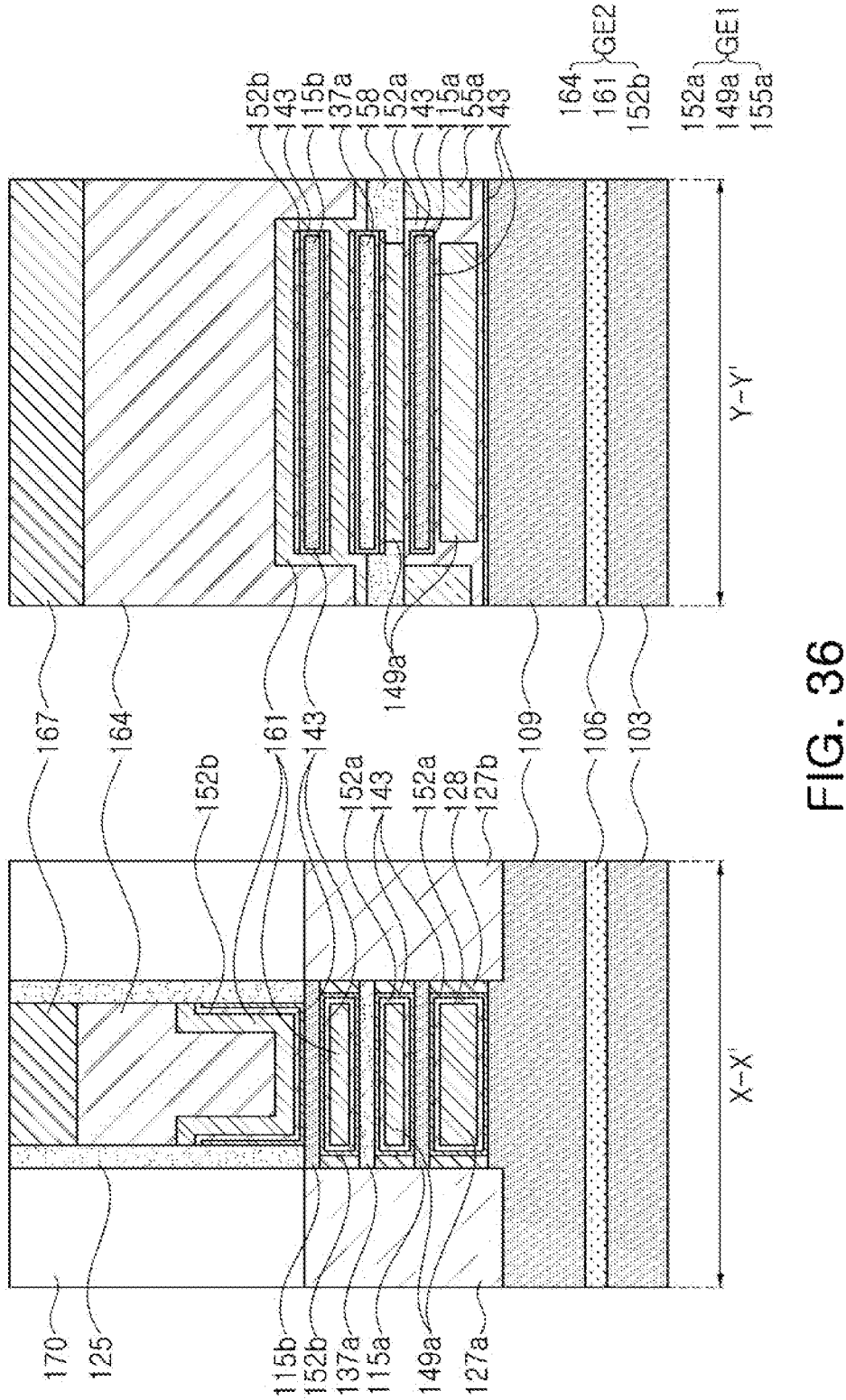

Referring to FIG. 36, a fifth conductive layer 161 and a sixth conductive layer 164 may be sequentially formed on the insulating patterns 158. An insulating gate capping layer 167 may be formed on the sixth conductive layer 164. The fifth conductive layer 161 may be formed of the same material as that of the second conductive layer 149. Accordingly, the fifth conductive layer 161 and the second conductive layer 149 positioned on a level higher than that of the first insulating pattern 137a are illustrated without being distinguished from each other, but may be distinguished from each other.

The third conductive layer 152a positioned on a level lower than that of the first insulating pattern 137a and capable of including the first conductive layer 146, a second conductive layer 149a positioned on a level lower than that of the first insulating pattern 137a, and the conductive patterns 155a may be included in a first gate electrode GE1. The third conductive layer 152b positioned on a level higher than that of the first insulating pattern 137a, the fifth conductive layer 161, and the sixth conductive layer 164 may be included in a second gate electrode GE2.

In an example embodiment, insulating inner spacers 128 may be formed between the lower and upper gate electrodes GE1 and GE2 and the source/drains 127a and 127b, but forming of the insulating inner spacers 128 may be omitted. When the insulating inner spacers 128 are formed, the forming the insulating inner spacers 128 may include partially etching the sacrificial semiconductor layers 112a, 112b, and 112c after performing the process illustrated in FIG. 23, and filling a material of the insulating inner spacers 128 in a space in which the sacrificial semiconductor layers 112a, 112b, and 112c are partially etched.

Figure 37:
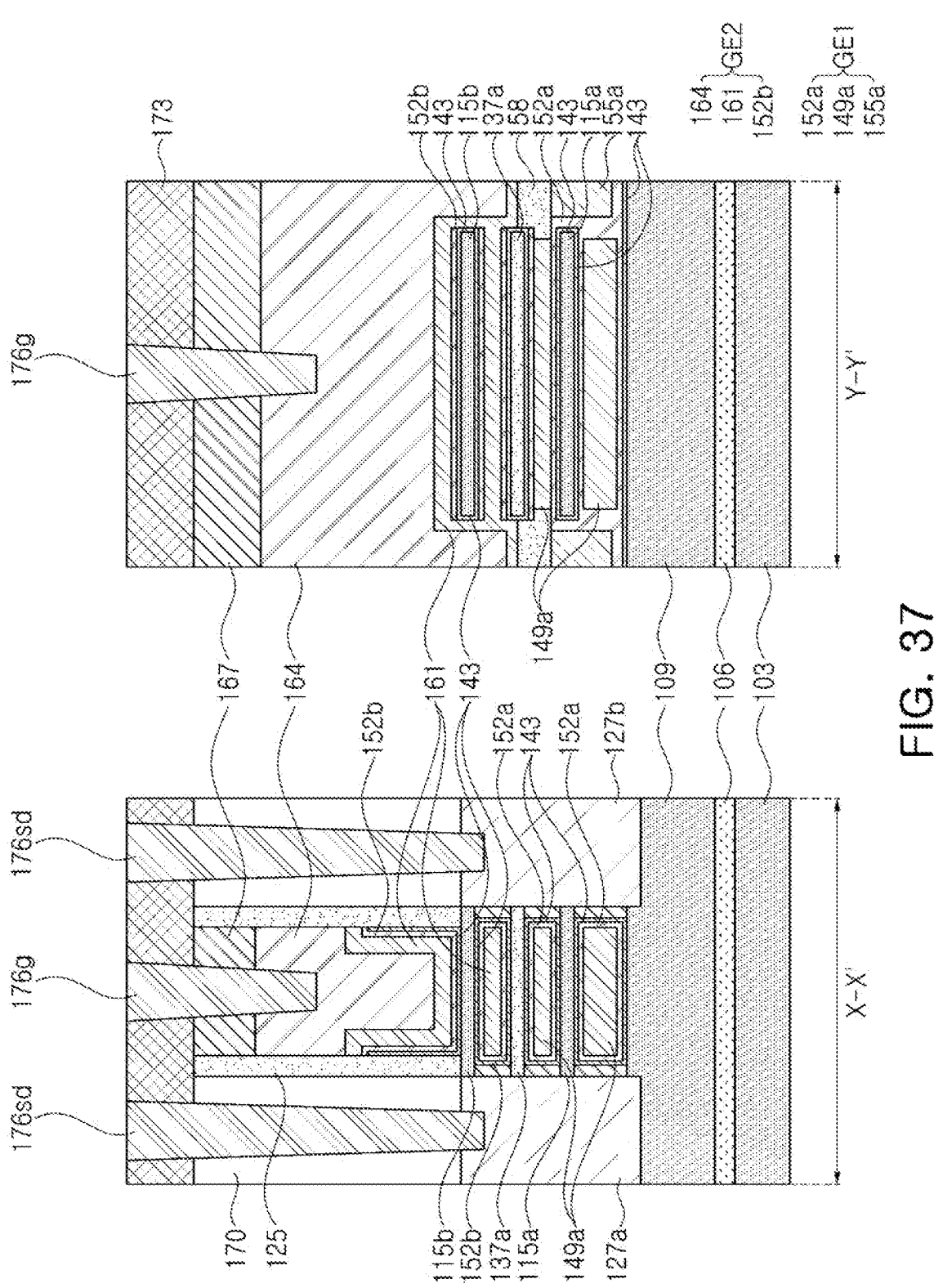

Referring to FIG. 37, an interlayer insulating layer 173 may be formed on the interlayer insulating layer 170 and the insulating gate capping layer 167. Source/drain contact plugs 176sd electrically connected to the sources/drains127a and 127b while passing through the interlayer insulating layers 170 and 173, and a gate contact plug 176g electrically connected to the second gate electrode GE2 while passing through the interlayer insulating layer 173 and the insulating gate capping layer 167 may be formed. As described above with reference to FIG. 5B, positions where the gate contact plugs N_SC and P_SC of FIG. 5B are disposed may be modified in various manners, and therefore a position in which the gate contact plug 176g is formed may be modified in various manners in an example embodiment. For example, the gate contact plug 176g illustrated in FIG. 37 conceptually illustrates that the gate contact plug 176g is formed. For example, the gate contact plug 176g may not be arranged side in parallel to the source/drain contact plugs 176sd in one direction, but may be formed in a position crossing the source/drain contact plugs 176sd in one direction.

Figure 38:
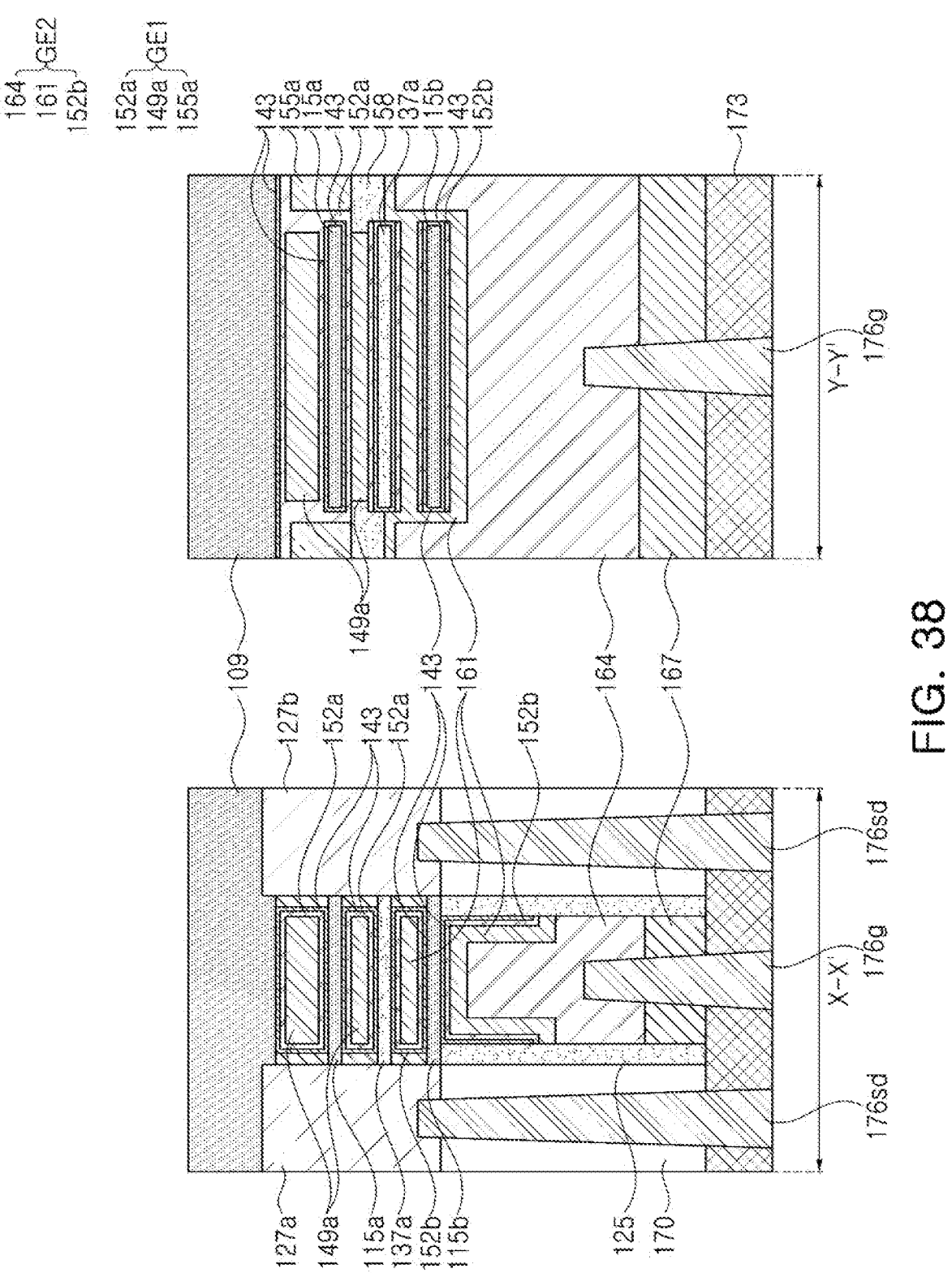

Referring to FIG. 38, the first and second layers 103 and 106 may be sequentially removed.

Figure 39:
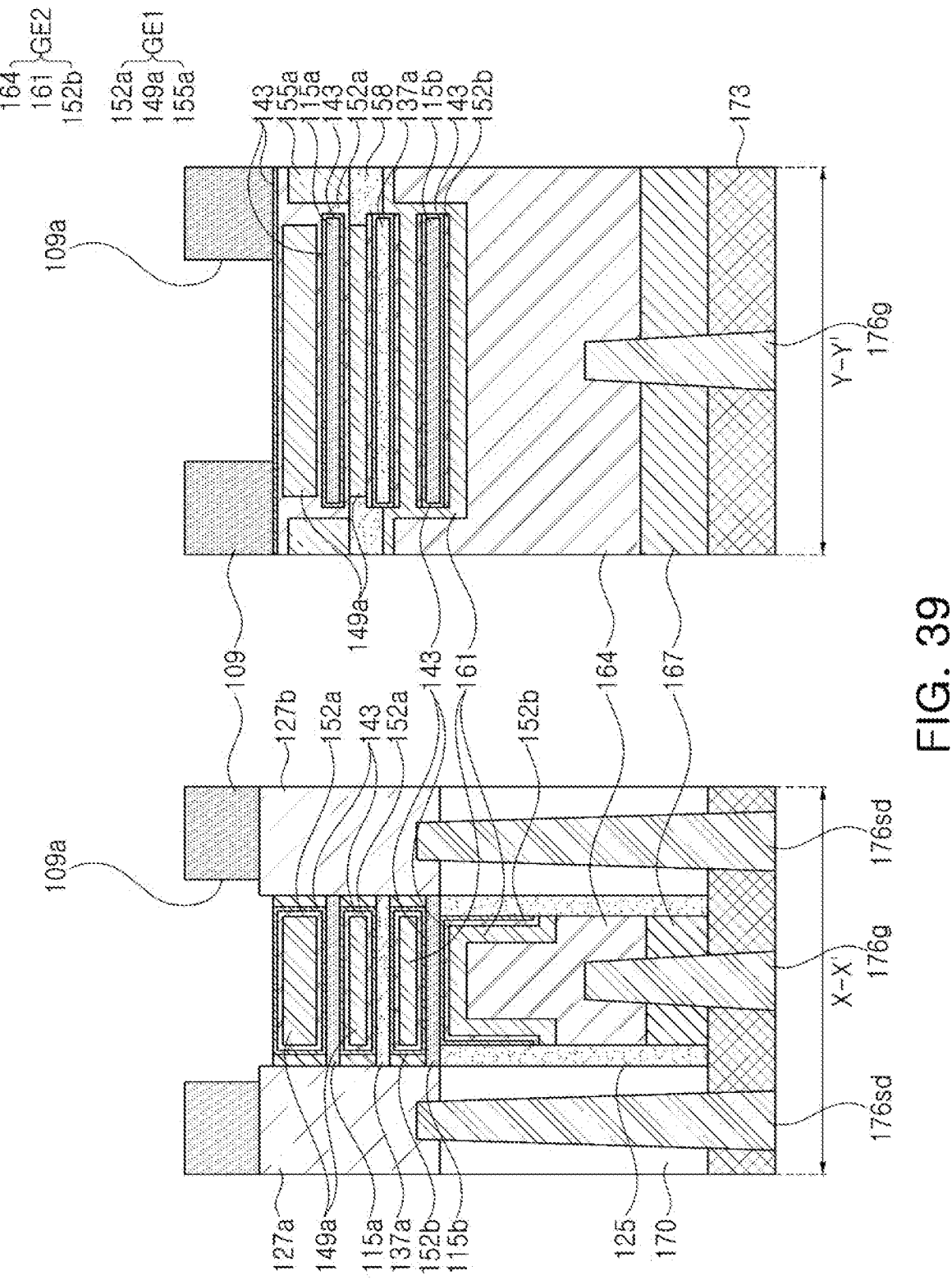

Referring to FIG. 39, an opening 109a may be formed by patterning the semiconductor layer 109, which may be a third layer.

Figure 40:
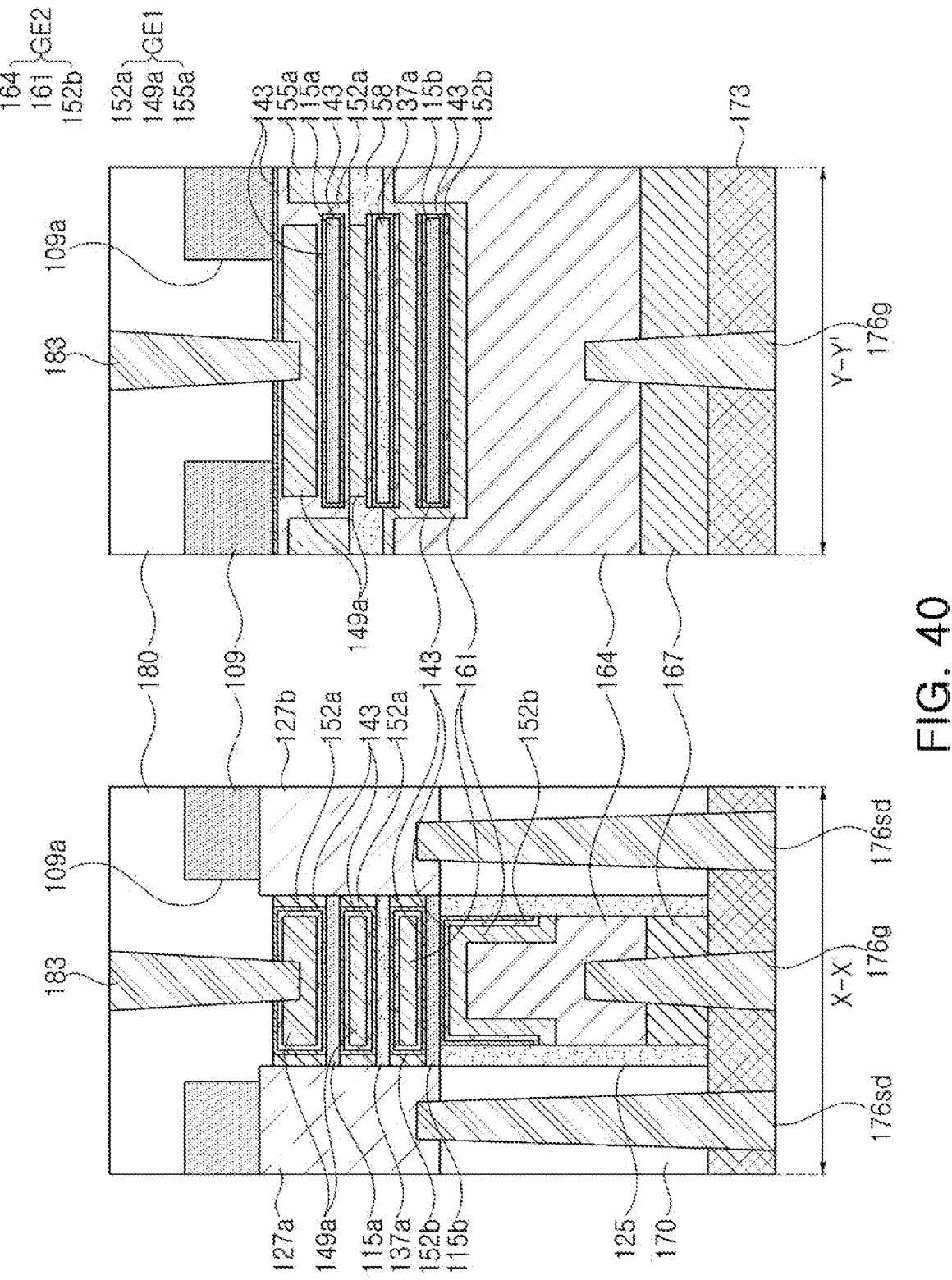

Referring to FIG. 40, the insulating layer 180 covering the semiconductor layer 109, which may be a third layer, while filling the opening 109a may be formed. A gate contact plug 183 electrically connected to the first gate electrode GE1 while passing through the insulating layer 180 may be formed.

According to the above-described example embodiments, there may be provided a semiconductor device having an increased degree of integration by including a plurality of transistors sharing sources/drains, an integrated circuit including the semiconductor device, and a multi-value logic device including the integrated circuit. The semiconductor device may include the example embodiments described above with reference to FIGS. 1 to 8, 16, 17A, 17B, 18, 19, 20, and 21, and the integrated circuit may include the semiconductor device, and may include the circuit described with reference to FIGS. 9 to 15. The multi-value logic device may include the integrated circuit, and an operation of the multi-value logic device may be described as a ternary operation or a pentagonal operation using a plurality of states of the output signal OUTPUT described with reference to FIGS. 11A, 11B, 13, and 15. The number of operations performed may be reduced by using the multi-value logic device, thereby reducing power consumption of a semiconductor chip or a semiconductor package and reducing heat generation of a semiconductor chip or a semiconductor package.

While example embodiments have been shown and described above, it will be apparent to those skilled in the art that modifications and variations could be made without departing from the scope of example embodiments as defined by the appended claims.

What is claimed is:

1. A semiconductor device comprising:
   a first common source/drain and a second common source/drain spaced apart from each other in a first direction;
   a first channel structure between the first common source/drain and the second common source/drain, and a second channel structure between the first common source/drain and the second common source/drain and spaced apart from the first channel structure in a vertical direction;
   a first gate structure surrounding an upper surface, a lower surface, and side surfaces of the first channel structure; and
   a second gate structure surrounding an upper surface, a lower surface, and side surfaces of the second channel structure, and spaced apart from the first gate structure,
   wherein a level of the second channel structure is higher than a level of the first channel structure,
   wherein the first and second common sources/drains, the first and second gate structures, and the first and second channel structures are included in a first transistor and a second transistor,
   wherein the first transistor comprises the first and second common sources/drains, the first gate structure, and the first channel structure,
   wherein the second transistor comprises the first and second common sources/drains, the second gate structure, and the second channel structure, and
   wherein the first transistor and the second transistor share the first and second common sources/drains.

2. The semiconductor device of claim 1, further comprising:
   a first source/drain contact plug on the first common source/drain;

a second source/drain contact plug on the second common source/drain;

a first gate contact plug on the first gate structure; and a second gate contact plug on the second gate structure.

3. The semiconductor device of claim 2, wherein a level of the second gate structure is higher than a level of the first gate structure, wherein the first gate contact plug is below a lower surface of the first gate structure, and wherein the second gate contact plug is on an upper surface of the second gate structure.

4. The semiconductor device of claim 2, wherein a level of the second gate structure is higher than a level of the first gate structure, wherein the first gate structure comprises an overlapping region which vertically overlaps the second gate structure, and a non-overlapping region which does not vertically overlap the second gate structure, wherein the first gate contact plug is on an upper surface of the non-overlapping region of the first gate structure, and wherein the second gate contact plug is on an upper surface of the second gate structure.

5. The semiconductor device of claim 2, wherein a level of the second gate structure is higher than a level of the first gate structure, wherein the second gate structure comprises an overlapping region which vertically overlaps the first gate structure, and a non-overlapping region which does not vertically overlap the first gate structure, wherein the first gate contact plug is below a lower surface of the first gate structure, and wherein the second gate contact plug is below a lower surface of the non-overlapping region of the second gate structure.

6. The semiconductor device of claim 1, further comprising:

an insulating isolation structure between the first gate structure and the second gate structure, wherein the first gate structure is spaced apart from the second gate structure by the insulating isolation structure.

7. The semiconductor device of claim 6, wherein the insulating isolation structure comprises:

a first isolation portion which vertically overlaps the first and second channel structures; and a second isolation portion which does not vertically overlap the first and second channel structures.

8. The semiconductor device of claim 7, wherein a width of the first isolation portion is greater than a width of the second isolation portion in a width direction of each of the first and second gate structures.

9. The semiconductor device of claim 7, wherein an upper surface of the first isolation portion and an upper surface of the second isolation portion are at different height levels.

10. The semiconductor device of claim 1, wherein the first channel structure includes a first channel layer, and the second channel structure includes a second channel layer.

11. The semiconductor device of claim 1, wherein the first channel structure comprises a plurality of first channel layers spaced apart from each other in a vertical direction, wherein the second channel structure comprises a plurality of second channel layers spaced apart from each other in a vertical direction, wherein the first gate structure extends to surround each of the plurality of first channel layers, and wherein the second gate structure extends to surround each of the plurality of second channel layers.

12. The semiconductor device of claim 1, wherein a threshold voltage of the first transistor is substantially same as a threshold voltage of the second transistor.

13. The semiconductor device of claim 1, wherein a threshold voltage of the first transistor is different from a threshold voltage of the second transistor.

14. The semiconductor device of claim 1, wherein a vertical thickness of the second gate structure is different from a vertical thickness of the first gate structure.

15. An integrated circuit comprising:

a first circuit configured to split an input signal into a plurality of input signals; and a second circuit configured to receive the plurality of input signals from the first circuit, and convert the plurality of input signals provided from the first circuit into an output signal, wherein at least one of the first circuit and the second circuit comprises a first transistor and a second transistor which share sources/drains, wherein the first transistor comprises a first channel structure and a first gate structure on a base structure, together with the sources/drains, wherein the second transistor comprises a second channel structure and a second gate structure on the base structure, together with the sources/drains, and wherein, when viewed from an upper surface of the base structure, the first channel structure and the second channel structure are on different height levels.

16. The integrated circuit of claim 15, wherein the first gate structure surrounds an upper surface, a lower surface and side surfaces of the first channel structure, and wherein the second gate structure surrounds an upper surface, a lower surface, and side surfaces of the second channel structure.

17. The integrated circuit of claim 15, wherein the second circuit comprises a first NMOS transistor, a second NMOS transistor, a first PMOS transistor, and a second PMOS transistor, wherein the first transistor is the first NMOS transistor, and the second transistor is the second NMOS transistor, wherein the first and second PMOS transistors share PMOS sources/drains, wherein the first PMOS transistor comprises a first PMOS channel structure and a first PMOS gate structure on the base structure, together with the PMOS sources/drains, and wherein the second PMOS transistor comprises a second PMOS channel structure and a second PMOS gate structure on the base structure, together with the PMOS sources/drains.

18. The integrated circuit of claim 17, wherein a first source/drain among the sources/drains of the first and second NMOS transistors is connected to a negative voltage source, wherein a first PMOS source/drain among the PMOS sources/drains of the first and second PMOS transistors is connected to a positive voltage source;

wherein a second source/drain among the sources/drains of the first and second NMOS transistors and a second PMOS source/drain among the PMOS sources/drains of the first and second PMOS transistors are connected to an output terminal providing the output signal, wherein a first input signal among the plurality of input signals is provided to the first gate structure of the first NMOS transistor and the first gate structure of the first PMOS transistor, and wherein a second input signal among the plurality of input signals is provided to the second gate structure of the second NMOS transistor and the second gate structure of the second PMOS transistor.

19. A multi-value logic device comprising:

an input split circuit configured to split an input signal into a plurality of input signals, wherein the input signal has at least three voltage levels; and an output circuit configured to receive the plurality of input signals and generate an output signal, wherein the output signal has the at least three voltage levels, wherein the output circuit comprises a first transistor and a second transistor, wherein the first transistor comprises a first channel structure, wherein the second transistor comprises a second channel structure which is spaced apart from the first channel structure in a vertical direction, and wherein the first transistor and the second transistor share at least one of a common source and a common drain.

20. The multi-value logic device of claim 19, wherein the first transistor and the second transistor share the common source and the common drain.

* * * * *